(12) United States Patent
Wang et al.

(10) Patent No.: US 11,785,806 B2
(45) Date of Patent: Oct. 10, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Siyu Wang, Beijing (CN); Mengqi Wang, Beijing (CN); Shun Zhang, Beijing (CN); Jie Dai, Beijing (CN); Tinghua Shang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/699,948

(22) Filed: Mar. 21, 2022

(65) Prior Publication Data
US 2022/0285472 A1 Sep. 8, 2022

Related U.S. Application Data

(63) Continuation of application No. 17/427,443, filed as application No. PCT/CN2021/082427 on Mar. 23, 2021.

(30) Foreign Application Priority Data

Mar. 23, 2021 (WO) ................ PCT/CN2021/082427

(51) Int. Cl.
*G09G 3/32* (2016.01)
*H10K 59/121* (2023.01)
(Continued)

(52) U.S. Cl.
CPC ....... *H10K 59/1213* (2023.02); *G09G 3/3233* (2013.01); *H10K 50/813* (2023.02);
(Continued)

(58) Field of Classification Search
CPC ............. H10K 59/1213; H10K 50/813; H10K 59/1216; H10K 59/131; H10K 50/8428;
(Continued)

(56) References Cited

U.S. PATENT DOCUMENTS 7,122,832 B2 10/2006 Nishikawa
8,459,820 B2 6/2013 Lee et al.
(Continued)

FOREIGN PATENT DOCUMENTS

CN 1523935 A 8/2004
CN 101409305 A 4/2009
(Continued)

OTHER PUBLICATIONS

Office Action dated Apr. 3, 2023 received in U.S. Appl. No. 17/427,443.
(Continued)

*Primary Examiner* — Pegeman Karimi
(74) *Attorney, Agent, or Firm* — Scully, Scott, Murphy & Presser, P.C.

(57) ABSTRACT

A display substrate and a display device are provided. The display substrate includes a base substrate, an anode layer and a plurality of pixel driving circuits, the plurality of pixel driving circuits includes a first conductive layer and a second conductive layer; the anode layer includes a first anode, the second conductive layer includes a first conductive portion and a second conductive portion, the second conductive portion includes a main body, a heel block, and a connection block, the heel block is located at a side of the main body close to the first anode, and an orthographic
(Continued)

projection of the first conductive portion on the base substrate is overlapped with an orthographic projection of the first anode on the base substrate, and an orthographic projection of the second conductive portion on base substrate is overlapped with an orthographic projection of the first anode on the base substrate.

20 Claims, 26 Drawing Sheets

(51) Int. Cl.
    *G09G 3/3233*     (2016.01)
    *H10K 50/813*     (2023.01)
    *H10K 59/131*     (2023.01)

(52) U.S. Cl.
    CPC ....... *H10K 59/1216* (2023.02); *H10K 59/131* (2023.02); *G09G 2300/0426* (2013.01); *G09G 2300/0819* (2013.01); *G09G 2300/0842* (2013.01); *G09G 2320/045* (2013.01)

(58) Field of Classification Search
    CPC .. H10K 59/123; H10K 59/352; H10K 59/353; H10K 59/1315; H10K 71/00; G09G 3/3233; G09G 3/32; G09G 2300/0426; G09G 2300/0819; G09G 2300/0842; G09G 2320/045
    See application file for complete search history.

(56) References Cited

U.S. PATENT DOCUMENTS

| | | | |
|---|---|---|---|
| 9,065,077 B2 | 6/2015 | Hung et al. | |
| 9,239,501 B2 | 1/2016 | Shibazaki | |
| 9,529,224 B2 | 12/2016 | Kwak et al. | |
| 9,627,457 B2 | 4/2017 | Lee | |
| 10,191,319 B2 | 1/2019 | Jiang et al. | |
| 10,516,016 B2 | 12/2019 | Kim et al. | |
| 10,522,604 B2 | 12/2019 | Jin | |
| 10,541,294 B2 | 1/2020 | Hong et al. | |
| 10,700,151 B2 | 6/2020 | Rieutort-Louis et al. | |
| 10,734,460 B2 | 8/2020 | Chu et al. | |
| 10,811,464 B2 | 10/2020 | Toyoda et al. | |
| 10,903,283 B2 | 1/2021 | Choi | |
| 10,943,965 B2 | 3/2021 | Cho et al. | |
| 11,282,902 B2 * | 3/2022 | Lee | G09G 3/3275 |
| 11,489,140 B2 * | 11/2022 | Wang | H10K 50/844 |
| 2009/0091254 A1 | 4/2009 | Jeong et al. | |
| 2009/0184898 A1 | 7/2009 | Yamashita et al. | |
| 2015/0206930 A1 | 7/2015 | Liu | |
| 2016/0078809 A1 | 3/2016 | Yoon et al. | |
| 2016/0284784 A1 | 9/2016 | Lee et al. | |
| 2016/0321995 A1 | 11/2016 | Shin | |
| 2017/0317156 A1 | 11/2017 | Kim et al. | |
| 2018/0090553 A1 | 3/2018 | Rieutort-Louis et al. | |
| 2018/0301515 A1 * | 10/2018 | Huang | G06F 3/0412 |
| 2020/0043996 A1 | 2/2020 | Cheng | |
| 2020/0103698 A1 | 4/2020 | Wu | |
| 2020/0381653 A1 * | 12/2020 | Bang | H10K 50/844 |
| 2020/0411611 A1 | 12/2020 | Liu et al. | |
| 2021/0083013 A1 * | 3/2021 | Bang | H10K 59/131 |
| 2021/0271010 A1 | 9/2021 | Ji et al. | |
| 2022/0077258 A1 | 3/2022 | Jung | |

FOREIGN PATENT DOCUMENTS

| | | |
|---|---|---|
| CN | 101672442 A | 3/2010 |
| CN | 103353683 A | 10/2013 |
| CN | 103515544 A | 1/2014 |
| CN | 103762223 A | 4/2014 |
| CN | 104217675 A | 12/2014 |
| CN | 104282717 A | 1/2015 |
| CN | 104516153 A | 4/2015 |
| CN | 105867012 A | 8/2016 |
| CN | 105892188 A | 8/2016 |
| CN | 107480639 A | 12/2017 |
| CN | 207052608 U | 2/2018 |
| CN | 107871765 A | 4/2018 |
| CN | 108122956 A | 6/2018 |
| CN | 108428704 A | 8/2018 |
| CN | 207883217 U | 9/2018 |
| CN | 108933155 A | 12/2018 |
| CN | 109166865 A | 1/2019 |
| CN | 208705615 U | 4/2019 |
| CN | 109935616 A | 6/2019 |
| CN | 110034132 A | 7/2019 |
| CN | 110137214 A | 8/2019 |
| CN | 110265458 A | 9/2019 |
| CN | 110610980 A | 12/2019 |
| CN | 110707139 A | 1/2020 |
| CN | 110729324 A | 1/2020 |
| CN | 110854173 A | 2/2020 |
| EP | 3315856 A1 | 5/2018 |
| JP | 2001109404 A | 4/2001 |
| JP | 2018098137 A | 6/2018 |

OTHER PUBLICATIONS

Office Action dated Apr. 14, 2023 received in U.S. Appl. No. 17/940,566.

\* cited by examiner

DISPLAY SUBSTRATE AND DISPLAY DEVICE

For all purposes, this application is a continuation of U.S. Ser. No. 17/427,443 filed on Jul. 30, 2021, which is a national stage application of PCT international patent application PCT/CN2021/082427 filed on Mar. 23, 2021, which claims priority to the PCT international patent application PCT/CN2020/081154, filed Mar. 25, 2020, the entire disclosure of which is incorporated herein by reference as part of the present application.

TECHNICAL FIELD

Embodiments of the present disclosure relate to a display substrate and a display device.

BACKGROUND

With the continuous development of display technologies, the organic light emitting diode (OLED) display technology has been increasingly applied to various electronic devices due to its advantages such as self-illumination, wide viewing angle, high contrast, low power consumption and high reaction speed.

On the other hand, with the continuous development of the OLED display technology, people pose higher requirements for the power consumption, color cast, brightness, stability and other performance of OLED display products.

SUMMARY

Embodiments of the present disclosure provide a display substrate and a display device. On the one hand, the closed annular portion can ensure higher flatness of the first anode, thereby ensuring that the luminous intensity of the first anode in different directions is consistent, and then effectively alleviating the phenomenon of color cast. On the other hand, because the closed annular portion has a hollow design, the light transmittance of the display substrate can be improved, and it is beneficial for the under-screen fingerprint recognition device to receive signals.

At least one embodiment of the present disclosure provides a display substrate, which includes: a base substrate; a plurality of pixel driving circuits, including a semiconductor layer; a first conductive layer, at a side of the semiconductor layer away from the base substrate; a first planarization layer, at a side of the first conductive layer away from the base substrate; a second conductive layer, at a side of the first planarization layer away from the first conductive layer; a second planarization layer, at a side of the second conductive layer away from the base substrate; and a plurality of light emitting element groups, at a side of the second planarization layer away from the second conductive layer, wherein the second conductive layer includes a plurality of conductive portions arranged along a first direction, a size of each of the plurality of conductive portions in the second direction is greater than a size of each of the plurality of conductive portions in the first direction, the second direction intersects with the first direction, and the plurality of conductive portions include a first conductive portion, the first conductive portion includes a closed annular portion, the closed annular portion is separated from at least one conductive portion adjacent thereto in the first direction in the second conductive layer, each of the plurality of light emitting element groups includes a first light emitting element, the first light emitting element includes a first anode, and an orthographic projection of the first anode on the base substrate overlaps with an orthographic projection of the closed annular portion on the base substrate; the plurality of conductive portions further include a second conductive portion adjacent to the first conductive portion, and an orthographic projection of the second conductive portion on the base substrate overlaps with the orthographic projection of the first anode on the base substrate.

For example, in the display substrate provided by an embodiment of the present disclosure, a size of the closed annular portion in the first direction is at least greater than a size of a part of the first conductive portion in the first direction, and the plurality of pixel driving circuits include a first pixel driving circuit, the first pixel driving circuit has a semiconductor pattern on the semiconductor layer, an orthographic projection of the first conductive portion on the base substrate overlaps with an orthographic projection of the semiconductor pattern of the first pixel driving circuit on the base substrate, the first pixel driving circuit includes a driving transistor, and the first conductive layer includes a first conductive pattern, the first conductive pattern has a same potential as a gate electrode of the driving transistor, the first conductive pattern and the gate electrode of the driving transistor together constitute a gate electrode potential metal, and an orthographic projection of a hollow region inside the closed annular portion on the base substrate overlaps with an orthographic projection of the gate electrode potential metal on the base substrate.

For example, in the display substrate provided by an embodiment of the present disclosure, an inner side of the closed annular portion has a hollow region, the first conductive portion has a plurality of hollow regions arranged along the second direction, and shapes and sizes of two adjacent hollow regions are approximately the same.

For example, in the display substrate provided by an embodiment of the present disclosure, the first light emitting element includes an effective light emitting region, and an orthographic projection of a straight line passing through a center of the effective light emitting region of the first light emitting element and extending along the second direction on the base substrate is located between an orthographic projection of the first conductive portion on the base substrate and an orthographic projection of the second conductive portion on the base substrate.

For example, in the display substrate provided by an embodiment of the present disclosure, two edges of the closed annular portion in the first direction respectively overlap with orthographic projections of anodes of the plurality of light emitting elements in the light emitting element group on the base substrate, and an orthographic projection of a hollow region of the closed annular portion on the base substrate is separated from an orthographic projection of the effective light emitting regions of the plurality of light emitting elements on the base substrate.

For example, in the display substrate provided by an embodiment of the present disclosure, the first conductive layer further includes a conductive metal configured to provide power to the pixel driving circuit, the first planarization layer includes a conductive metal via hole, and the conductive portion is electrically connected with the conductive metal through the conductive metal via hole, the first pixel driving circuit further includes a first light emitting control transistor and a storage capacitor, the storage capacitor includes a first electrode block and a second electrode block, the second electrode block is located at a side of the first electrode block away from the base substrate, and the conductive metal is respectively electrically connected with the source electrode of the first light emitting control transistor and the second electrode block.

For example, in the display substrate provided by an embodiment of the present disclosure, an orthographic projection of the closed annular portion on the base substrate overlaps with an orthographic projection of the first electrode block on the base substrate, the second electrode block includes an opening, an orthographic projection of the opening on the base substrate overlaps with an orthographic projection of the first electrode block on the base substrate, and an orthographic projection of the closed annular portion on the base substrate also overlaps with the orthographic projection of the opening on the base substrate.

For example, in the display substrate provided by an embodiment of the present disclosure, the first pixel driving circuit further includes a data writing transistor, a compensating transistor, a reset transistor, an anode initialization transistor and a second light emitting control transistor, the display substrate further includes: a reset signal line connected to a gate electrode of the reset transistor; a gate line connected to a gate electrode of the compensating transistor; an emission control line connected to a gate electrode of the first light emitting control transistor; and an initialization signal line connected to a source electrode of the reset transistor, wherein an orthographic projection of the closed annular portion on the base substrate respectively overlaps with orthographic projections of the reset signal line, the gate line and the initialization signal line on the base substrate.

For example, in the display substrate provided by an embodiment of the present disclosure, one end of the first conductive pattern is electrically connected to the gate electrode of the driving transistor through the opening, and the other end of the first conductive pattern is electrically connected to the source electrode or drain electrode of the compensating transistor.

For example, in the display substrate provided by an embodiment of the present disclosure, the closed annular portion includes a first portion and a second portion arranged along the first direction, and a third portion and a fourth portion arranged along the second direction, the first portion, the third portion, the second portion and the fourth portion are connected end to end to form the closed annular portion, and orthographic projections of the first portion and the second portion on the base substrate overlap with an orthographic projection of the second electrode block on the base substrate.

For example, in the display substrate provided by an embodiment of the present disclosure, an orthographic projection of the first portion on the base substrate overlaps with an orthographic projection of the first conductive pattern on the base substrate, the first conductive pattern and the first portion are both elongated in shape, and an extending direction of a long edge of the first conductive pattern is the same as an extending direction of a long edge of the first portion.

For example, in the display substrate provided by an embodiment of the present disclosure, the first conductive layer further includes a second conductive pattern and a third conductive pattern, the second conductive pattern is respectively connected with the initialization signal line and the source electrode of the reset transistor, and the second conductive layer further includes an anode connection portion, and the third conductive pattern is connected with a drain electrode of the second light emitting control transistor and the anode connection portion, an orthographic projection of the third portion on the base substrate overlaps with an orthographic projection of the initialization signal line on the base substrate, the orthographic projection of the third portion on the base substrate overlaps with an orthographic projection of the second conductive pattern on the base substrate, an orthographic projection of the fourth portion on the base substrate overlaps with an orthographic projection of the first conductive pattern on the base substrate.

For example, in the display substrate provided by an embodiment of the present disclosure, an orthographic projection of the hollow region on the base substrate overlaps with an orthographic projection of the initialization signal line on the base substrate, the orthographic projection of the hollow region on the base substrate overlaps with an orthographic projection of the second conductive pattern on the base substrate, and the orthographic projection of the hollow region on the base substrate overlaps with an orthographic projection of the second electrode block on the base substrate.

For example, in the display substrate provided by an embodiment of the present disclosure, the plurality of light emitting element groups are arranged along the first direction to form a plurality of light emitting element columns and along the second direction to form a plurality of light emitting element rows, each of the plurality of light emitting element groups includes one first light emitting element, one second light emitting element, one third light emitting element and one fourth light emitting element, and the first anode includes a main body portion, an orthographic projection of an effective light emitting region of the first light emitting element on the base substrate is located within an orthographic projection of the main body portion of the first anode on the base substrate, and the main body portion of the first anode and the first anode have at least partially a same boundary, the plurality of conductive portions include a second conductive portion, the first conductive portion and the second conductive portion are respectively located at two sides of the effective light emitting region of the first light emitting element in the first direction, and a distance between an orthographic projection of the closed annular portion on the base substrate and an orthographic projection of a center of the effective light emitting region of the first light emitting element on the base substrate is approximately the same as a distance between an orthographic projection of the second conductive portion on the base substrate and an orthographic projection of a center of the effective light emitting region of the first light emitting element on the base substrate.

For example, in the display substrate provided by an embodiment of the present disclosure, an orthographic projection of the first anode on the base substrate overlaps with an orthographic projection of the emission control line of the first pixel driving circuit on the base substrate, and a fourth light emitting element is arranged at a position adjacent to a center of the hollow region in the second direction, and an orthographic projection of an anode of the fourth light emitting element on the base substrate overlaps with all of orthographic projections of the gate line, the reset signal line and the initialization signal line on the base substrate.

For example, in the display substrate provided by an embodiment of the present disclosure, an orthographic projection of the gate line on the base substrate overlaps with an orthographic projection of the first conductive pattern on the base substrate, in one of the pixel driving circuits, orthographic projections of the first electrode block and the second electrode block on the base substrate are located between an orthographic projection of the gate line on the base substrate and an orthographic projection of the emission control line on the base substrate, an orthographic projection of the reset signal line on the base substrate is located between the orthographic projection of the gate line on the base substrate and the orthographic projection of the initialization signal line on the base substrate, the emission control line, the first electrode block, the gate line, the reset signal line and the initialization signal line are arranged along the second direction.

For example, in the display substrate provided by an embodiment of the present disclosure, the plurality of pixel driving circuits further include a second gate electrode layer located at a side of the first conductive layer close to the base substrate, the second electrode block is located in the second gate electrode layer, and at least two of the second electrode blocks are connected in the second gate electrode layer.

For example, in the display substrate provided by an embodiment of the present disclosure, orthographic projections of the effective light emitting region of the first light emitting element and the effective light emitting region of the second light emitting element on the base substrate do not overlap with an orthographic projection of the conductive portion on the base substrate, and the second light emitting element is configured to emit green light, an orthographic projection of a center of the effective light emitting region of the fourth light emitting element on the base substrate overlaps with the orthographic projection of the conductive portion on the base substrate, and a part where orthographic projections of the conductive portion and the center of the effective light emitting region of the fourth light emitting element on the base substrate overlap with each other is a solid part, and the fourth light emitting element is configured to emit blue light.

For example, in the display substrate provided by an embodiment of the present disclosure, the second light emitting element includes a second anode, and an orthographic projection of the effective light emitting region of the second light emitting element on the base substrate is located within an orthographic projection of the main body portion of the second anode on the base substrate, and the main body portion of the second anode and the second anode have at least partially a same boundary, areas of two overlapping regions of the main body portion of the second anode and two conductive portions adjacent to the second anode in the first direction are approximately the same.

For example, in the display substrate provided by an embodiment of the present disclosure, an orthographic projection of the hollow region on the base substrate is located between the effective light emitting region of the first light emitting element and the effective light emitting region of the second light emitting element, and the first light emitting element and the second light emitting element are the first light emitting element and the second light emitting element which are closest to each other in the first direction.

For example, in the display substrate provided by an embodiment of the present disclosure, in the first direction, a size of an intermediate portion of an anode of the light emitting element configured to emit red light in the second direction is greater than a size of an edge portion of the anode in the second direction, in the first direction, a size of an intermediate portion of an anode of the light emitting element configured to emit blue light in the second direction is greater than a size of an edge portion of the anode in the second direction.

For example, in the display substrate provided by an embodiment of the present disclosure, in one light emitting element group, orthographic projections of anodes of at least two light emitting elements on the base substrate overlap with an orthographic projection of the opening of the second electrode block on the base substrate, and an orthographic projection of the effective light emitting region of at least one light emitting element on the base substrate does not overlap with an orthographic projection of the first electrode block or the second electrode block on the base substrate.

For example, in the display substrate provided by an embodiment of the present disclosure, in any light emitting element selected from the group consisting of the first light emitting element, the second light emitting element, the third light emitting element and the fourth light emitting element, the first planarization layer has an anode hole, and an anode of the light emitting element is connected with a pixel driving circuit corresponding to the light emitting element through the anode hole, an orthographic projection of an anode hole of an anode of the light emitting element configured to emit red light on the base substrate does not overlap with an orthographic projection of the main body portion of the anode on the base substrate in the second direction, an orthographic projection of an anode hole of an anode of the light emitting element configured to emit red light on the base substrate does not overlap with an orthographic projection of an effective light emitting region of the light emitting element configured to emit red light on the base substrate in the second direction, an orthographic projection of an anode hole of an anode of the light emitting element configured to emit blue light on the base substrate does not overlap with an orthographic projection of the main body portion of the anode on the base substrate in the second direction, an orthographic projection of an anode hole of an anode of the light emitting element configured to emit blue light on the base substrate does not overlap with an orthographic projection of an effective light emitting region of the light emitting element configured to emit blue light on the base substrate in the second direction.

For example, in the display substrate provided by an embodiment of the present disclosure, a data line is arranged between two adjacent conductive portions, and a distance between orthographic projections of any one of the two adjacent conductive portions and the data line on the base substrate is less than a distance between orthographic projections of the two adjacent conductive portions on the base substrate.

At least one embodiment of the present disclosure further provides a display device, including any one of the above-mentioned display substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

FIG. 12B is a schematic section view of a display substrate along JJ direction in FIG. 11 according to an embodiment of the present disclosure;

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise,"

"comprising," "include," "including," etc., are intended to specify that the elements or the objects stated before these terms encompass the elements or the objects and equivalents thereof listed after these terms, but do not preclude the other elements or objects.

The display device includes a plurality of performance specifications such as power consumption, brightness, and chromaticity coordinate, and color cast is an important parameter therein. Usually, there are many factors that affect the color cast of an OLED display device. From the perspective of the design of the display substrate (an array substrate or a back panel of the OLED), the flatness of an anode greatly affects the color cast.

Figure 1:
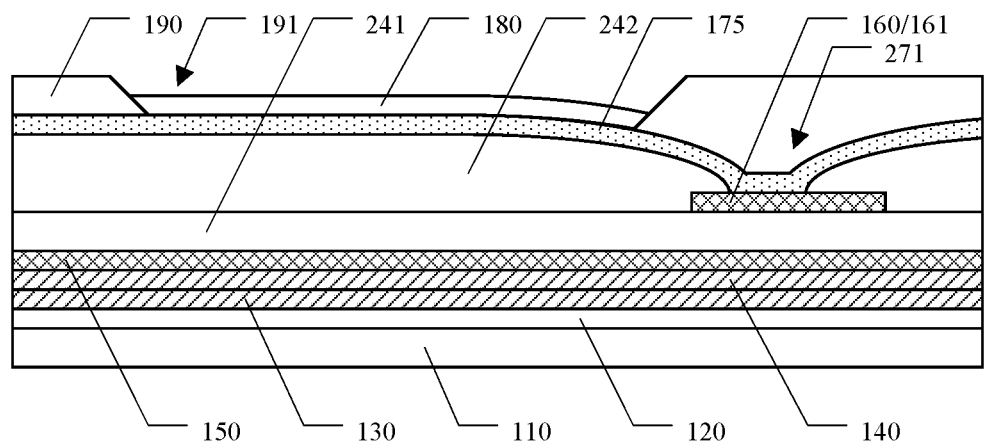
FIG. 1 is a schematic partial section view of a display substrate.
Figure 2:
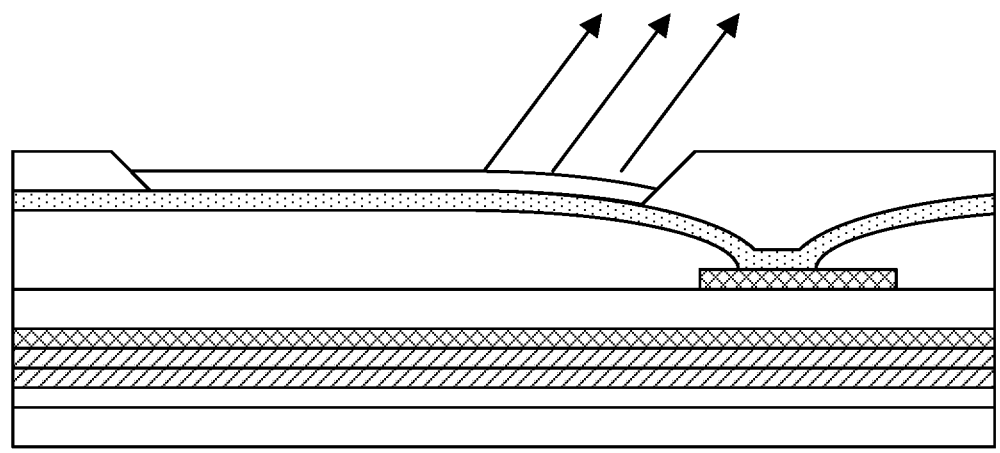
FIG. 2 illustrates a schematic diagram of the display substrate illustrated in FIG. 1 emitting light.

FIG. 1 is a partial schematic cross-sectional view of a display substrate. FIG. 2 is a schematic diagram of light emission performed by the display substrate shown in FIG. 1. As illustrated by FIG. 1, sub-pixels of the display substrate include a base substrate 110, a semiconductor layer 120, a first gate electrode layer 130, a second gate electrode layer 140, a first conductive layer 150, a first planarization layer 241, a second conductive layer 160, a second planarization layer 242, an anode 175, and a pixel defining layer 190 that are sequentially disposed. The semiconductor layer 120, the first gate electrode layer 130, the second gate electrode layer 140, and the first conductive layer 150 may form a pixel driving circuit including a thin film transistor and a storage capacitor. The second conductive layer 160 includes a connection electrode 161, which is connected to the pixel driving circuit through a via hole (not shown) in the first planarization layer 241. The anode 170 is connected to the connection electrode 161 through a via hole 271 in the second planarization layer 242. The pixel defining layer 190 includes an opening 191 to expose a part of the anode 170. When a subsequent organic light emitting layer 180 is formed in the opening 191, the anode 175 may come into contact with the organic light emitting layer 180 and drive the organic light emitting layer to emit light. A region defined by the opening 191 is an effective light emitting region of the sub-pixel.

The via hole 271 in the second planarization layer 242 affects the flatness of the anode 175. If the via hole 271 is relatively close to the opening 191 (that is, the effective light emitting region), the anode 175 at the location of the opening 191 includes a phenomenon of "inclination". As a result, the light emitting direction of the sub-pixel is offset. If directions of "inclination" of anodes in sub-pixels of different colors are different, as a result, intensities of light emitted by the sub-pixels of different colors (for example, red, green, and blue) toward different directions do not match each other. Consequently, the phenomenon of color cast occurs. For example, when observing from a side of a display device including the display substrate, the display image is red, and when observing from the other side of display device, the display image is blue.

Regarding this, the embodiments of the present disclosure provide a display substrate and a display device. The display substrate includes a base substrate, a first conductive layer, a first planarization layer, a second conductive layer, a second planarization layer, and a plurality of light emitting element groups. The first conductive layer is located on the base substrate. The first planarization layer is located on a side of the first conductive layer away from the base substrate. The second conductive layer is located on a side of the first planarization layer away from the first conductive layer. The second planarization layer is located on a side of the second conductive layer away from the first planarization layer. The plurality of light emitting element groups are located on a side of the second planarization layer away from the base substrate. The plurality of light emitting element groups are arranged along a first direction to form a plurality of light emitting element columns, and are arranged along a second direction to form a plurality of light emitting element rows. Each light emitting element group includes a first light emitting element, a second light emitting element, a third light emitting element, and a fourth light emitting element. The second light emitting element and the third light emitting element are arranged along the second direction to form a light emitting element pair. The first light emitting element, the light emitting element pair, and the third light emitting element are arranged along the first direction. The first light emitting element includes a first anode. The second light emitting element includes a second anode. The third light emitting element includes a third anode. The fourth light emitting element includes a fourth anode. The second conductive layer includes a first connection electrode, a second connection electrode, a third connection electrode, and a fourth connection electrode. The second planarization layer includes a first via hole, a second via hole, a third via hole, and a fourth via hole. The first anode is connected to the first connection electrode through the first via hole. The second anode is connected to the second connection electrode through the second via hole. The third anode is connected to the third connection electrode through the third via hole. The fourth anode is connected to the fourth connection electrode through the fourth via hole. A plurality of third via holes corresponding to one light emitting element row are approximately located on a first straight line extending along the first direction, and an orthographic projection of the fourth via hole closest to the first straight line on the base substrate is located on a side of the first straight line close to the fourth anode corresponding to the fourth via hole. Therefore, in the display substrate, the location of the fourth via hole is moved toward the fourth anode, so that the distance between the fourth via hole and the effective light emitting region of the adjacent first light emitting element is increased, to ensure the flatness of the first anode located in the effective light emitting region of the first light emitting element, thereby avoiding the phenomenon of color cast; the distance between the fourth via hole and the effective light emitting region of the fourth light emitting element is reduced, so that resistance between the fourth anode located in the effective light emitting region of the fourth light emitting element and the fourth connection electrode is reduced, and the distance between the first anode and the fourth anode is increased, to avoid short-circuiting between the first anode and the fourth anode due to residues left in the manufacturing process.

The display substrate and the display device that are provided in the embodiments of the present disclosure are described in detail below with reference to the accompanying drawings.

Figure 3:
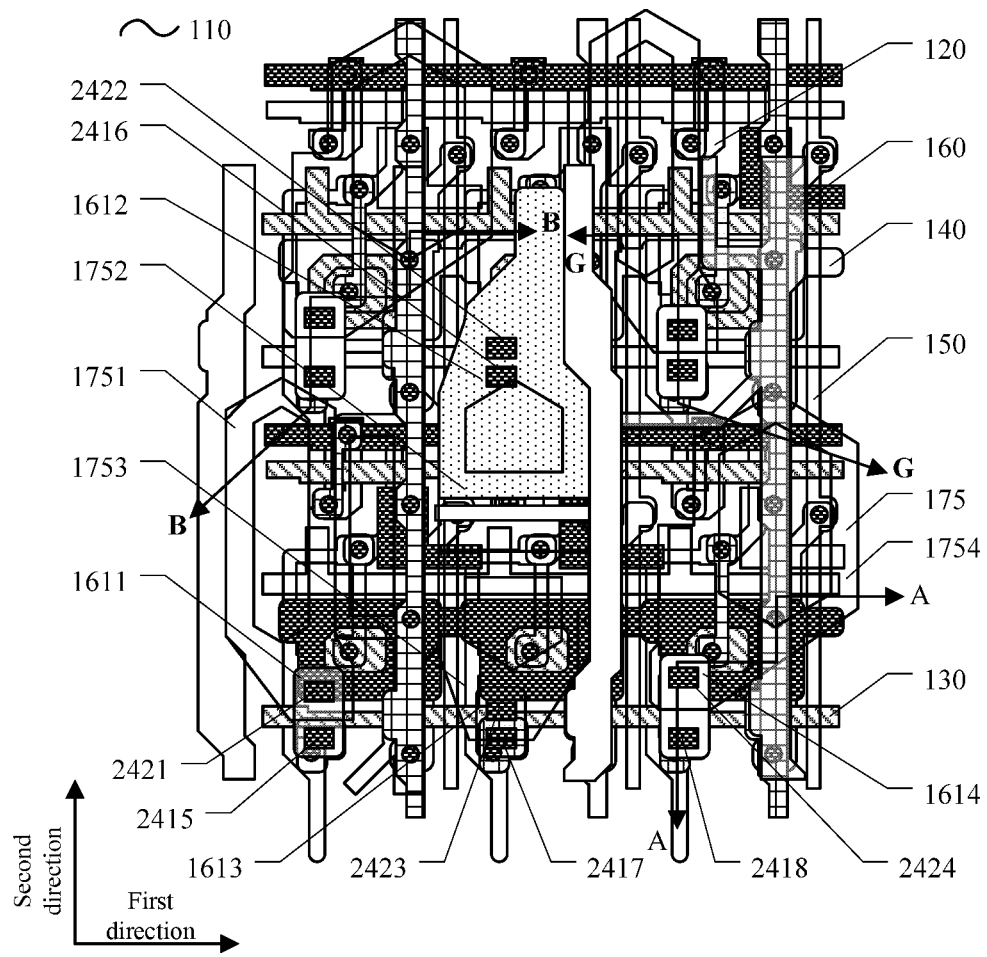
FIG. 3 is a schematic plan view of a display substrate according to an embodiment of the present disclosure.
Figure 4A:
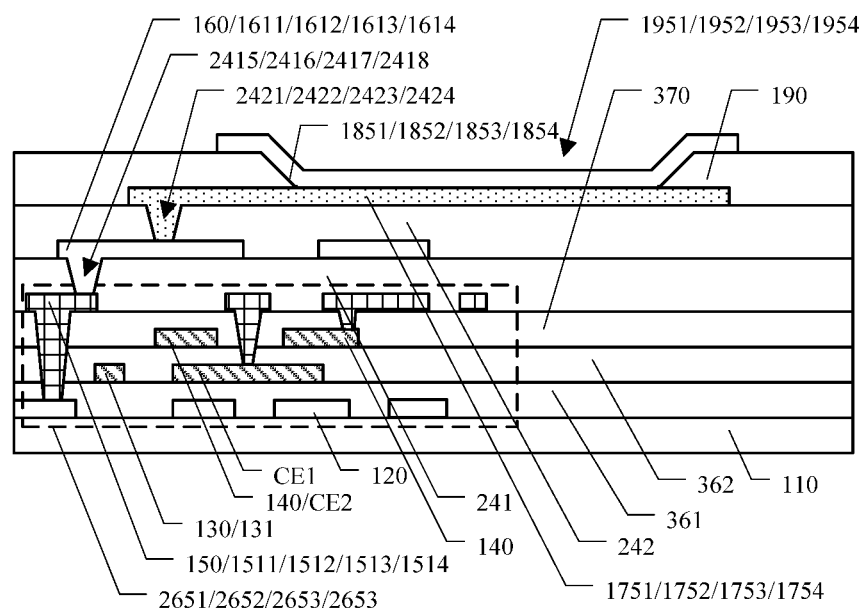
FIG. 4A is a schematic section view of a display substrate according to an embodiment of the present disclosure along the AA direction in FIG. 3.
Figure 4B:
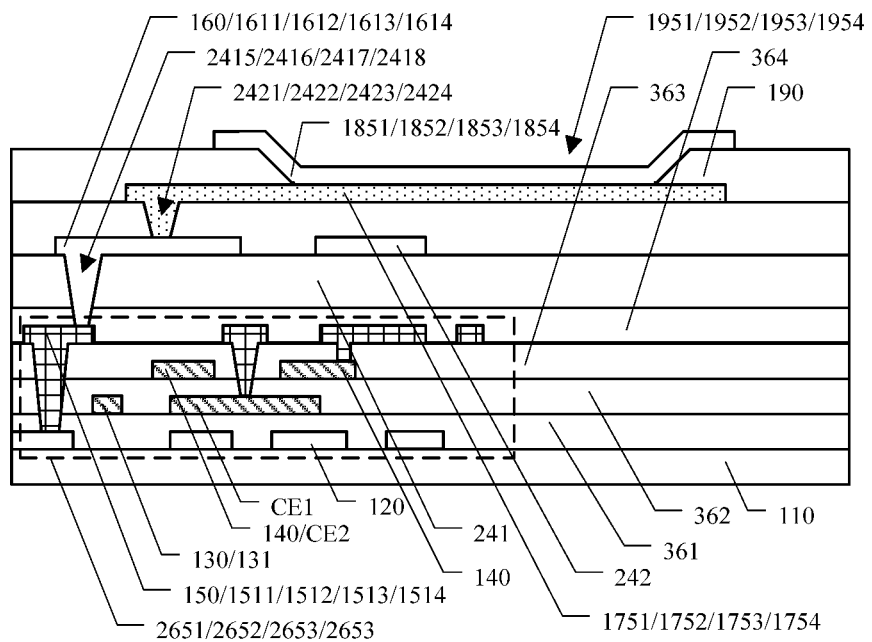
FIG. 4B is a schematic section view of another display substrate according to an embodiment of the present disclosure along the AA direction in FIG. 3.
Figure 5A:
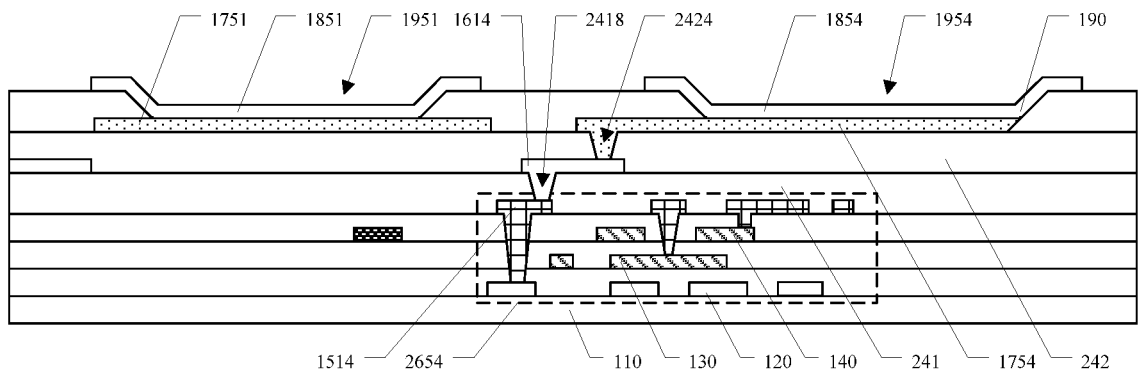
FIG. 5A is a schematic section view of a display substrate according to an embodiment of the present disclosure along the BB direction in FIG. 3.
Figure 5B:
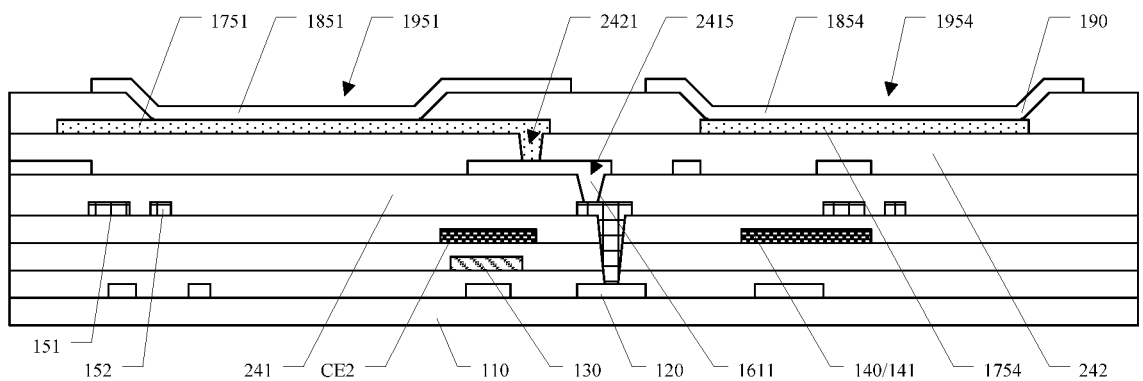
FIG. 5B is a schematic section view of a display substrate along the GG direction in FIG. 3 according to an embodiment of the present disclosure.
Figure 6:
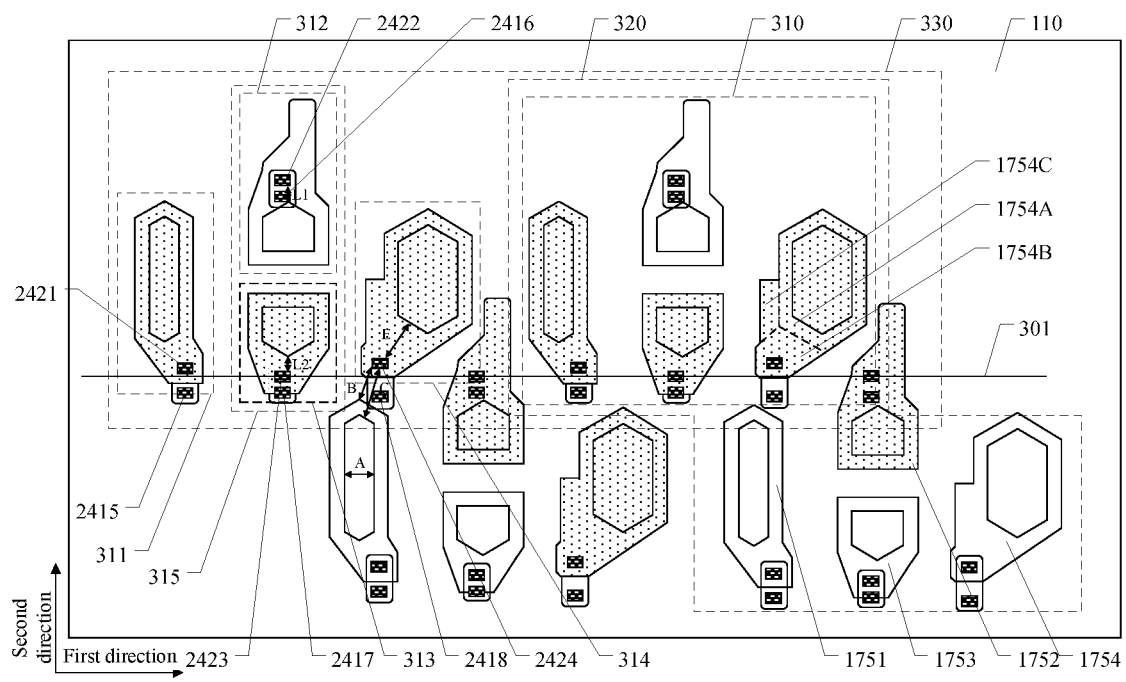
FIG. 6 is a schematic plan view of a light emitting element in a display substrate according to an embodiment of the present disclosure.

An embodiment of the present disclosure provides a display substrate. FIG. 3 is a schematic planar diagram of a display substrate according to an embodiment of the present disclosure. FIG. 4A and FIG. 4B are schematic cross-sectional views of a display substrate according to an embodiment of the present disclosure along an AA direction in FIG. 3. FIG. 5A is a schematic cross-sectional view of a display substrate according to an embodiment of the present disclosure along a BB direction in FIG. 3. FIG. 5B is a schematic cross-sectional view of a display substrate according to an embodiment of the present disclosure along a GG direction in FIG. 3. FIG. 6 is a schematic planar diagram of a light emitting element in a display substrate according to an embodiment of the present disclosure.

As illustrated by FIG. 3, FIG. 4A, FIG. 4B, FIG. 5A, FIG. 5B, and FIG. 6, the display substrate 100 includes a base substrate 110, a first conductive layer 150, a first planarization layer 241, a second conductive layer 160, a second planarization layer 242, and a plurality of light emitting element groups 310. The first conductive layer 150 is located on the base substrate 110. The first planarization layer 241 is located on a side of the first conductive layer 150 away from the base substrate 110. The second conductive layer 160 is located on a side of the first planarization layer 241 away from the first conductive layer 150. The second planarization layer 242 is located on a side of the second conductive layer 160 away from the first planarization layer 241. The plurality of light emitting element groups 310 are located on a side of the second planarization layer 242 away from the base substrate 110. The plurality of light emitting element groups 310 are arranged along a first direction to form a plurality of light emitting element columns 320, and are arranged along a second direction to form a plurality of light emitting element rows 330. Each light emitting element group 310 includes a first light emitting element 311, a second light emitting element 312, a third light emitting element 313, and a fourth light emitting element 314. The second light emitting element 312 and the third light emitting element 313 are arranged along the second direction to form a light emitting element pair 315. The first light emitting element 311, the light emitting element pair 315, and the fourth light emitting element 314 are arranged along the first direction. The first light emitting element 311 includes a first anode 1751. The second light emitting element includes a second anode 1752. The third light emitting element includes a third anode 1753. The fourth light emitting element includes a fourth anode 1754. The second conductive layer 160 includes a first connection electrode 1611, a second connection electrode 1612, a third connection electrode 1613, and a fourth connection electrode 1614. The second planarization layer 242 includes a first via hole 2421, a second via hole 2422, a third via hole 2423, and a fourth via hole 2424. The first anode 1751 is connected to the first connection electrode 1611 through the first via hole 2421. The second anode 1752 is connected to the second connection electrode 1612 through the second via hole 2422. The third anode 1753 is connected to the third connection electrode 1613 through the third via hole 2423. The fourth anode 1754 is connected to the fourth connection electrode 1614 through the fourth via hole 2424. A plurality of third via holes 2423 corresponding to a light emitting element row 330 are approximately located on a first straight line 301 extending along the first direction, and an orthographic projection of the fourth via hole 2424 closest to the first straight line 301 on the base substrate 110 is located on a side of the first straight line 301 close to the fourth anode 1754 corresponding to the fourth via hole 2424. It should be noted that, the foregoing first conductive layer and second conductive layer are sequentially stacked along a direction away from the base substrate.

In the display substrate provided in this embodiment of the present disclosure, the second light emitting element and the third light emitting element are arranged along the second direction to form the light emitting element pair. The first light emitting element, the light emitting element pair, and the third light emitting element are arranged along the first direction. That is, the second anode and the third anode are arranged along the second direction to form an anode pair. The first anode, the anode pair, and the third anode are arranged along the first direction. The orthographic projection of the fourth via hole closest to the first straight line on the base substrate is located on the side of the first straight line close to the fourth anode. That is, in the display substrate, the location of the fourth via hole is moved toward the fourth anode. Therefore, the display substrate includes the following beneficial effects: (1) the distance between the fourth via hole and the effective light emitting region of the adjacent first light emitting element is increased, to ensure the flatness of the first anode located in the effective light emitting region of the first light emitting element, thereby avoiding the phenomenon of color cast; (2) the distance between the fourth via hole and the effective light emitting region of the fourth light emitting element is reduced, so that resistance between the fourth anode located in the effective light emitting region of the fourth light emitting element and the fourth connection electrode is reduced, and (3) the distance between the first anode and the fourth anode is increased, to avoid short-circuiting between the first anode and the fourth anode due to residues left in the manufacturing process.

For example, as illustrated by FIG. 5A, FIG. 5B, and FIG. 6, in the display substrate, the location of the fourth via hole 2424 is moved toward the fourth anode 1754. Therefore, the distance between the fourth via hole 2424 and the effective light emitting region (that is, a region defined by the opening 1951) of the adjacent first light emitting element is increased. In addition, because the fourth anode includes a connection portion connected to a pixel driving circuit below the fourth anode, when the location of the fourth via hole 2424 is moved toward the fourth anode 1754, the fourth via hole 2424 is not overlapped with the effective light emitting region (that is, the region defined by the opening 1954) of the fourth light emitting element. In this case, both the distance between the fourth via hole 2424 and the effective light emitting region of the adjacent first light emitting element and the distance between the fourth via hole 2424 and the effective light emitting region of the fourth light emitting element are proper, so that the flatness of the first anode located in the effective light emitting region of the first light emitting element and the flatness of the fourth anode located in the effective light emitting region of the fourth light emitting element can be both ensured, thereby avoiding the phenomenon of color cast.

For example, as illustrated by FIG. 5A, FIG. 5B, and FIG. 6, in the display substrate, the location of the fourth via hole 2424 is moved toward the fourth anode 1754, so that the distance between the fourth via hole 2424 and the effective light emitting region of the fourth light emitting element is reduced, thereby reducing the resistance between the fourth anode located in the effective light emitting region of the fourth light emitting element and the fourth connection electrode. On the other hand, in the display substrate, the location of the fourth via hole 2424 is moved toward the fourth anode 1754, so that the distance between the first anode 1751 and the fourth anode 1754 is increased, thereby avoiding short-circuiting between the first anode 1751 and the fourth anode 1754 due to residues left in the manufacturing process.

For example, a shortest distance between the orthographic projection of the first anode on the base substrate and the orthographic projection of the adjacent fourth anode on the base substrate is greater than 0.8 times of the width of the effective light emitting region of the first light emitting element in the first direction, thereby effectively avoiding short-circuiting between the first anode and the fourth anode due to residues left in the manufacturing process.

For example, as illustrated by FIG. 6, the fourth anode 1754 includes a body portion 1754A and a connection portion 1754B. The effective light emitting region of the fourth light emitting element 314 falls into the orthographic projection of the body portion 1754A on the base substrate 110. The connection portion 1754B is connected to the corresponding fourth connection electrode 1614 through the fourth via hole 2424. The connection portion 1754B is located on a side of the first straight line 301 close to the body portion 1754A, to effectively reduce the area of the connection portion, thereby reducing the resistance between the fourth anode located in the effective light emitting region of the fourth light emitting element and the fourth connection electrode. For example, as illustrated by FIG. 6, the fourth anode 1754 further includes a first supplementing portion 1754C, which can cover two channel regions of a compensating thin film transistor in a corresponding one of the plurality of pixel driving circuits, to improve the stability and the service life of the compensating thin film transistor, thereby improving the long-term light emission stability and the service life of the display substrate.

In some examples, as illustrated by FIG. 6, the first supplementing portion 1754C is protruded from the fourth body portion 1754A toward the third anode 1753, and the first supplementing portion 1754C is located on a side of the fourth connection portion 1754B close to the fourth body portion 1754A.

In some examples, as illustrated by FIG. 6, the first supplementing portion 1754C is connected to both the fourth body portion 1754A and the fourth connection portion 1754B. Therefore, the display substrate can fully use the area on the display substrate, to densely arrange the first anode, the second anode, the third anode, and the fourth anode, so that the resolution of the display substrate can be ensured.

For example, as illustrated by FIG. 4A, the display substrate includes a base substrate 110, a semiconductor layer 120, a first insulating layer 361, a first gate electrode layer 130, a second insulating layer 362, a second gate electrode layer 140, an interlaminar insulating layer 363, a first conductive layer 150, a first planarization layer 241, a second conductive layer 160, and a second planarization layer 242 that are sequentially disposed. The first gate electrode layer 130 may include a gate electrode line 131 and a first electrode block CE1. The second gate electrode layer may include a second electrode block CE2. The orthographic projection of the first electrode block CE1 on the base substrate 110 is at least partially overlapped with the orthographic projection of the second electrode block CE2 on the base substrate 110, to form a storage capacitor.

For example, as illustrated by FIG. 4A, the first conductive layer 150 may further include a power line and a data line. The second conductive layer 160 may include a conductive layer overlapping the power line. The conductive portion may be electrically connected to the power line, to reduce the resistance of the power line.

For example, as illustrated by FIG. 4B, the display substrate may further include a passivation layer 364, located between the first conductive layer 150 and the first planarization layer 241. Certainly, this embodiment of the present disclosure includes but is not limited thereto. Alternatively, a passivation layer may not be disposed on the display substrate.

In some examples, as illustrated by FIG. 6, a plurality of second via holes 2422 corresponding to a light emitting element row 330 adjacent to the light emitting element row 330 corresponding to the first straight line 301 are also approximately located on the first straight line 301.

In some examples, as illustrated by FIG. 3, the fourth via hole 2424 in a light emitting element group 310 is located on a side that is of the first anode 1751 in the light emitting element group 310 adjacent to the light emitting element group 310 in the second direction and that is along a bisector in the second direction, for example, a side that is of the first anode 1751 close to the second anode 1752 in the light emitting element group 310 in which the first anode 1751 is located along the bisector in the second direction. That is, the fourth via hole in a light emitting element group is located on a side that is of the first anode in the light emitting element group adjacent to the light emitting element group in the second direction and that is along a bisector in the second direction. In some examples, as illustrated by FIG. 3, in a light emitting element group 310, the first via hole 2421 is located on a side of the first anode 1751 along a bisector in the second direction, for example, a side of the first anode 1751 close to the third anode 1753 along the bisector in the second direction; the second via hole 2422 is located on a side of the second anode 1752 close to the first anode 1751 along the bisector in the second direction; and the third via hole 2423 is located on a side of the third anode 1753 close to the first anode 1751 along the bisector in the second direction.

In some examples, as illustrated by FIG. 6, a plurality of fourth via holes 2424 corresponding to a light emitting element row 330 are approximately located on a straight line extending along the first direction. The straight line runs through a plurality of first anodes 1751 or a plurality of first via holes 2421 corresponding to the light emitting element row 330.

In some examples, as illustrated by FIG. 6, a plurality of fourth via holes 2424 corresponding to a light emitting element column 320 are approximately located on a second straight line extending along the second direction. The second straight line runs through a plurality of first anodes 1751 or effective light emitting regions of a plurality of first light emitting elements 311 corresponding to the light emitting element column 320.

In some examples, as illustrated by FIG. 6, a distance between the fourth anode 1754 and the first anode 1751 closest to the fourth anode 1754 is less than a distance between the first anode 1751 located in the same row and the fourth 1754 closest to the first anode 1751.

In some examples, as illustrated by FIG. 6, the light emitting element groups 310 include a first light emitting element group and a second light emitting element group that are adjacent in the second direction. The first light emitting element group and the second light emitting element group are respectively disposed in two adjacent light emitting element rows 330. A connection portion of the fourth anode 1754 in the first light emitting element group and a connection portion of the first anode 1751 in the second light emitting element group are both located on the same side of the fourth anode 1754 along a bisector in the second direction. That is, the connection portion of the fourth anode and the connection portion of the first anode adjacent to the fourth anode in the second direction are provided on the same side of the body portion of the fourth anode along the bisector in the second direction.

In some examples, as illustrated by FIG. 6, the shape of the body portion of the first anode 1751 include a hexagon, and a point of the first anode 1751 closest to the fourth anode 1754 adjacent to the first anode 1751 in the second direction is a vertex of the hexagon.

In some examples, as illustrated by FIG. 6, two adjacent light emitting element rows 330 are offset from each other by ½ pitch. The foregoing pitch is equal to a distance between centers of effective light emitting regions of two first light emitting elements 311 in two light emitting element groups 310 that are adjacent in the first direction.

In some examples, as illustrated by FIG. 6, the first straight line 301 is located between the two adjacent light emitting element rows 330.

In some examples, as illustrated by FIG. 5A, FIG. 5B, and FIG. 6, the orthographic projection of the first via hole 2421 closest to the first straight line 301 on the base substrate 110 is located on a side of the first straight line 301 close to the first anode 1751 corresponding to the first via hole 2421. That is, in the display substrate, the location of the first via hole is moved toward the first anode. Therefore, the display substrate includes the following beneficial effects: (1) the distance between the first via hole and the effective light emitting region of the fourth light emitting element closest to the first via hole in the second direction is increased, to ensure the flatness of the fourth anode located in the effective light emitting region of the adjacent fourth light emitting element, thereby avoiding the phenomenon of color cast; (2) the distance between the first via hole and the effective light emitting region of the first light emitting element is reduced, so that resistance between the first anode located in the effective light emitting region of the first light emitting element and the first connection electrode is reduced, and (3) the distance between the first anode and the fourth anode is increased, to avoid short-circuiting between the first anode and the fourth anode due to residues left in the manufacturing process. Certainly, this embodiment of the present disclosure includes but is not limited thereto. The orthographic projection of the first via hole on the base substrate may alternatively be located on the first straight line.

In some examples, as illustrated by FIG. 6, the distance between the orthographic projection of the fourth via hole 2424 on the base substrate 110 and the orthographic projection of the first straight line 301 on the base substrate 110 is greater than the distance between the orthographic projection of the first via hole 2421 on the base substrate 110 and the orthographic projection of the first straight line 301 on the base substrate 110. That is, compared with the first straight line, the amount of the offset of the fourth via hole is larger. Certainly, this embodiment of the present disclosure includes but is not limited thereto. Compared with the first straight line, the amount of the offset of the fourth via hole may alternatively be equal to the amount of the offset of the first via hole.

In some examples, as illustrated by FIG. 6, there is a first shortest distance L1 between the orthographic projection of the effective light emitting region of the second light emitting element 312 on the base substrate 110 and the orthographic projection of the second via hole 2422 on the base substrate 110. There is a second shortest distance L2 between the orthographic projection of the effective light emitting region of the third light emitting element 313 on the base substrate 110 and the orthographic projection of the third via hole 2423 on the base substrate 110. The first shortest distance L1 is approximately equal to the second shortest distance L2. It should be noted that, the foregoing first shortest distance is approximately equal to the second shortest distance includes a case that the first shortest distance is completely equal to the second shortest distance, and also includes a case that a difference between the first shortest distance and the second shortest distance is less than 1 micron.

Therefore, the display substrate can enable the degree of inclination of the second anode located in the effective light emitting region of the second light emitting element to be the same as the degree of inclination of the third anode located in the effective light emitting region of the third light emitting element, and enable the inclination directions thereof to be opposite, to effectively avoid the phenomenon of color cast. It should be noted that, when the second anode located in the effective light emitting region of the second light emitting element and the third anode located in the effective light emitting region of the third light emitting element do not incline, it may be considered that the degree of inclination of the second anode located in the effective light emitting region of the second light emitting element and the degree of inclination of the third anode located in the effective light emitting region of the third light emitting element are zero. In addition, the first shortest distance between the orthographic projection of the effective light emitting region of the second light emitting element on the base substrate and the orthographic projection of the second via hole on the base substrate may be a shortest distance between an edge of the orthographic projection of the effective light emitting region of the second light emitting element on the base substrate and an edge of the orthographic projection of the second via hole on the base substrate. Similarly, the second shortest distance between the orthographic projection of the effective light emitting region of the third light emitting element on the base substrate and the orthographic projection of the third via hole on the base substrate may be a shortest distance between an edge of the orthographic projection of the effective light emitting region of the third light emitting element on the base substrate and an edge of the orthographic projection of the third via hole on the base substrate.

In some examples, as illustrated by FIG. 6, a distance C between the orthographic projection of the fourth via hole 2424 on the base substrate 110 and the orthographic projection of the effective light emitting region of the first light emitting element 311 adjacent in the second direction on the base substrate 110 is greater than 1.2 times of the width A of the effective light emitting region of the first light emitting element 311 adjacent in the second direction in the first direction. Therefore, the display substrate can ensure that the first anode located in the effective light emitting region of the first light emitting element includes relatively good flatness.

In some examples, as illustrated by FIG. 6, a shortest distance B between the fourth via hole 2424 in a light emitting element group 310 and the first anode 1751 in an adjacent light emitting element group 310 is less than a distance E between the fourth via hole 2424 in the light emitting element group 310 and an effective light emitting region of the corresponding fourth light emitting element group 314.

In some examples, as illustrated by FIG. 6, a shortest distance between the fourth anode 1754 in a light emitting element group 310 and the first anode 1751 in a light emitting element group 310 closest to the fourth anode 1754 in the second direction is a distance between a vertex of the first anode 1751 in an adjacent light emitting element group 310 and the fourth anode 1754 in the light emitting element group 310. That is, the vertex of the first anode 1751 in the adjacent light emitting element group 310 is a point closest to the fourth anode 1754 in the light emitting element group 310. For example, the shape of the orthographic projection of the first anode 1751 on the base substrate 110 is a hexagon, and the vertex is a vertex on a long axis of the hexagon.

In some examples, as illustrated by FIG. 3, FIG. 4A, FIG. 4B, FIG. 5A, FIG. 5B. and FIG. 6, the display substrate 100 further includes a pixel defining layer 190. The pixel defining layer 190 is located on a side of the first anode 1751, the second anode 1752, the third anode 1753, and the fourth anode 1754 away from the base substrate 110. The pixel defining layer 190 includes a first opening 1951, a second opening 1952, a third opening 1953, and a fourth opening 1954. The first light emitting element 311 includes a first light emitting portion 1851. The second light emitting element 312 includes a second light emitting portion 1852. The third light emitting element 313 includes a third light emitting portion 1853. The fourth light emitting element 314 includes a fourth light emitting portion 1854. The first opening 1951 falls into the orthographic projection of the first anode 1751 on the base substrate 110. At least a part of the first light emitting portion 1851 is located in the first opening 1951 and covers an exposed part of the first anode 1751. The second opening 1952 falls into the orthographic projection of the second anode 1752 on the base substrate 110. At least a part of the second light emitting portion 1852 is located in the second opening 1952 and covers an exposed part of the second anode 1752. The third opening 1953 falls into the orthographic projection of the third anode 1753 on the base substrate 110. At least a part of the third light emitting portion 1853 is located in the third opening 1953 and covers an exposed part of the third anode 1753. The fourth opening 1954 falls into the orthographic projection of the fourth anode 1754 on the base substrate 110. At least a part of the fourth light emitting portion 1854 is located in the fourth opening 1954 and covers an exposed part of the fourth anode 1754. A region defined by the first opening 1951 is an effective light emitting region of the first light emitting element 311. A region defined by the second opening 1952 is an effective light emitting region of the second light emitting element 312. A region defined by the third opening 1953 is an effective light emitting region of the third light emitting element 313. A region defined by the fourth opening 1954 is an effective light emitting region of the fourth light emitting element 314.

In some examples, as illustrated by FIG. 6, the distance C between the orthographic projection of the fourth via hole 2424 on the base substrate 110 and the orthographic projection of the first opening 1951 adjacent in the second direction on the base substrate 110 is greater than 1.2 times of the width A of the first opening 1951 in the first direction. Therefore, the display substrate can ensure that the first anode located in the first opening (that is, a part that is of the first anode and that is exposed by the first opening) includes relatively good flatness.

In some examples, as illustrated by FIG. 3, FIG. 4A, FIG. 4B, FIG. 5A, FIG. 5B. and FIG. 6, the display substrate 100 includes a first planarization layer 241 and a first conductive layer 150. The first planarization layer 241 is located on a side of the second conductive layer 160 close to the base substrate 110. The first conductive layer 150 is located on a side of the first planarization layer 241 close to the base substrate 110. The first conductive layer 150 includes a first drain electrode 1511, a second drain electrode 1512, a third drain electrode 1513, and a fourth drain electrode 1514. The first planarization layer 241 includes a fifth via hole 2415, a sixth via hole 2416, a seventh via hole 2417, and an eighth via hole 2418. The first connection electrode 1611 is connected to the first drain electrode 1511 through the fifth via hole 2415. The second connection electrode 1612 is connected to the second drain electrode 1512 through the sixth via hole 2416. The third connection electrode 1613 is connected to the third drain electrode 1513 through the seventh via hole 2417. The fourth connection electrode 1614 is connected to the fourth drain electrode 1514 through the eighth via hole 2418.

In some examples, as illustrated by FIG. 4A and FIG. 4B, the display substrate 100 further includes a first pixel driving circuit 2651, a second pixel driving circuit 2652, a third pixel driving circuit 2653, and a fourth pixel driving circuit 2654. The first drain electrode 1511 is a part of the first pixel driving circuit 2651. The second drain electrode 1512 is a part of the second pixel driving circuit 2652. The third drain electrode 1513 is a part of the third pixel driving circuit 2653. The fourth drain electrode 1514 is a part of the fourth pixel driving circuit 2654. The first pixel driving circuit 2651 is connected to the first anode 1751 through the first connection electrode 1611, to apply a drive signal to the first anode 1751. The second pixel driving circuit 2652 is connected to the second anode 1752 through the second connection electrode 1612, to apply a drive signal to the second anode 1752. The third pixel driving circuit 2653 is connected to the third anode 1753 through the third connection electrode 1613, to apply a drive signal to the third anode 1753. The fourth pixel driving circuit 2654 is connected to the fourth anode 1754 through the fourth connection electrode 1614, to apply a drive signal to the fourth anode 1754.

Figure 7:
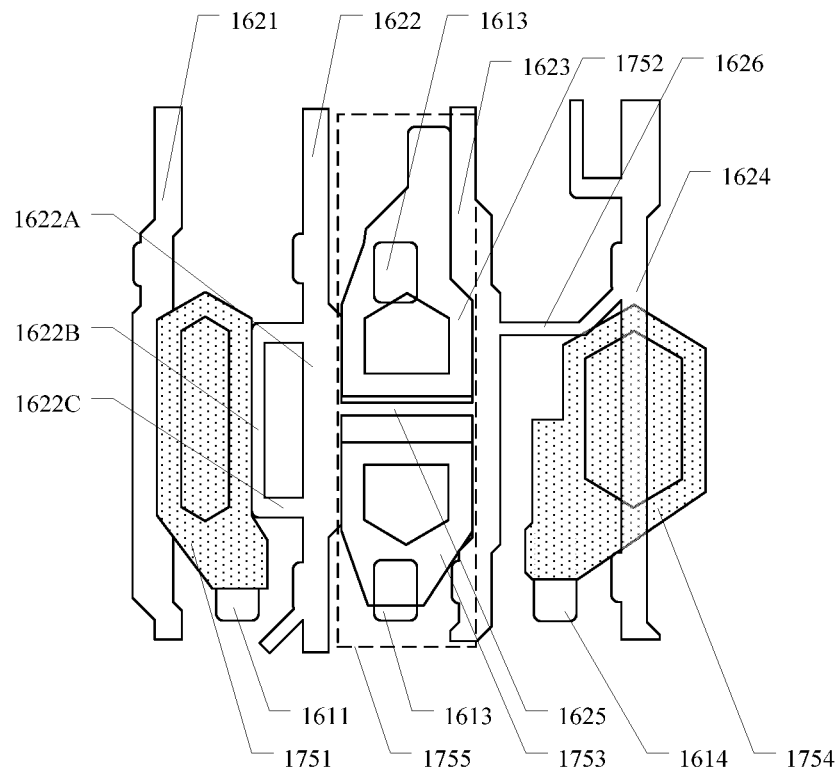
FIG. 7 is a schematic diagram of the planar relationship between a second conductive layer and an anode layer in a display substrate according to an embodiment of the present disclosure.

FIG. 7 is a schematic diagram of a planar relationship between a second conductive layer and an anode layer in a display substrate according to an embodiment of the present disclosure. As illustrated by FIG. 6 and FIG. 7, the second anode 1752 and the third anode 1753 are arranged along the second direction to form an anode pair 1755. The first anode 1751, the anode pair 1755, and the fourth anode 1754 are arranged along the first direction. The second conductive layer 160 further includes a first conductive portion 1621, a second conductive portion 1622, a third conductive portion 1623, and a fourth conductive portion 1624 that extend along the second direction. The first conductive portion 1621 is located on a side of the first anode 1751 away from the anode pair 1755. The second conductive portion 1622 is located between the first anode 1751 and the anode pair 1755. The third conductive portion 1623 is located between the anode pair 1755 and the fourth anode 1754. The fourth conductive portion 1624 is overlapped with the fourth anode 1754. In this display substrate, the first conductive portion 1621, the second conductive portion 1622, the third conductive portion 1623, and the fourth conductive portion 1624 that extend along the second direction may be connected to the power line in the first conductive layer 150, to reduce the resistance of the power line.

In some examples, as illustrated by FIG. 7, the orthographic projection of the first conductive portion 1621 and the second conductive portion 1622 on the base substrate 110 is not overlapped with the orthographic projection of the first anode 1751 on the base substrate 110. The orthographic projection of the second conductive portion 1622 and the third conductive portion 1623 on the base substrate 110 does is not overlapped with the orthographic projection of the anode pair 1755 on the base substrate 110. Therefore, the first conductive portion 1621 and the second conductive portion 1622 have relatively small impact on the flatness of the first anode 1751. The second conductive portion 1622 and the third conductive portion 1623 have relatively small impact on the flatness of the second anode 1752 and the third anode 1753. Certainly, this embodiment of the present disclosure includes but is not limited thereto. The first conductive portion, the second conductive portion, and the third conductive portion may be alternatively overlapped with the anode.

For example, the orthographic projections of the first conductive portion 1621 and the second conductive portion 1622 on the base substrate 110 respectively form a first overlapping portion and a second overlapping portion with the orthographic projection of the first anode 1751 on the base substrate 110. The area of the first overlapping portion is approximately equal to that of the second overlapping portion, so that the flatness of the first anode 1751 can also be improved. Similarly, the orthographic projections of the second conductive portion 1622 and the third conductive portion 1623 on the base substrate 110 respectively form a third overlapping portion and a fourth overlapping portion with the orthographic projection of anode pair 1755 on the base substrate 110. The area of the third overlapping portion is approximately equal to that of the fourth overlapping portion, so that the flatness of the second anode 1752 and the third anode 1753 of the anode pair 1755 can also be improved. It should be noted that, the foregoing "approximately equal" includes a case of exact equivalence, and a case that a difference between the two is less than 10% of an average value of the two.

For example, the first overlapping portion and the second overlapping portion are symmetric about a body portion of the first anode 1751, that is, the effective light emitting region of the first light emitting element 311, along a bisector in the second direction, to further improve the flatness of the effective light emitting region of the first light emitting element 311. The third overlapping portion and the fourth overlapping portion are symmetric about the anode pair 1755 along the bisector in the second direction, to further improve the flatness of the second anode 1752 and the third anode 1753 of the anode pair 1755.

In some examples, as illustrated by FIG. 7, the orthographic projection of the fourth conductive portion 1624 on the base substrate 110 runs through a center of the orthographic projection of the fourth anode 1754 on the base substrate 110, and the orthographic projection of the fourth conductive portion 1624 on the base substrate 110 along the bisector in the second direction is overlapped with the orthographic projection of the effective light emitting region of the fourth light emitting element 314 on the base substrate 110 along the bisector in the second direction. In this way, the flatness of the fourth anode 1754 can also be improved.

In some examples, as illustrated by FIG. 7, the second conductive layer 160 further includes a fifth conductive portion 1625 and a sixth conductive portion 1626 that extend along the first direction. The fifth conductive portion 1625 is separately connected to the second conductive portion 1622 and the third conductive portion 1623, and is located between the second anode 1752 and the third anode 1753. The sixth conductive portion 1626 is separately connected to the third conductive portion 1623 and the fourth conductive portion 1624, and is located between the first anode 1751 and the fourth anode 1754 that are adjacent in the second direction. Therefore, the foregoing first conductive portion 1621, second conductive portion 1622, third conductive portion 1623, fourth conductive portion 1624, fifth conductive portion 1625, and sixth conductive portion 1626 may form a reticular structure, to further reduce the resistance of the power line in the first conductive layer, and further improve the electric performance of the display substrate.

In some examples, as illustrated by FIG. 7, the second conductive portion 1622 includes a body portion 1622A, a heel block 1622B, and a connection block 1622C that extend along the second direction. The heel block 1622B is located on a side of the body portion 1622A close to the first anode 1751, and is spaced from the body portion 1622A. The heel block 1622B is connected to the body portion 1622A through the connection block 1622C. Because usually, the size of the first anode in the first direction (that is, the width) is relatively small, and the distance between body portions of the first conductive portion and the second conductive portion is relatively large, the symmetry of the first conductive portion and the second conductive portion on both sides of the first anode can be improved by disposing the foregoing heel block, thereby improving the flatness of the first anode.

In some examples, the first light emitting element is configured to emit light of a first color; the second light emitting element and the third light emitting element are configured to emit light of a second color; and the fourth light emitting element is configured to emit light of a third color.

For example, the first color is red (R), the second color is green (G), and the third color is blue (B). That is, the display substrate uses a pixel arrangement structure of GGRB.

Figure 8:
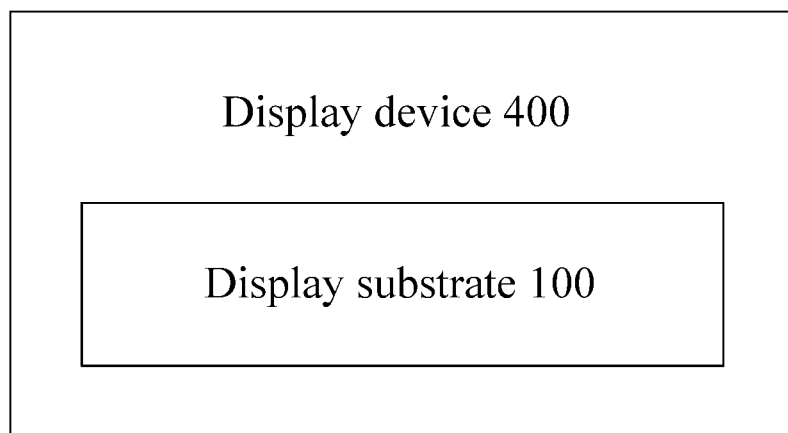
FIG. 8 is a schematic diagram of a display device according to an embodiment of the present disclosure.

An embodiment of the present disclosure provides a display device. FIG. 8 is a schematic diagram of a display device according to an embodiment of the present disclosure. As illustrated by FIG. 8, the display device 400 includes any foregoing display substrate 100. Therefore, the display device includes beneficial effects corresponding to the beneficial effects of the display substrate. For example, in the display device, the flatness of the first anode located in the effective light emitting region of the first light emitting element can be ensured, thereby avoiding the phenomenon of color cast; the resistance between the fourth anode located in the effective light emitting region of the fourth light emitting element and the fourth connection electrode can be reduced, and the distance between the first anode and the fourth anode can be increased, to avoid short-circuiting between the first anode and the fourth anode due to residues left in the manufacturing process.

For example, the display device may be a display panel, or an electronic product that includes a display function, such as a TV, a computer, a notebook computer, a tablet computer, a mobile phone, a navigator, or an electronic photo frame.

On the other hand, the inventor of this application finds that, because the thickness of the second source-drain metal layer below the anode is relatively large and distribution of the thickness is uneven, the second source-drain metal layer also causes the anode to be uneven.

Figure 9:
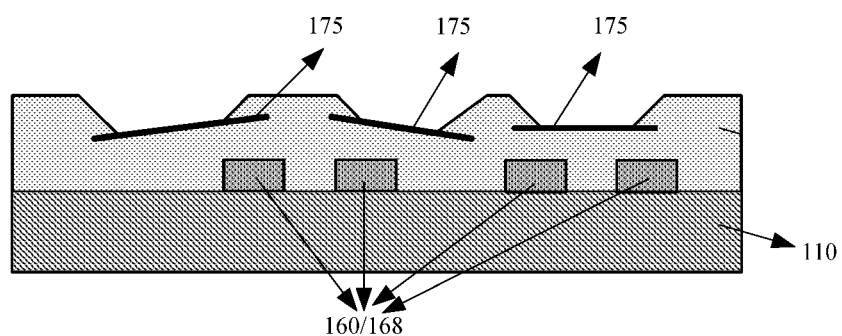
FIG. 9 is a schematic partial section view of another display substrate.
Figure 10:
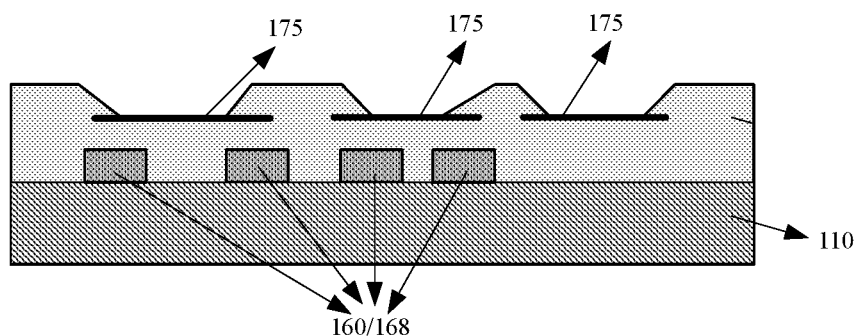
FIG. 10 is a schematic partial section view of another display substrate.

FIG. 9 is a partial schematic cross-sectional view of another display substrate. FIG. 10 is a partial schematic cross-sectional view of another display substrate. As illustrated by FIG. 9, the second source-drain metal layer 160 includes a plurality of wires 168. If a wire 168 exists on one side below the anode 175, and there is no wire 168 on the other side, a difference between heights of the two sides of the anode 175 occurs. Consequently, the anode 175 includes a phenomenon of "inclination", which further leads to a phenomenon of color cast. As illustrated by FIG. 10, if wires 168 exist on both sides of the anode 175, or a wire 168 is not disposed below the anode 175, the anode 175 can ensure relatively high flatness, to ensure that the light emitting intensities of the anode 175 in different directions are consistent, thereby effectively improving the phenomenon of color cast.

Regarding this, the embodiments of the present disclosure provide a display substrate and a display device. The display substrate includes a base substrate, a first conductive layer, a first planarization layer, a second conductive layer, a second planarization layer, and a plurality of light emitting element groups. The first conductive layer is located on the base substrate. The first planarization layer is located on a side of the first conductive layer away from the base substrate. The second conductive layer is located on a side of the first planarization layer away from the first conductive layer. The second planarization layer is located on a side of the second conductive layer away from the first planarization layer. The plurality of light emitting element groups are located on a side of the second planarization layer away from the second conductive layer. The plurality of light emitting element groups are arranged along a first direction to form a plurality of light emitting element columns, and are arranged along a second direction to form a plurality of light emitting element rows. Each of the light emitting element groups includes a first light emitting element, a second light emitting element, a third light emitting element, and a fourth light emitting element. The first light emitting element includes a first anode. The second conductive layer includes a first conductive portion and a second conductive portion that extend along the second direction. The first conductive portion is located on a side of the first anode. The second conductive portion is located on a side of the first anode away from the first conductive portion. The first conductive portion includes an extension portion and an offset portion. The orthographic projection of the effective light emitting region of the first light emitting element on a straight line extending along the second direction is covered by the orthographic projection of the offset portion on the straight line. The orthographic projection of the offset portion on the base substrate is spaced from the orthographic projection of the first anode on the base substrate. A straight line on which an edge of the extension portion that is close to the second conductive portion and that extends along the second direction is located is a first straight line. The offset portion is spaced from the first straight line and is located on a side of the first straight line away from the second conductive portion. Therefore, because the first conductive portion is located on a side of the first anode, the second conductive portion is located on a side of the first anode away from the first conductive portion, and the orthographic projection of the offset portion on the base substrate is spaced from the orthographic projection of the first anode on the base substrate, the first conductive portion and the second conductive portion in the second conductive layer have relatively small impact on the flatness of the first anode, so that the first anode can ensure relatively high flatness, to ensure that light emitting intensities of the first anode in different directions are consistent, thereby effectively improving the phenomenon of color cast.

The display substrate and the display device that are provided in the embodiments of the present disclosure are described in detail below with reference to the accompanying drawings.

Figure 11:
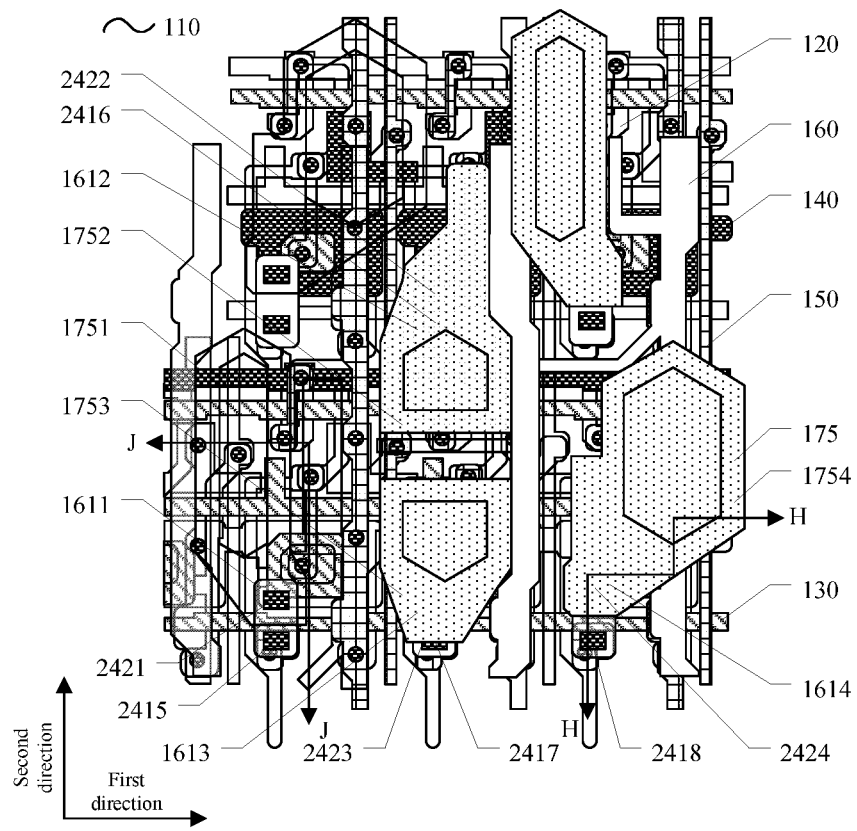
FIG. 11 is a schematic plan view of another display substrate according to an embodiment of the present disclosure.
Figure 12A:
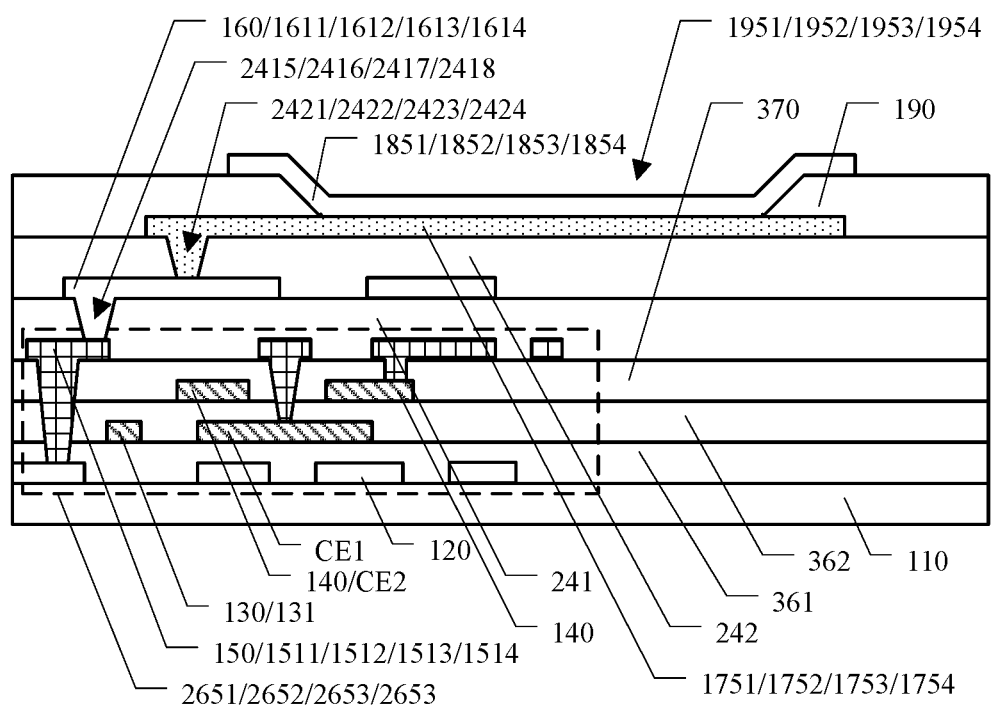
FIG. 12A is a schematic section view of a display substrate according to an embodiment of the present disclosure along the HH direction in FIG. 11.
Figure 13:
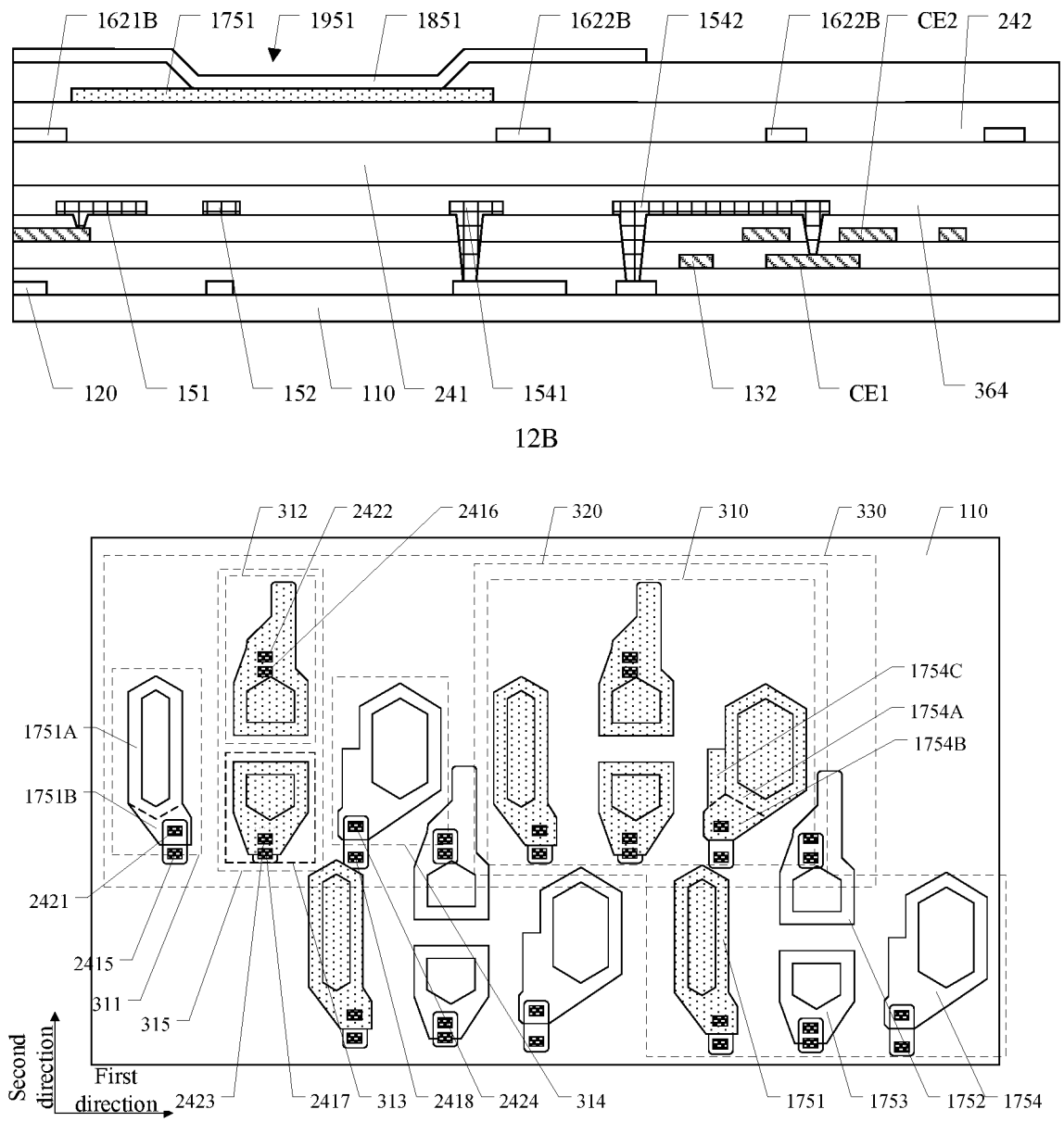
FIG. 13 is a schematic plan view of another display substrate according to an embodiment of the present disclosure.
Figure 14:
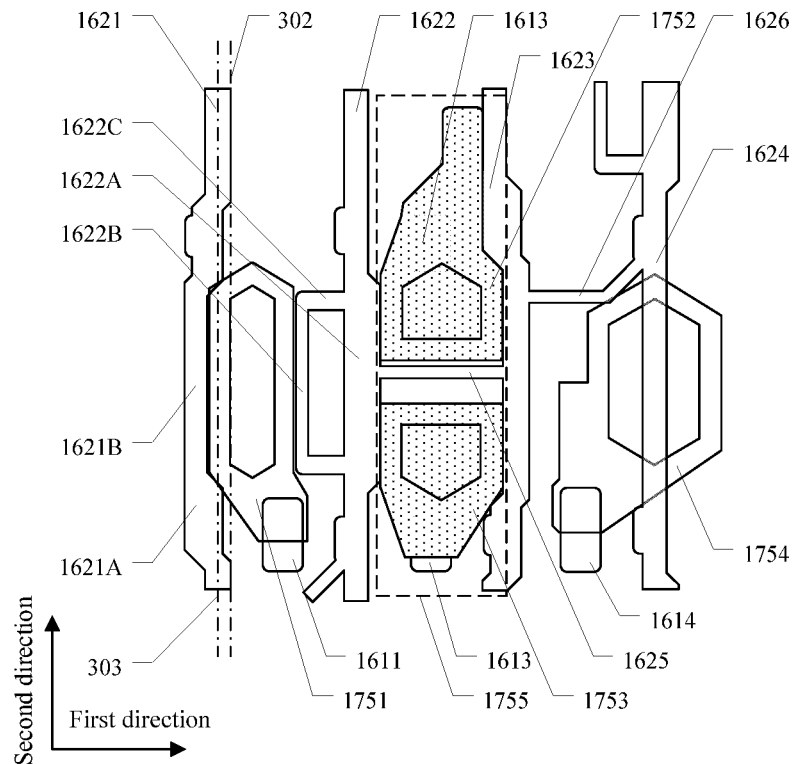
FIG. 14 is a schematic plan view of another display substrate according to an embodiment of the present disclosure.

An embodiment of the present disclosure provides a display substrate. FIG. 11 is a schematic planar diagram of another display substrate according to an embodiment of the present disclosure. FIG. 12A is a schematic cross-sectional view of a display substrate according to an embodiment of the present disclosure along an HH direction in FIG. 11. FIG. 12B is a schematic cross-sectional view of a display substrate according to an embodiment of the present disclosure along a JJ direction in FIG. 11. FIG. 13 is a schematic planar diagram of another display substrate according to an embodiment of the present disclosure. FIG. 14 is a schematic planar diagram of another display substrate according to an embodiment of the present disclosure. To clearly show the location relationship between the conductive portions in the second conductive layer and anodes, FIG. 14 shows only the second conductive layer and an anode layer.

As illustrated by FIG. 11 to FIG. 14, the display substrate 100 includes a base substrate 110, a first conductive layer 150, a first planarization layer 241, a second conductive layer 160, a second planarization layer 242, and a plurality of light emitting element groups 310. The second conductive layer 160 is located on the base substrate 110. The second planarization layer 242 is located on a side of the second conductive layer 160 away from the base substrate 110. The plurality of light emitting element groups 310 are located on a side of the second planarization layer 242 away from the base substrate 110. The plurality of light emitting element groups 310 are arranged along a first direction to form a plurality of light emitting element columns 320, and are arranged along a second direction to form a plurality of light emitting element rows 330. Each of the light emitting element groups 310 includes a first light emitting element 311, a second light emitting element 312, a third light emitting element 313, and a fourth light emitting element 314. The first light emitting element 311 includes a first anode 1751. The second light emitting element 312 includes a second anode 1752. The third light emitting element 313 includes a third anode 1753. The fourth light emitting element 314 includes a fourth anode 1754. The second anode 1752 and the third anode 1753 are arranged along the second direction to form an anode pair 1755. The first anode 1751, the anode pair 1755, and the fourth anode 1754 are arranged along the first direction. The second conductive layer 160 includes a first conductive portion 1621 and a second conductive portion 1622 that extend along the second direction. The first conductive portion 1621 is located on a side of the first anode 1751 away from the anode pair 1755. The second conductive portion 1622 is located between the first anode 1751 and the anode pair 1755, that is, a side of the first anode 1751 away from the first conductive portion 1621. The first conductive portion 1621 includes an extension portion 1621A and an offset portion 1621B. The orthographic projection of the effective light emitting region of the first light emitting element 311 on a straight line that extends along the second direction is covered by the orthographic projection of the offset portion 1621B on the straight line. That is, the orthographic projection of the effective light emitting region of the first light emitting element 311 on the first conductive portion 1621 is located at the location of the offset portion 1621B. That is, the offset portion 1621B corresponds to the effective light emitting region of the first light emitting element 311. The orthographic projection of the offset portion 1621B on the base substrate 110 is spaced from the orthographic projection of the first anode 1751 on the base substrate 110. A straight line on which an edge of the extension portion 1621A that is close to the second conductive portion 1622 and that extends along the second direction is located is a first straight line 302. The offset portion 1621B is spaced from the first straight line 302, and is located on a side of the first straight line 302 away from the second conductive portion 1622. It should be noted that, the foregoing first conductive layer and second conductive layer are sequentially stacked along a direction away from the base substrate.

In the display substrate provided in this embodiment of the present disclosure, because the first conductive portion is located on a side of the first anode, the second conductive portion is located on a side of the first anode away from the first conductive portion, and the orthographic projection of the offset portion on the base substrate is spaced from the orthographic projection of the first anode on the base substrate, the first conductive portion and the second conductive portion in the second conductive layer have relatively small impact on the flatness of the first anode, so that the first anode can ensure relatively high flatness, to ensure that light emitting intensities of the first anode in different directions are consistent, thereby effectively improving the phenomenon of color cast. In addition, because the offset portion is spaced from the first straight line and is located on a side of the first straight line away from the second conductive portion, the offset portion is offset away from the first anode, to provide space for disposing the first anode, so that relatively high flatness of the first anode can be ensured while dense arrangement of anodes is implemented.

It should be noted that, for the arrangement manner of the plurality of light emitting elements, reference may be made to the arrangement manner shown in FIG. 6, that is, two adjacent light emitting element rows are offset from each other by ½ pitch. The foregoing pitch is equal to a distance between centers of effective light emitting regions of two first light emitting elements in two light emitting element groups that are adjacent in the first direction.

In some examples, the first light emitting element 311 is configured to emit light of a first color; the second light emitting element 312 and the third light emitting element 313 are configured to emit light of a second color; and the fourth light emitting element 314 is configured to emit light of a third color.

In some examples, the first color is red, the second color is green, and the third color is blue.

In some examples, as illustrated by FIG. 11 to FIG. 14, the orthographic projection of the first straight line 302 on the base substrate 110 runs through the orthographic projection of the first anode 1751 on the base substrate 110. Therefore, in the display substrate, relatively high flatness of the first anode can be ensured while dense arrangement of anodes is implemented.

In some examples, as illustrated by FIG. 11 to FIG. 14, a straight line on which a bisector that is of the extension portion 1621A and that extends along the second direction is located is a second straight lines 303. The offset portion 1621B is spaced from the second straight line 303, and is located on a side of the second straight line 303 away from the second conductive portion 1622. Therefore, because the offset portion is spaced from the second straight line and is located on a side of the second straight line away from the anode pair, the offset portion is offset away from the first anode, to provide space for disposing the first anode, so that relatively high flatness of the first anode can be ensured while dense arrangement of anodes is implemented.

In some examples, as illustrated by FIG. 11 to FIG. 14, the orthographic projection of the second straight line 303 on the base substrate 110 runs through the orthographic projection of the first anode 1751 on the base substrate 110. Therefore, in the display substrate, relatively high flatness of the first anode can be ensured while dense arrangement of anodes is implemented.

In some examples, as illustrated by FIG. 11 to FIG. 14, the first anode 1751 extends along the second direction, the second conductive portion 1622 includes a body portion 1622A and a heel block 1622B that extend along the second direction, the orthographic projection of the body portion 1622A on the base substrate 110 is spaced from the orthographic projection of the first anode 1751 on the base substrate 110, the heel block 1622B is located on a side of the body portion 1622A close to the first anode 1751, a distance between the orthographic projection of the heel block 1622B on the base substrate 110 and the orthographic projection of a center of the effective light emitting region of the first light emitting element 311 on the base substrate 110 is approximately equal to a distance between the orthographic projection of the first conductive portion 1621 on the base substrate 110 and the orthographic projection of the center of the effective light emitting region of the first light emitting element 311 on the base substrate 110.

In the display substrate, because usually, the size of the first anode in the first direction (that is, the width) is relatively small, the distance between body portions of the first conductive portion and the second conductive portion is relatively large. Because the distance between the orthographic projection of the heel block on the base substrate and the orthographic projection of the center of the effective light emitting region of the first light emitting element on the base substrate is approximately equal to a distance between the orthographic projection of the first conductive portion on the base substrate and the orthographic projection of the center of the effective light emitting region of the first light emitting element on the base substrate, the symmetry of the first conductive portion and the second conductive portion on both sides of the first anode can be improved by disposing the foregoing heel block, thereby improving the flatness of the first anode.

In some examples, as illustrated by FIG. 11 to FIG. 14, the distance between the orthographic projection of the first conductive portion 1621 on the base substrate 110 and the orthographic projection of the center of the effective light emitting region of the first light emitting element 311 on the base substrate 110 is less than a distance between the orthographic projection of the body portion 1622A on the base substrate 110 and the orthographic projection of the center of the effective light emitting region of the first light emitting element 311 on the base substrate 110.

For example, a ratio of the distance between the orthographic projection of the first conductive portion 1621 on the base substrate 110 and the orthographic projection of the center of the effective light emitting region of the first light emitting element 311 on the base substrate 110 to the distance between the orthographic projection of the body portion 1622A on the base substrate 110 and the orthographic projection of the center of the effective light emitting region of the first light emitting element 311 on the base substrate 110 is less than or equal to ⅓.

In some examples, as illustrated by FIG. 11 to FIG. 14, the orthographic projection of the heel block 1622B on the base substrate 110 is spaced from the orthographic projection of the body portion 1622A on the base substrate 110. The second conductive portion 1622 further includes a conductive portion 1622C. The heel block 1622B is connected to the body portion 1622A through the conductive portion 1622C. Therefore, because the heel block 1622B is connected to the body portion 1622A through the connection portion 1622C, and is not integrally formed with the body portion 1622A, the second conductive portion 1622 can be prevented from overlapping too much with a film below, such as a semiconductor layer or a gate electrode layer, thereby preventing increasing the load of the film below the second conductive portion 1622. Therefore, in the display substrate, normal work of the sub-pixels can be ensured while a heel block is added.

For example, as illustrated by FIG. 12B, the first conductive layer 150 includes a power line 151, a data line 152, a first connection block 1541, and a second connection block 1542 that extend along the second direction. The first connection block 1541 is configured to connect an initialization signal line to a corresponding source region in a pixel driving circuit. The second connection block 1542 is configured to connect a drain region of a compensating thin film transistor to a first electrode block CE1. The first electrode block CE1 may form a storage capacitor with a second electrode block CE2, and is also used as a gate electrode of a drive thin film transistor. Therefore, because the heel block 1622B is connected to the body portion 1622A through the connection portion 1622C and is not integrally formed with the body portion 1622A, the second conductive portion 1622 can be prevented from overlapping too much with the second connection block 1542, to reduce the load of the second connection block 1542, that is, the load of the drain electrode of the compensating thin film transistor and the load of the gate electrode of the drive thin film transistor, to further improve the performance of the display substrate. It should be noted that, the display substrate uses a 7T1C pixel driving circuit. Certainly, this embodiment of the present disclosure includes but is not limited thereto. The display substrate may use another proper pixel driving circuit structure.

For example, as illustrated by FIG. 12B, the orthographic projection of the offset portion 1621B on the base substrate 110 is spaced from the orthographic projection of the first anode 1751 on the base substrate, and the orthographic projection of the heel block 1622B on the base substrate 110 is spaced from the orthographic projection of the first anode 1751 on the base substrate 110. For example, as illustrated by FIG. 12B, the display substrate may further include a passivation layer 364, located between the first conductive layer 150 and the first planarization layer 241. Certainly, this embodiment of the present disclosure includes but is not limited thereto. Alternatively, a passivation layer may not be disposed on the display substrate.

In some examples, as illustrated by FIG. 11 to FIG. 14, the distance between the orthographic projection of the heel block 1622B on the base substrate 110 and the orthographic projection of the body portion 1622A on the base substrate 110 is greater than a width of the orthographic projection of the heel block 1622B on the base substrate 110 along the first direction. Therefore, in the display substrate, the second conductive portion 1622 can be further prevented from overlapping too much with a film below, such as a semiconductor layer or a gate electrode layer, thereby preventing increasing the load of the film such as the semiconductor layer or the gate electrode layer. Therefore, in the display substrate, normal work of the sub-pixels can be ensured while a heel block is added.

In some examples, as illustrated by FIG. 11 to FIG. 14, the second conductive portion 1622 includes two connection portions 1622C. The two connection portions 1622C are respectively located on two ends of the heel block 1622B in the second direction. The heel block 1622B, the two connection portions 1622C, and the body portion 1622A enclose a rectangular opening. Therefore, in the display substrate, the second conductive portion 1622 can be further prevented from overlapping too much with a film below, such as a semiconductor layer or a gate electrode layer, thereby preventing increasing the load of the film such as the semiconductor layer or the gate electrode layer. Therefore, in the display substrate, normal work of the sub-pixels can be ensured while a heel block is added.

In some examples, a ratio of the width of the heel block in the first direction to the width of the body portion in the first direction is less than or equal to ½, and a ratio of the width of the heel block in the first direction to the distance between the body portion and the heel block is less than or equal to ½.

In some examples, a ratio of the length of the heel block in the second direction to the length of the effective light emitting region of the first light emitting element in the second direction is greater than or equal to ⅞.

In some examples, an angle between the first direction and a line connecting centers of the effective light emitting region of the first light emitting element and the heel block is less than 30 degrees. For example, the angle between the first direction and the line connecting the centers of the effective light emitting region of the first light emitting element and the heel block is zero. That is, the line connecting the centers of the effective light emitting region of the first light emitting element and the heel block is parallel to the first direction.

In some examples, the orthographic projection of the heel block on the base substrate is spaced from the orthographic projection of the first anode on the base substrate, and the orthographic projection of the first conductive portion on the base substrate is spaced from the orthographic projection of the first anode on the base substrate.

In some examples, an area in which the orthographic projection of the heel block on the base substrate is overlapped with the orthographic projection of the first anode on the base substrate is approximately equal to an area in which the orthographic projection of the first conductive portion on the base substrate is overlapped with the orthographic projection of the first anode on the base substrate. In some examples, as illustrated by FIG. 11 to FIG. 14, the second conductive layer 160 further includes a third conductive portion 1623 and a fourth conductive portion 1624 that extend along the second direction. The third conductive portion 1623 is located between the anode pair 1755 and the fourth anode 1754. The fourth conductive portion 1624 is overlapped with the fourth anode 1754.

In some examples, as illustrated by FIG. 11 to FIG. 14, the distance between the orthographic projection of the body portion 1622A of the second conductive portion 1622 on the base substrate 110 and the orthographic projection of the effective light emitting region of the second light emitting element 312 on the base substrate 110 along the bisector in the second direction is approximately equal to the distance between the orthographic projection of the third conductive portion 1623 on the base substrate 110 and the orthographic projection of the effective light emitting region of the second light emitting element 312 on the base substrate 110 along the bisector in the second direction. Therefore, the display substrate can improve the symmetry of the second conductive portion and the third conductive portion on two sides of the anode pair, thereby improving the flatness of the second and the third anode.

In some examples, as illustrated by FIG. 11 to FIG. 14, the fourth anode 1754 extends along the second direction, and the orthographic projection of the fourth conductive portion 1624 on the base substrate 110 runs through a center of the orthographic projection of the effective light emitting region of the fourth light emitting element 314 on the base substrate 110. Therefore, although the fourth conductive portion 1624 is overlapped with the fourth anode 1754, because the orthographic projection of the fourth conductive portion 1624 on the base substrate 110 runs through the center of the orthographic projection of the effective light emitting region of the fourth light emitting element 314 on the base substrate 110, the fourth conductive portion can ensure that the fourth anode includes relatively high flatness, to ensure that light emitting intensities of the fourth anode in different directions are consistent, thereby effectively improving the phenomenon of color cast.

In some examples, as illustrated by FIG. 11 to FIG. 14, the second conductive layer 160 further includes a fifth conductive portion 1625 and a sixth conductive portion 1626 that extend along the first direction. The fifth conductive portion 1625 is separately connected to the body portion 1622A and the third conductive portion 1623, and is located between the second anode 1752 and the third anode 1753 in the anode pair 1755. The sixth conductive portion 1626 is separately connected to the third conductive portion 1623 and the fourth conductive portion 1624, and is located between the first anode 1751 and the fourth anode 1754 that are adjacent in the second direction. Therefore, the foregoing first conductive portion 1621, second conductive portion 1622, third conductive portion 1623, fourth conductive portion 1624, fifth conductive portion 1625, and sixth conductive portion 1626 may form a reticular structure, to further reduce the resistance of the power line in the first conductive layer, and further improve the electric performance of the display substrate.

In some examples, as illustrated by FIG. 11 to FIG. 14, the second conductive layer 160 includes a first connection electrode 1611, a second connection electrode 1612, a third connection electrode 1613, and a fourth connection electrode 1614. The second planarization layer 242 includes a first via hole 2421, a second via hole 2422, a third via hole 2423, and a fourth via hole 2424. The first anode 1751 is connected to the first connection electrode 1611 through the first via hole 2421. The second anode 1752 is connected to the second connection electrode 1612 through the second via hole 2422. The third anode 1753 is connected to the third connection electrode 1613 through the third via hole 2423. The fourth anode 1754 is connected to the fourth connection electrode 1614 through the fourth via hole 2424.

In some examples, as illustrated by FIG. 11 to FIG. 14, the first planarization layer 241 is located on a side of the second conductive layer 160 close to the base substrate 110, and the first conductive layer 150 is located on a side of the first planarization layer 241 close to the base substrate 110. The first conductive layer 150 includes a first drain electrode 1511, a second drain electrode 1512, a third drain electrode 1513, and a fourth drain electrode 1514. The first planarization layer 241 includes a fifth via hole 2415, a sixth via hole 2416, a seventh via hole 2417, and an eighth via hole 2418. The first connection electrode 1611 is connected to the first drain electrode 1511 through the fifth via hole 2415. The second connection electrode 1612 is connected to the second drain electrode 1512 through the sixth via hole 2416. The third connection electrode 1613 is connected to the third drain electrode 1513 through the seventh via hole 2417. The fourth connection electrode 1614 is connected to the fourth drain electrode 1514 through the eighth via hole 2418.

In some examples, as illustrated by FIG. 11 to FIG. 14, the display substrate 100 further includes a first pixel driving circuit 2651, a second pixel driving circuit 2652, a third pixel driving circuit 2653, and a fourth pixel driving circuit 2654. The first drain electrode 1511 is a part of the first pixel driving circuit 2651. The second drain electrode 1512 is a part of the second pixel driving circuit 2652. The third drain electrode 1513 is a part of the third pixel driving circuit 2653. The fourth drain electrode 1514 is a part of the fourth pixel driving circuit 2654. The first pixel driving circuit 2651 is connected to the first anode 1751 through the first connection electrode 1611, to apply a drive signal to the first anode 1751. The second pixel driving circuit 2652 is connected to the second anode 1752 through the second connection electrode 1612, to apply a drive signal to the second anode 1752. The third pixel driving circuit 2653 is connected to the third anode 1753 through the third connection electrode 1613, to apply a drive signal to the third anode 1753. The fourth pixel driving circuit 2654 is connected to the fourth anode 1754 through the fourth connection electrode 1614, to apply a drive signal to the fourth anode 1754.

For example, the thickness of the second conductive layer may range from 0.6 microns to 0.8 microns, such as 0.7 microns, and the thickness of the second planarization layer may range from 1.3 microns to 1.7 microns, such as 1.5 microns.

Figure 15:
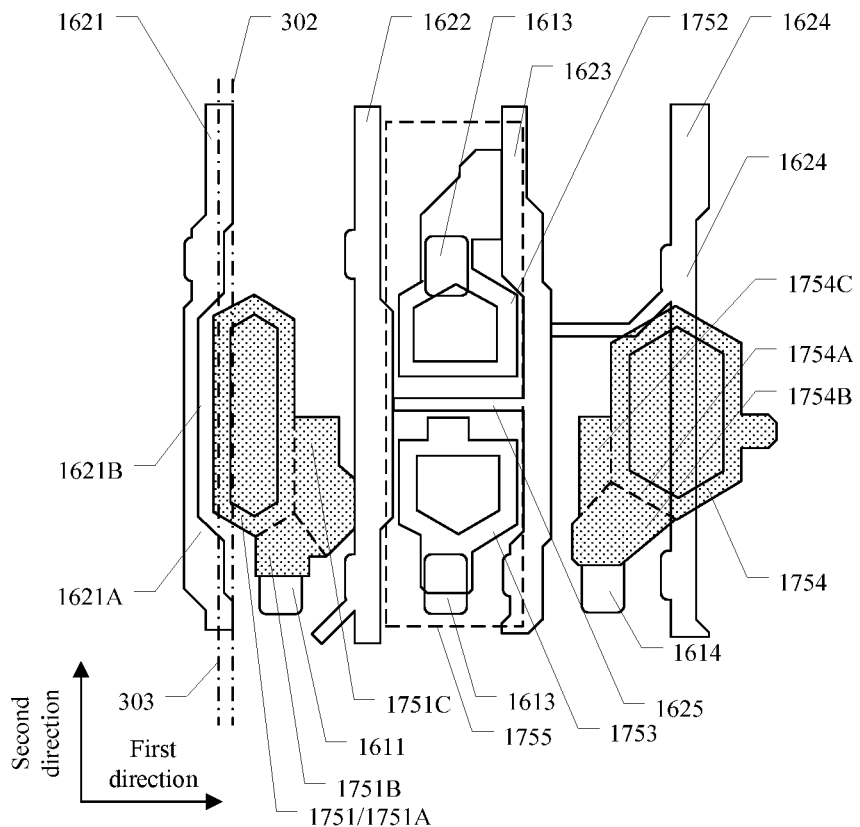
FIG. 15 is a schematic plan view of another display substrate according to an embodiment of the present disclosure.

FIG. 15 is a schematic planar diagram of another display substrate according to an embodiment of the present disclosure. To clearly show the location relationship between the conductive portions in the second conductive layer and anodes, FIG. 15 shows only the second conductive layer and an anode layer. As illustrated by FIG. 15, the second conductive portion 1622 of the second conductive layer 160 is not provided with a heel block. The first conductive portion 1621 of the second conductive layer 160 includes an extension portion 1621A and an offset portion 1621B. The orthographic projection of the effective light emitting region of the first light emitting element 311 on the first conductive portion 1621 is located at the location of the offset portion 1621B. That is, the offset portion 1621B corresponds to the effective light emitting region of the first light emitting element 311. The orthographic projection of the offset portion 1621B on the base substrate 110 is spaced from the orthographic projection of the first anode 1751 on the base substrate 110. A straight line on which an edge of the extension portion 1621A that is close to the first anode 1751 and that extends along the second direction is located is a first straight line 302. The offset portion 1621B is spaced from the first straight line 302, and is located on a side of the first straight line 302 away from the anode pair 1755.

In the display substrate provided in this embodiment of the present disclosure, because the first conductive portion is located on a side of the first anode away from the anode pair, the second conductive portion is located between the first anode and the anode pair, and the orthographic projection of the offset portion on the base substrate is spaced from the orthographic projection of the first anode on the base substrate, the first conductive portion and the second conductive portion in the second conductive layer have relatively small impact on the flatness of the first anode, so that the first anode can ensure relatively high flatness, to ensure that light emitting intensities of the first anode in different directions are consistent, thereby effectively improving the phenomenon of color cast. In addition, because the offset portion is spaced from the first straight line and is located on a side of the first straight line away from the anode pair, the offset portion is offset away from the first anode, to provide space for disposing the first anode, so that relatively high flatness of the first anode can be ensured while dense arrangement of anodes is implemented.

For example, as illustrated by FIG. 15, the first anode 1751 may include a body portion 1751A, a connection portion 1751B, and a supplementing portion 1751C. The effective light emitting region of the first light emitting element falls into the body portion 1751A. The connection portion 1751B is configured to connect the first anode 1751 to a corresponding one of the plurality of pixel driving circuits. The supplementing portion 1751C can cover electric potentials on a gate electrode G1 in a drive thin film transistor T1 and a drain D3 of a compensating thin film transistor T3 in the corresponding one of the pixel driving circuits, to stabilize the electric potentials on the gate electrode G1 of the drive thin film transistor T1 and the drain D3 of the compensating thin film transistor T3, thereby improving the long-term light emission stability and the service life of the display substrate.

For example, as illustrated by FIG. 15, a distance between the first anode 1751 and the offset portion 1621B may range from 2.5 microns to 3.2 microns, such as 2.9 microns. A distance between the body portion 1751A of the first anode 1751 and the second conductive portion 1622 may range from 9 microns to 11 microns, such as 10.5 microns. A distance between the connection portion 1751B of the first anode 1751 and the second conductive portion 1622 may range from 5 microns to 7 microns. The supplementing portion 1751C of the first anode 1751 may be partially overlapped with the second conductive portion 1622, and the width of the overlapping portion in the first direction is less than 1 micron, such as 0.79 microns. Because an edge of the supplementing portion close to the second conductive portion is relatively far away from the body portion, partial overlapping between the supplementing portion 1751C and the second conductive portion 1622 includes relatively small impact on the flatness of the first anode.

Figure 16:
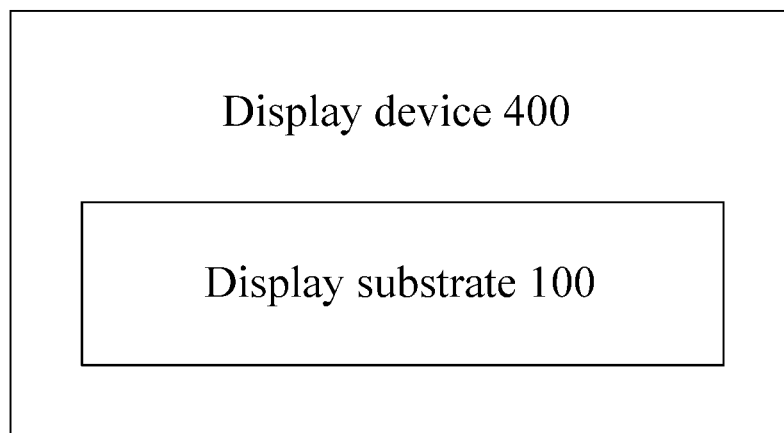
FIG. 16 is a schematic diagram of a display device according to an embodiment of the present disclosure.

An embodiment of the present disclosure provides a display device. FIG. 16 is a schematic diagram of a display device according to an embodiment of the present disclosure. As illustrated by FIG. 16, the display device 400 includes any foregoing display substrate 100. Therefore, the display device includes beneficial effects corresponding to the beneficial effects of the display substrate. For example, in the display device, the flatness of the first anode located in the effective light emitting region of the first light emitting element can be ensured, thereby avoiding the phenomenon of color cast; the resistance between the fourth anode located in the effective light emitting region of the fourth light emitting element and the fourth connection electrode can be reduced, and the distance between the first anode and the fourth anode can be increased, to avoid short-circuiting between the first anode and the fourth anode due to residues left in the manufacturing process.

For example, the display device may be an electronic product that includes a display function, such as a TV, a computer, a notebook computer, a tablet computer, a mobile phone, a navigator, or an electronic photo frame.

In the process of manufacturing an OLED display device, an evaporation process is usually adopted to manufacture an organic material layer. In addition, to prevent the FMM from touching and damaging an OLED display substrate in the evaporation process, a spacer usually needs to be formed on the OLED display substrate, and the FMM is placed on the spacer. In this case, the spacer can support the FMM, so as to protect the OLED display substrate.

Figure 17:
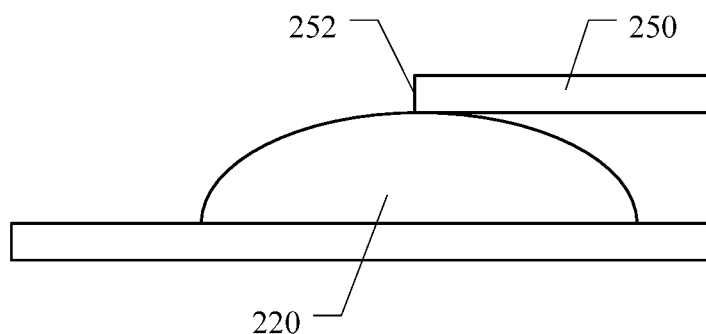
FIG. 17 is a schematic diagram of a vapor deposition process using a fine metal mask plate.

However, in the research, the inventor of this application notices that, usually, the spacer is located at an intermediate location of a straight edge of an effective light emitting region of a sub-pixel; when the evaporation process is performed by using the FMM, an opening edge of the FMM is located at an intermediate location of the spacer; the intermediate location of the spacer is usually a location at which the thickness of the spacer is the largest (namely, a top end of the spacer) due to the preparation process thereof and other reasons, and the opening edge of the FMM exactly comes into contact with the top end of the spacer, and consequently easily scratches the spacer and foreign bodies such as particles are generated. FIG. 17 is a schematic diagram of an evaporation process by using an FMM. As illustrated by FIG. 17, an opening edge 252 of an FMM 250 is located on a top end of a spacer 220, and easily scratches the top end of the spacer 200, and foreign bodies such as particles are generated. After an evaporation process, a film such as a packaging layer is formed on a display substrate, and the generated foreign bodies such as particles easily cause the packaging layer to be in an unfavorable condition, such as generate cracks, resulting in decrease in the stability and reliability of the product.

With regard to this, the embodiments of the present disclosure further provide a display substrate, a manufacturing method thereof and a display device. The display substrate includes a substrate, a light emitting layer and a spacer; the light emitting layer is located on the base substrate and includes a plurality of light emitting portions; the spacer is located at a side of the light emitting layer away from the base substrate; an orthographic projection of a top end of the spacer on the base substrate and an edge of an orthographic projection of the light emitting portion on the base substrate are arranged at intervals. Therefore, when the fine metal mask plate is used for vapor deposition process to form the light emitting portion, the orthographic projection of the opening edge of the fine metal mask plate on the base substrate and the orthographic projection of the top end of the spacer on the base substrate are arranged at intervals, so that the contact between the opening edge of the fine metal mask plate and the top end of the spacer can be avoided, and foreign matters such as particles can be avoided, thereby improving the yield of the display substrate.

Hereinafter, the display substrate, the manufacturing method thereof and the display device according to the embodiments of the present disclosure will be described in detail with reference to the drawings.

Figures 18, 19:
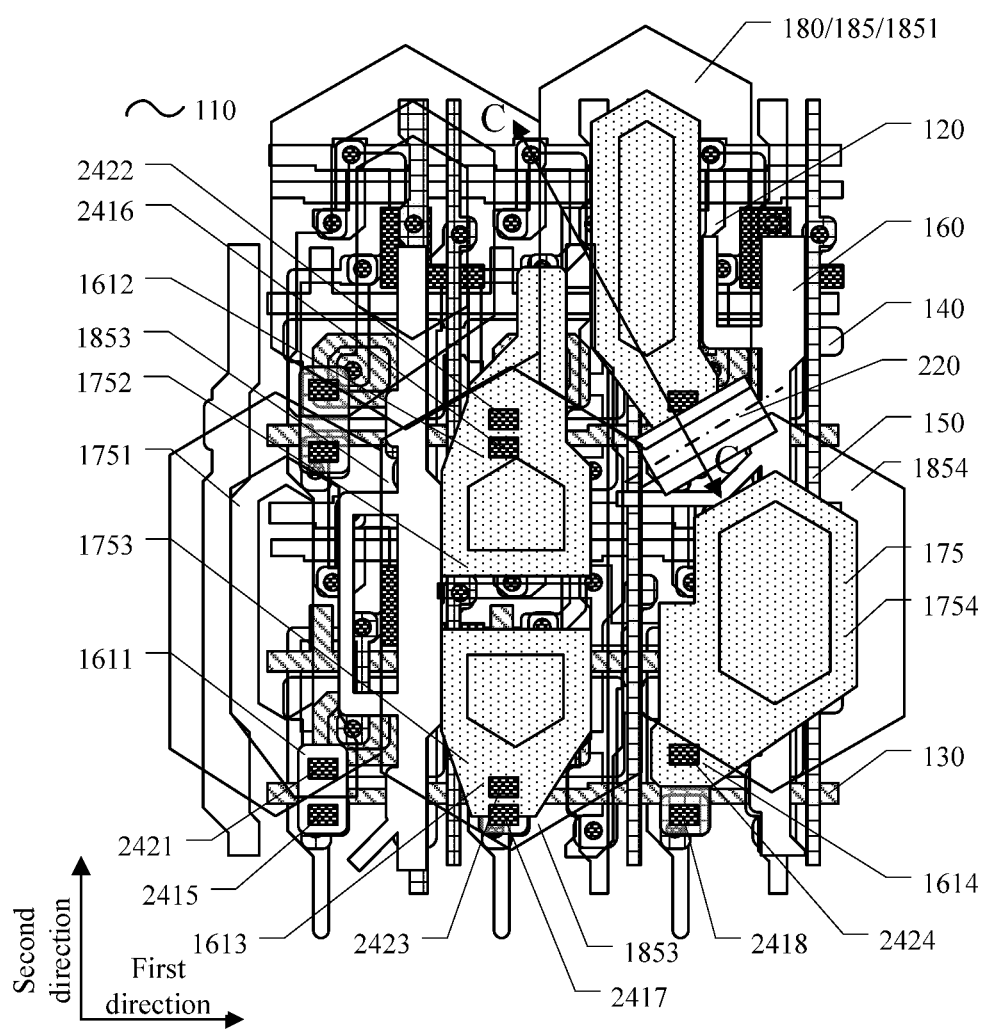
FIG. 18 is a schematic plan view of a display substrate according to an embodiment of the present disclosure.
FIG. 19 is a schematic section view of a display substrate according to an embodiment of the present disclosure along the CC direction in FIG. 18.

An embodiment of the present disclosure provides a display substrate. FIG. 18 is a schematic plan view of a display substrate according to an embodiment of the present disclosure; FIG. 19 is a schematic section view of a display substrate according to an embodiment of the present disclosure along the CC direction in FIG. 18.

As illustrated in FIGS. 18 and 19, the display substrate 100 includes a base substrate 110, a light emitting layer 180 and a spacer 220. The light emitting layer 180 is located on the base substrate 110 and includes a plurality of light emitting portions 185; the spacer 220 is located at the side of the base substrate 110 where the light emitting layer 180 is located. The orthographic projection of the top end 225 of the spacer 220 on the base substrate 110 and the edge of the orthographic projection of the light emitting portion 185 on the base substrate 110 are arranged at intervals. It should be noted that the top end of the spacer mentioned above refers to the part of the spacer away from the base substrate, that is, the part with greater thickness; in addition, the above-mentioned "arranged at intervals" means that the orthographic projection of the top end of the spacer away from the base substrate on the base substrate and the orthographic projection of the light emitting portion on the base substrate have a certain interval and do not overlap or contact each other.

In the manufacturing process of the display substrate according to the embodiment of the present disclosure, when the light emitting portion 185 is formed by vapor deposition using the fine metal mask plate 250, as illustrated in FIG. 19, the orthographic projection of the opening edge 252 of the fine metal mask plate 250 on the base substrate 110 is spaced from the orthographic projection of the top end 225 of the spacer 220 on the base substrate 110, therefore, the opening edge 252 of the fine metal mask plate 250 can be prevented from contacting the top end 225 of the spacer 220, and foreign matters such as particles can be avoided. For example, as illustrated in FIG. 19, the opening edge 252 of the fine metal mask plate 250 is located at the edge portion of the spacer 220, because the thickness of the edge portion of the spacer 220 is less than the thickness of the top end 225 of the spacer 220, the opening edge 252 of the fine metal mask plate 250 is in a suspended state and has no contact with the spacer 220, thus avoiding the generation of foreign matters such as particles due to scraping. Therefore, the display substrate can improve the stability and reliability of the display substrate and the yield of products.

In some examples, as illustrated in FIG. 19, the size of the middle portion of the spacer 220 in the direction perpendicular to the base substrate 110 is greater than the size of the edge portion of the spacer 220 in the direction perpendicular to the base substrate 110. That is, the thickness of the middle portion of the spacer 220 is greater than the thickness of the edge portion of the spacer 220. Therefore, when the orthographic projection of the opening edge of the fine metal mask plate on the base substrate and the orthographic projection of the middle portion of the spacer (i.e., the top end of the spacer) on the base substrate are arranged at intervals, the opening edge of the fine metal mask plate can be in a suspended state without contacting with the spacer, thereby avoiding the generation of foreign matters such as particles due to scraping.

For example, as illustrated in FIG. 19, the shape of a section of the spacer 220 cut by a plane perpendicular to the base substrate 110 can include a semicircle. Of course, embodiments of the present disclosure include but are not limited to this. For example, when the shape of the section of the spacer 220 is a semicircle, the slope angle of the semicircle ranges from 8 to 10 degrees.

In some examples, as illustrated in FIG. 18, the shape of the orthographic projection of the spacer 220 on the base substrate 110 is rectangular, and the orthographic projection of the central axis of the spacer 220 in the length direction on the base substrate 110 is spaced from the edge of the orthographic projection of the light emitting portion 185 on the base substrate 110. Therefore, the display substrate can avoid the contact between the opening edge of the fine metal mask plate and the top end of the spacer, and avoid the generation of foreign matters such as particles, thereby improving the stability and reliability of the display substrate and the yield of products. Of course, the shape of the orthographic projection of the spacer on the base substrate in the embodiment of the present disclosure includes but is not limited to the rectangle described above, and can also be other shapes.

In some examples, as illustrated in FIG. 18, the distance between the orthographic projection of the central axis of the spacer 220 in the length direction on the base substrate 110 and the edge of the orthographic projection of the light emitting portion 185 on the base substrate 110 is greater than 6 microns. Therefore, the display substrate can effectively avoid the contact between the opening edge of the fine metal mask plate and the top end of the spacer, and avoid the generation of foreign matters such as particles, thereby improving the stability and reliability of the display substrate and the yield of products.

Figure 20:
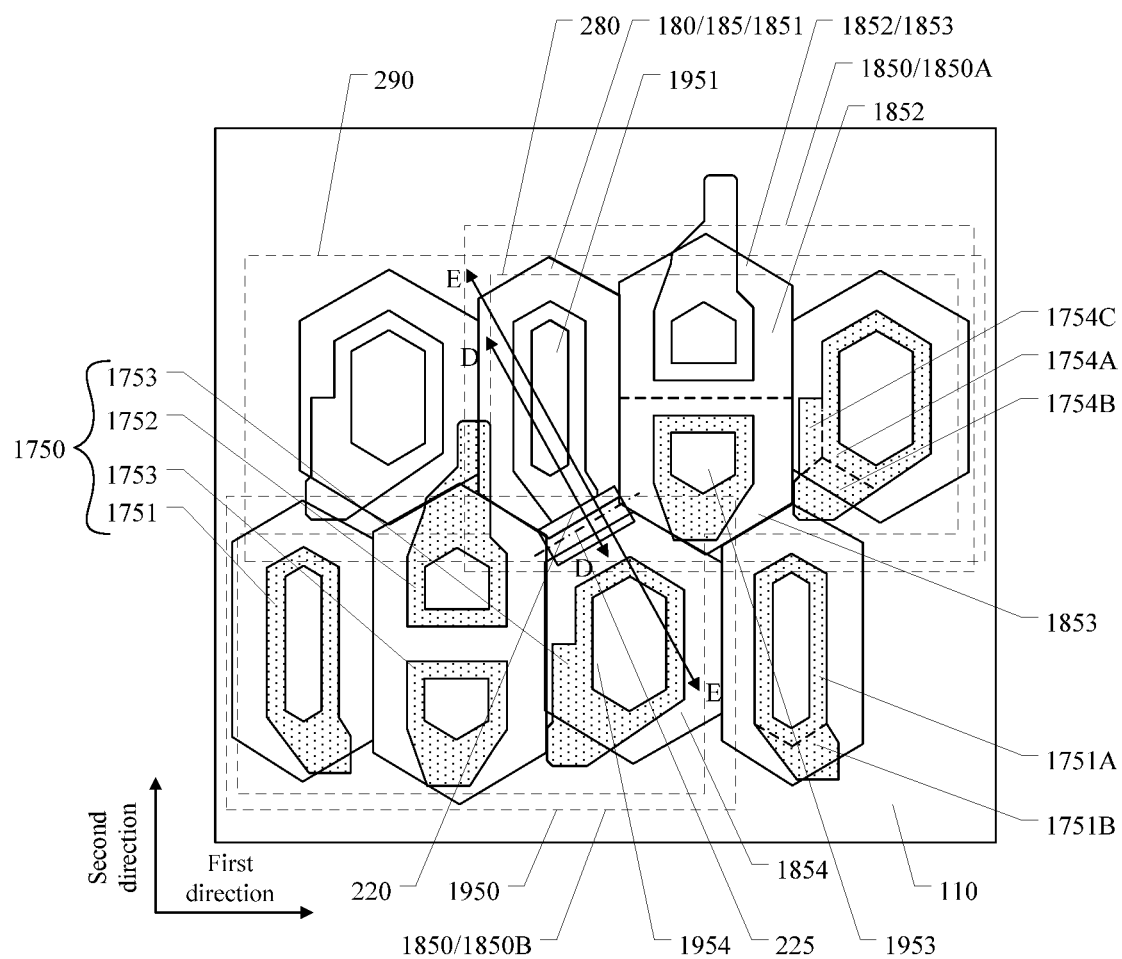
FIG. 20 is a schematic plan view of another display substrate according to an embodiment of the present disclosure.
Figure 21:
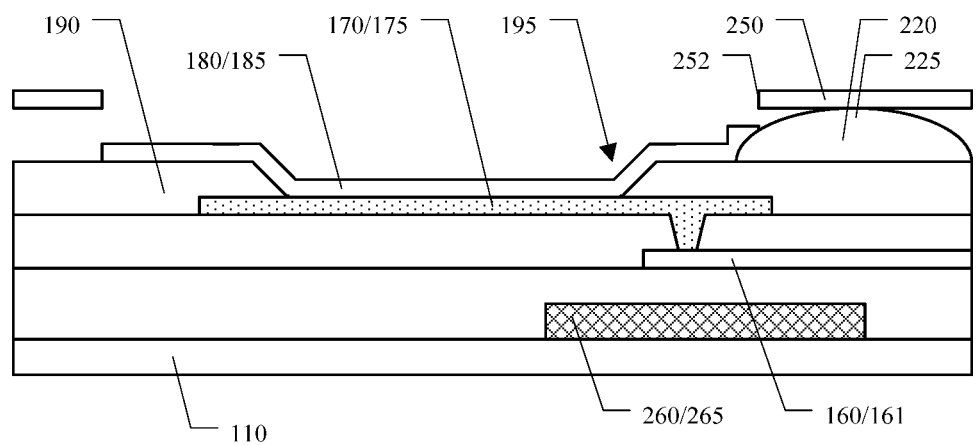
FIG. 21 is a schematic section view of a display substrate according to an embodiment of the present disclosure along the DD direction in FIG. 20.

FIG. 20 is a schematic plan view of another display substrate according to an embodiment of the present disclosure; FIG. 21 is a schematic section view of a display substrate along DD direction in FIG. 20 according to an embodiment of the present disclosure. In order to clearly illustrate the relationship between the spacer and the light emitting portion, only the base substrate, the anode layer, the light emitting layer and the spacer are illustrated in FIG. 20. As illustrated in FIG. 20, the orthographic projection of the top end 225 of the spacer 220 away from the base substrate 110 on the base substrate 110 and the orthographic projection of the light emitting portion 185 on the base substrate 110 are arranged at intervals. As illustrated in FIG. 21, when the fine metal mask plate is used for vapor deposition to form the above-mentioned light emitting portion, the opening edge 252 of the fine metal mask plate 250 is in a suspended state without contacting with the spacer 220. Therefore, the display substrate can avoid the contact between the opening edge of the fine metal mask plate and the top end of the spacer, and avoid the generation of foreign matters such as particles, thereby further improving the stability and reliability of the display substrate and the yield of products.

In some examples, as illustrated in FIG. 20, the plurality of light emitting portions 185 include a plurality of light emitting groups 1850, the plurality of light emitting groups 1850 are arranged in a first direction to form a plurality of light emitting group columns 280 and arranged in a second direction to form a plurality of light emitting group rows 290; each light emitting group 1850 includes a first light emitting portion 1851, a second light emitting portion 1852, a third light emitting portion 1853 and a fourth light emitting portion 1854. Two adjacent light emitting group rows 290 are arranged at a ½ pitch offset, and the pitch is equal to the distance between the centers of two first light emitting portions 1851 in two adjacent light emitting groups 1850 in the first direction; the second light emitting portion 1852 and the third light emitting portion 1853 are arranged along the second direction to form a light emitting pair 1855, and the first light emitting portion 1851, the light emitting pair 1855 and the fourth light emitting portion 1854 are arranged along the first direction. As illustrated in FIG. 20, the orthographic projection of the top end 225 of the spacer 220 on the base substrate 110 is located between the orthographic projection of the first light emitting portion 1851 and the third light emitting portion 1853 in one light emitting group 1850 on the base substrate 110, and the orthographic projection of the second light emitting portion 1852 and the fourth light emitting portion 1854 in another light emitting group 1850 adjacent in the second direction on the base substrate 110. Therefore, the display substrate can ensure that the orthographic projection of the top end 225 of the spacer 220 on the base substrate 110 and the orthographic projection of the first light emitting portion 1851, the second light emitting portion 1852, the third light emitting portion 1853 and the fourth light emitting portion 1854 on the base substrate 110 are arranged at intervals, and make full use of the space of the display substrate.

For example, the first direction and the second direction are substantially perpendicular. It should be noted that the first direction and the second direction being substantially perpendicular includes the case where the included angle between the first direction and the second direction is 90 degrees, and also includes the case where the included angle between the first direction and the second direction ranges from 85 to 95 degrees.

For example, as illustrated in FIG. 20, in the display substrate 100, two adjacent light emitting groups 1850 in the second direction can be a first light emitting group 1850A and a second light emitting group 1850B, the orthographic projection of the top end 225 of the spacer 220 on the base substrate 110 is located between the orthographic projection of the first light emitting portion 1851 of the first light emitting group 1850A on the base substrate 110, the orthographic projection of the third light emitting portion 1853 of the first light emitting group 1850A on the base substrate 110, the orthographic projection of the second light emitting portion 1852 of the second light emitting group 1850B on the base substrate 110 and the orthographic projection of the fourth light emitting of the second light emitting group 1850B on the base substrate 110. Therefore, the display substrate can ensure that the orthographic projection of the top end 225 of the spacer 220 on the base substrate 110 and the orthographic projection of the first light emitting portion 1851, the second light emitting portion 1852, the third light emitting portion 1853 and the fourth light emitting portion 1854 on the base substrate 110 are all arranged at intervals, and make full use of the space of the display substrate.

For example, the orthographic projection of the spacer 220 on the base substrate 110 can be a rectangle with a length of 20 microns and a width of 9.5 microns. At this time, the distance between the orthographic projection of the spacer 220 on the base substrate 110 and the orthographic projection of the third anode 1753 of the first light emitting group 1850A on the base substrate 110 can range from 8.5 to 9.5 microns, for example, 8.9 microns. The distance between the orthographic projection of the spacer 220 on the base substrate 110 and the orthographic projection of the fourth anode 1754 of the second light emitting group 1850B on the base substrate 110 can range from 6 to 7 microns, for example, 6.3 microns.

For example, the distance between the orthographic projection of the spacer 220 on the base substrate 110 and the orthographic projection of the third light emitting portion 1853 of the first light emitting group 1850A on the base substrate 110 can be 0 microns, or even overlap with each other. The distance between the orthographic projection of the spacer 220 on the base substrate 110 and the orthographic projection of the second light emitting portion 1852 of the second light emitting group 1850B on the base substrate 110 can be 0 microns, or even overlap with each other.

In some examples, as illustrated in FIGS. 20 and 21, the display substrate 100 further includes an anode layer 170 and a pixel defining layer 190; the anode layer 170 is located between the base substrate 110 and the spacer 220, and the pixel defining layer 190 is located at a side of the anode layer 170 close to the spacer 220. The anode layer 170 includes a plurality of anodes 175, and the pixel defining layer 190 includes a plurality of openings 195 to expose the plurality of anodes 175. The plurality of anodes 175 are arranged corresponding to the plurality of light emitting portions 185, the plurality of openings 195 are arranged corresponding to the plurality of light emitting portions 185, the plurality of openings 195 include a plurality of opening groups 1950, each opening group 1950 includes a first opening 1951, a second opening 1952, a third opening 1953 and a fourth opening 1954, and the plurality of anodes 175 are arranged corresponding to the plurality of light emitting portions 185. The plurality of anodes 175 includes a plurality of anode groups 1750, and each anode group 1750 includes a first anode 1751, a second anode 1752, a third anode 1753 and a fourth anode 1754. The first light emitting portion 1851 is at least partially located in the first opening 1951 and covers the first anode 1751 being exposed, the second light emitting portion 1852 is at least partially located in the second opening 1952 and covers the second anode 1752 being exposed, the third light emitting portion 1853 is at least partially located in the third opening 1953 and covers the third anode 1753 being exposed, and the fourth light emitting portion 1854 is at least partially located in the fourth opening 1954 and covers the fourth anode 1753 being exposed.

For example, as illustrated in FIGS. 20 and 21, the orthographic projection of the spacer 220 on the base substrate 110 can partially overlap with the orthographic projection of the first anode 1751 on the base substrate 110.

For example, as illustrated in FIGS. 20 and 21, a first virtual line is parallel to the length direction of the spacer 220 and passes through the center of the spacer 220; the shape of the orthographic projection of the first opening 1951 on the base substrate 110 is approximately of an ellipse, and the ratio of the distance between the apex of the ellipse in the long axis direction and the first virtual line and the shortest distance between the first opening 1951 and the first virtual line ranges from 1.5 to 1.

For example, the distance between the first opening 1951 and the second opening 1952 ranges from 20 to 25 microns; the distance between the first opening 1951 and the third opening 1953 also ranges from 20 to 25 microns. The distance between the first opening 1951 and the fourth opening 1954 also ranges from 20 to 25 microns. Of course, the embodiments of the present disclosure include but are not limited to this, and the distance between different openings can be determined according to the actual product size.

In some examples, as illustrated in FIGS. 20 and 21, the orthographic projection of the spacer 220 on the base substrate 110 and the pad block of the first opening 1951 on the base substrate 110 are offset arranged. Therefore, in the manufacturing process of the display substrate according to the embodiment of the present disclosure, when the fine metal mask plate is used for vapor deposition to form the above-mentioned light emitting portion, the display substrate can avoid the contact between the opening edge of the fine metal mask plate and the top end of the spacer, and avoid the generation of foreign matters such as particles.

For example, as illustrated in FIGS. 20 and 21, the orthographic projection of the spacer 220 on the base substrate 110 and the orthographic projection of the first opening 1951 on the base substrate 110 are arranged at intervals.

In some examples, as illustrated in FIGS. 20 and 21, the shape of the orthographic projection of the first opening 1951 on the base substrate 110 is approximately elliptical, and the shape of the orthographic projection of the spacer 220 on the base substrate 110 is rectangular. The included angle between the long axis direction of the shape of the orthographic projection of the first opening 1951 on the base substrate 110 and the extending direction of the shape of the orthographic projection of the spacer 220 on the base substrate 110 ranges from 20 to 70 degrees.

In some examples, as illustrated in FIGS. 20 and 21, the display substrate 100 further includes a pixel circuit layer 260; the pixel circuit layer 260 is located at a side of the anode layer 170 close to the base substrate 110, and includes a plurality of pixel driving circuits 265; the plurality of pixel driving circuits 265 and the plurality of anodes 175 are arranged correspondingly, each anode 175 is electrically connected with the corresponding pixel driving circuit 265, the first anode 1751 includes a body portion 1751A and a connecting portion 1751B connected with the body portion 1751A. The orthographic projection of the first opening 1951 on the base substrate 110 falls within the orthographic projection of the body portion 1751A on the base substrate 110, and the connection portion 1751B is electrically connected with the corresponding pixel driving circuit 265.

In some examples, as illustrated in FIGS. 20 and 21, the orthographic projection of the spacer 220 on the base substrate 110 at least partially overlaps with the orthographic projection of the connecting portion 1751B on the base substrate 110. Therefore, the display substrate can avoid the contact between the opening edge of the fine metal mask plate and the top end of the spacer, and avoid the generation of foreign matters such as particles, and make full use of the space of the display substrate.

In some examples, as illustrated in FIGS. 20 and 21, the connection portion 1751B is located at a position where the body portion 1751A is close to the third anode 1753 in the same light emitting group 1850 and the fourth anode 1754 in the light emitting group 1850 adjacent in the second direction.

In some examples, the region defined by the first opening 1951 is the first effective light emitting region of the first sub-pixel, the region defined by the second opening 1952 is the second effective light emitting region of the second sub-pixel, the region defined by the third opening 1953 is the third effective light emitting region of the third sub-pixel, and the region defined by the fourth opening 1954 is the fourth effective light emitting region of the fourth sub-pixel. Therefore, the plurality of light emitting groups, the plurality of opening groups and the plurality of anode groups abovementioned respectively correspond to a plurality of pixel structures.

In some examples, the first light emitting portion is configured to emit light of a first color, the second light emitting portion is connected with the third light emitting portion and both configured to emit light of a second color, and the fourth light emitting portion is configured to emit light of a third color.

For example, the first color is red (R), the second color is green (G), and the third color is blue (B). That is, the display substrate adopts the pixel arrangement structure of GGRB.

Figure 22:
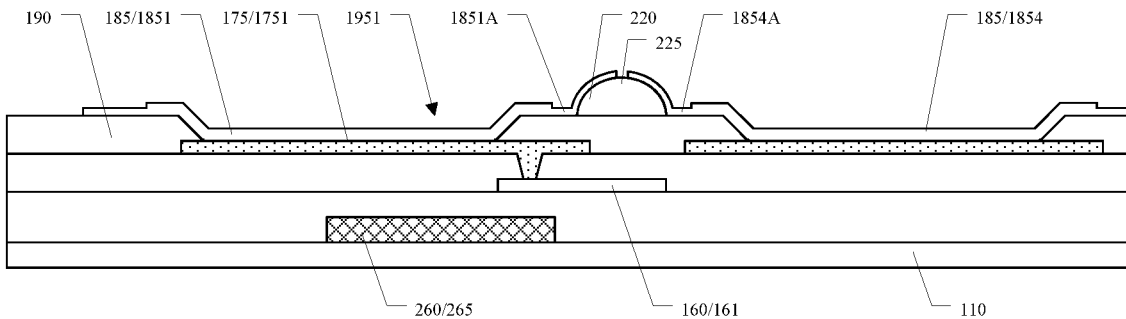
FIG. 22 is a schematic section view of a display substrate according to an embodiment of the present disclosure along the EE direction in FIG. 20.

FIG. 22 is a schematic section view of a display substrate along the EE direction in FIG. 20. As illustrated in FIG. 22, in the actual manufacturing process, the light emitting portions 185 (e.g., the first light emitting layer 1851 and the fourth light emitting layer 1854) formed by the fine metal mask plate will diffuse to form thinner diffusion portions (e.g., the diffusion portions 1851A and 1854A), resulting in the size of the finally obtained light emitting layer 185 being greater than the opening size of the fine metal mask plate, which will overlap with the spacer 220, and even the adjacent light emitting portions will contact or overlap. At this time, the above-mentioned light emitting layer refers to the part where the thickness of the light emitting layer is greater than or equal to the thickness of the diffusion portion, and does not include the diffusion portion.

Figure 23:
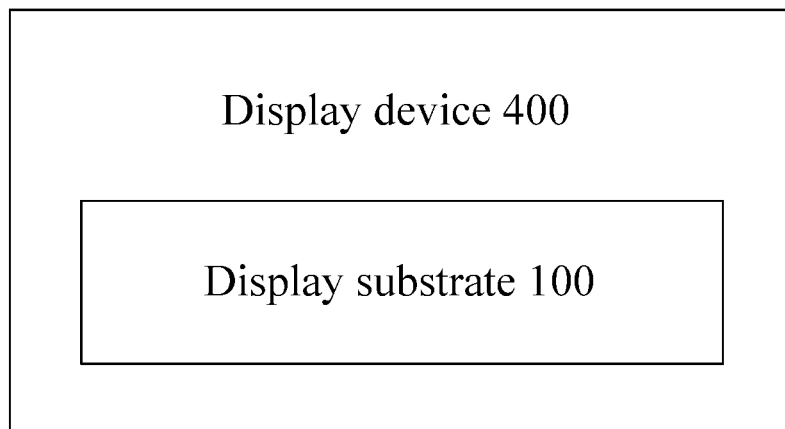
FIG. 23 is a schematic diagram of a display device according to an embodiment of the present disclosure.

An embodiment of the present disclosure further provides a display device. FIG. 23 is a schematic diagram of a display device according to an embodiment of the present disclosure. As illustrated in FIG. 23, the display device 400 includes any one of the display substrates 100 described above. Therefore, the display device has the beneficial effects corresponding to the beneficial effects of the display substrate. For example, the display device can avoid the contact between the opening edge 252 of the fine metal mask plate and the top end of the spacer in the manufacturing process, and avoid the generation of foreign matters such as particles, thereby improving the stability and reliability of the display substrate and the yield of products.

For example, the display device can be electronic products with display functions such as televisions, computers, notebook computers, flat computers, mobile phones, navigators, and electronic photo frames.

Figure 24:
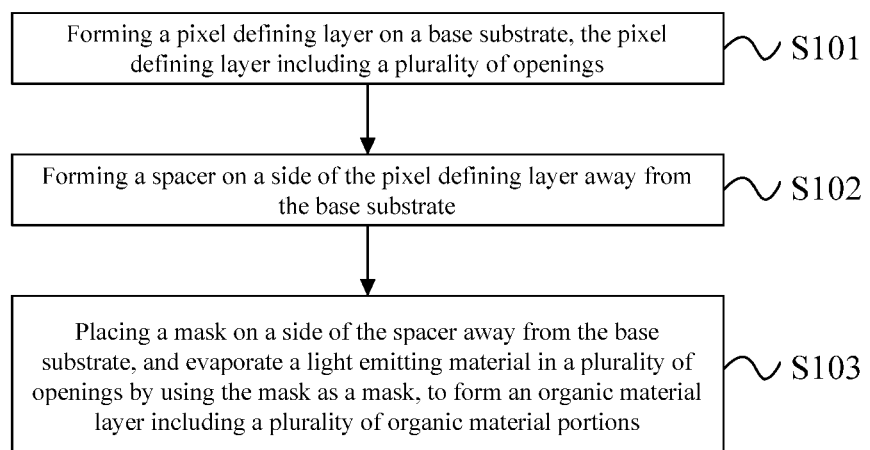
FIG. 24 is a manufacturing method of a display substrate according to an embodiment of the present disclosure.

An embodiment of the present disclosure provides a method for manufacturing a display substrate. FIG. 24 shows a method for manufacturing a display substrate according to an embodiment of the present disclosure. As illustrated by FIG. 24, the method for manufacturing a display substrate includes the following steps S101 to S103.

Step S101: forming a pixel defining layer on a base substrate, the pixel defining layer including a plurality of openings.

For example, the base substrate may use a quartz substrate, a glass substrate, a plastic substrate, or the like. The pixel defining layer may be manufactured by using a vapor deposition process. The plurality of openings may be manufactured by using an etching process. Certainly, this embodiment of the present disclosure includes but is not limited thereto.

Step S102: forming a spacer on a side of the pixel defining layer away from the base substrate.

For example, the spacer and the pixel defining layer may be formed by using the same film through a half tone mask or a gray tone mask, to reduce mask processes, thereby reducing costs. For example, a layer structure used for forming the pixel defining layer and the spacer may be first formed on the base substrate; then a first photoresist pattern is formed on a side of the layer structure away from the base substrate by using the half tone mask or the gray tone mask. The first photoresist pattern includes a completely kept portion, a partially kept portion, and a completely removed portion. The layer structure is etched (for example, a wet etching process) by using the first photoresist pattern, and a layer structure corresponding to the completely removed part is removed, to form a plurality of openings of the pixel defining layer. Then, an ashing process is performed on the first photoresist pattern, and the partially kept portion is removed to form a second photoresist pattern. The layer structure is further etched by using the second photoresist pattern, to form the spacer at a layer structure corresponding to the completely kept portion, and form the pixel defining layer at a layer structure corresponding to the partially kept portion. Certainly, this embodiment of the present disclosure includes but is not limited thereto. The spacer may alternatively be formed separately.

Step S103: placing a mask plate on a side of the spacer away from the base substrate, and evaporating light emitting materials into the plurality of openings with the mask plate as a mask to form a light emitting layer including a plurality of light emitting portions, the mask plate includes a plurality of mask openings, and the orthographic projection of the top end of the spacer on the base substrate and the edge of the orthographic projection of the mask opening on the base substrate are arranged at intervals.

In the manufacturing process of the display substrate according to the embodiment of the present disclosure, when a mask plate is placed on the side of the spacer away from the base substrate and light emitting materials are evaporated in the plurality of openings with the mask plate as a mask to form a light emitting layer including a plurality of light emitting portions, the orthographic projection of the opening edge of the mask plate on the base substrate is spaced from the orthographic projection of the top end of the spacer on the base substrate, thereby avoiding the contact between the opening edge of the mask plate and the top end of the spacer and avoiding the generation of foreign matters such as particles. Therefore, the manufacturing method of the display substrate can improve the stability and reliability of the display substrate and the yield of products.

In some examples, the above mask plate is a fine metal mask plate (FMM).

In some examples, the shape of the orthographic projection of the spacer on the base substrate is rectangular, and the orthographic projection of the central axis of the spacer in the length direction on the base substrate is spaced from the edge of the orthographic projection of the light emitting portion on the base substrate. Therefore, the manufacturing method of the display substrate can avoid the contact between the opening edge of the fine metal mask plate and the top end of the spacer and avoid the generation of foreign matters such as particles, thereby improving the stability and reliability of the display substrate and the yield of products.

In some examples, the orthographic projection of the spacer on the base substrate is spaced from the edge of the orthographic projection of the light emitting portion on the base substrate. Therefore, the display substrate can further avoid the contact between the opening edge of the fine metal mask plate and the top end of the spacer, and avoid the generation of foreign matters such as particles, thereby further improving the stability and reliability of the display substrate and the yield of products.

Figure 25:
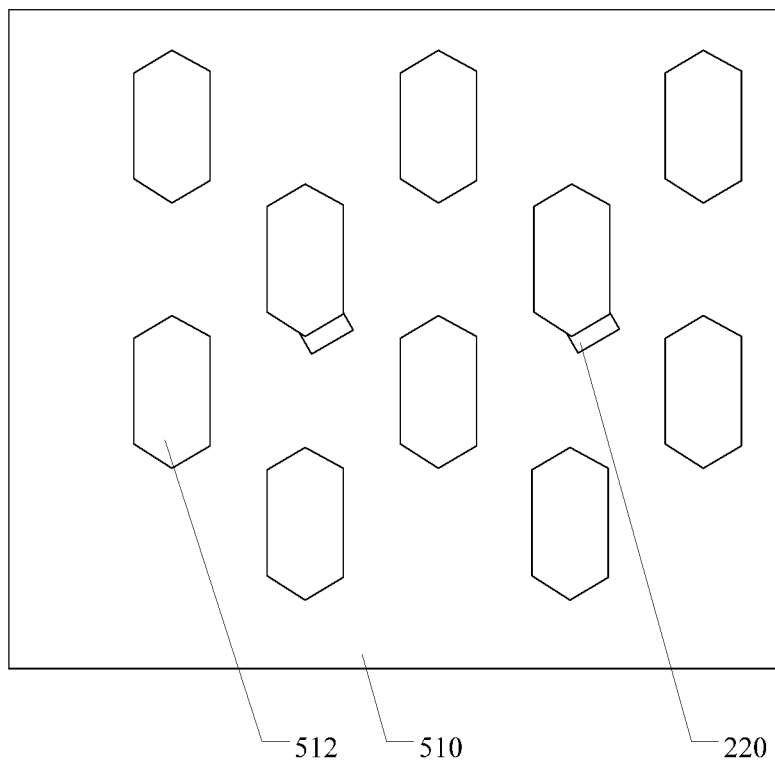
FIGS. 25-27 are schematic plan views of a mask plate group according to an embodiment of the present disclosure.
Figure 26:
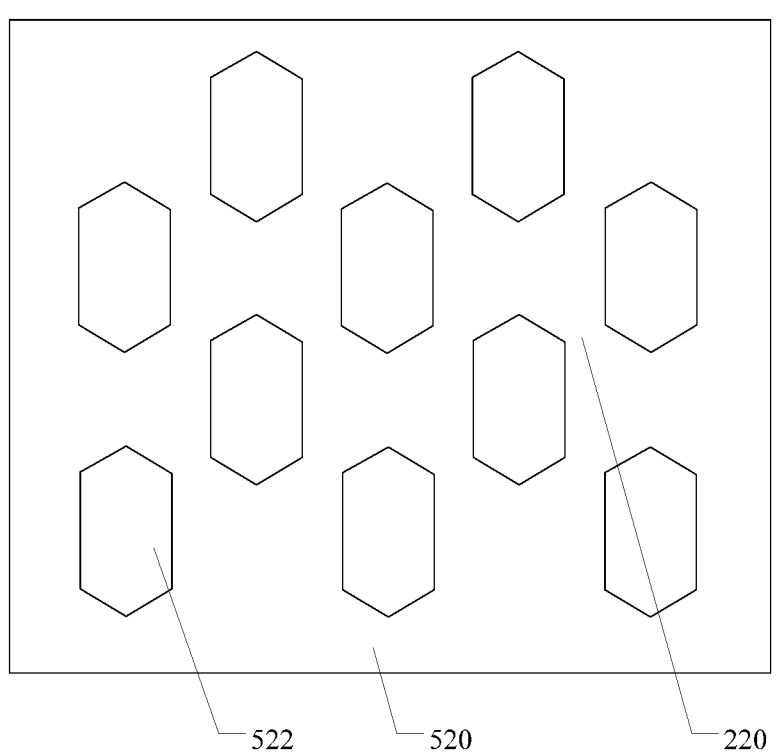
Figure 27:
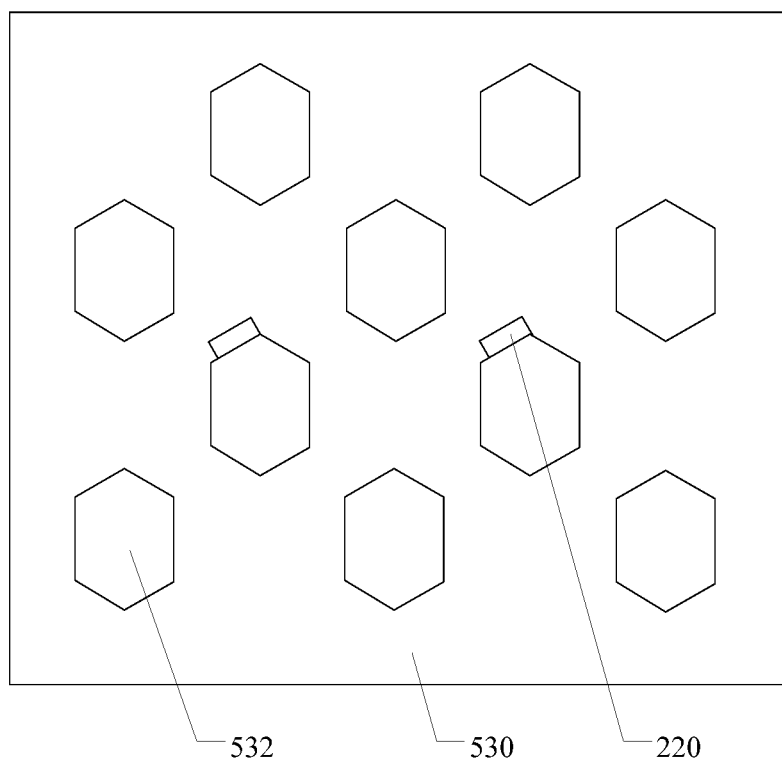

FIG. 25 to FIG. 27 are schematic planar diagrams of a mask group according to an embodiment of the present disclosure. As illustrated by FIG. 25 to FIG. 27, the mask group includes a first mask 510, a second mask 520, and a third mask 530. The first mask 510 includes a plurality of first mask openings 412. Each of the first mask openings 412 is used for forming the foregoing first organic material portion 1851. The second mask 520 includes a plurality of second mask openings 422. Each of the second mask openings 422 is used for forming the second organic material portion 1852 and the third organic material portion 1853. That is, the second organic material portion 1852 and the third organic material portion 1853 may be formed by using the same mask opening. The third mask 530 includes a plurality of third mask openings 432. Each of the third mask openings 432 is used for forming the foregoing fourth organic material portion 1854.

For example, as illustrated by FIG. 25 to FIG. 27, in the method for manufacturing the display substrate, the foregoing step S103 may include: as illustrated by FIG. 25, placing the first mask 510 on the side of the spacer 220 away from the base substrate 110, and evaporating the light emitting material in the plurality of openings 1951 by using the first mask 510 as a mask, to form the plurality of first organic material portions 1851; removing the first mask 510; as illustrated by FIG. 26, placing the second mask 520 on the side of the spacer 220 away from the base substrate 110, and evaporating the light emitting material in the plurality of openings 1951 and 1952 by using the second mask 520 as a mask, to form the plurality of second organic material portions 1852 and the plurality of third organic material portions 1853; removing the second mask 520; and as illustrated by FIG. 27, placing the third mask 530 on the side of the spacer 220 away from the base substrate 110, and evaporating the light emitting material in the plurality of openings 1954 by using the third mask 530 as a mask, to form the plurality of fourth organic material portions 1854.

For example, as illustrated by FIG. 25 to FIG. 27, the orthographic projection of the top end of the spacer 220 away from the base substrate 110 on the base substrate 110 is spaced from an edge of the orthographic projection of the first organic material portion 1851 or the fourth organic material portion 1854 on the base substrate 110.

On the other hand, with the continuous development of the OLED display technology, people pose increasingly high requirements for the display effect. In researches, the inventor of this application notices that, there are many factors that affect the display effect of the OLED display device. The size of the load of the gate electrode layer affects the charging time of a pixel driving circuit, and the charging time of the pixel driving circuit includes relatively large impact on the display effect. Usually, the load of the gate electrode layer is mainly formed by a gate electrode line and a reset signal line. On the other hand, the size of the load of the data line (or a source line) directly relates to the power consumption of an IC. Larger load of the data line indicates a higher requirement for an IC driver, which leads to higher power consumption of the IC. Therefore, when the load between the gate electrode line and the reset signal line and the load on the data line are controlled, the display effect of the OLED display device can be improved, and the power consumption of the OLED display device can be reduced.

Regarding this, the embodiments of the present disclosure provide a display substrate and a display device. The display substrate includes a base substrate, a first gate electrode layer, a second gate electrode layer, and a first conductive layer. The first gate electrode layer is located on the base substrate. The second gate electrode layer is located on a side of the first gate electrode layer away from the base substrate. The first conductive layer is located on a side of the second gate electrode layer away from the base substrate. The first gate electrode layer includes a reset signal line and a first electrode block that extend along the first direction. The second gate electrode layer includes a second electrode block. The second electrode block is configured to form a storage capacitor with the first electrode block. The first conductive layer includes a power line that extends along the second direction. There is a first overlapping region between the reset signal line and the power line. There is a second overlapping region between the second electrode block and the power line. The width of the power line located in the first overlapping region is less than the width of the power line located in the second overlapping region. The first direction intersects with the second direction. Therefore, by reducing the width of the power line in the first overlapping region in which the reset signal line is overlapped with the power line, the display substrate can reduce the load of the reset signal line, to improve the charging time of the pixel driving circuit, thereby improving the display effect of the display substrate.

The display substrate and the display device that are provided in the embodiments of the present disclosure are described in detail below with reference to the accompanying drawings.

Figure 28A:
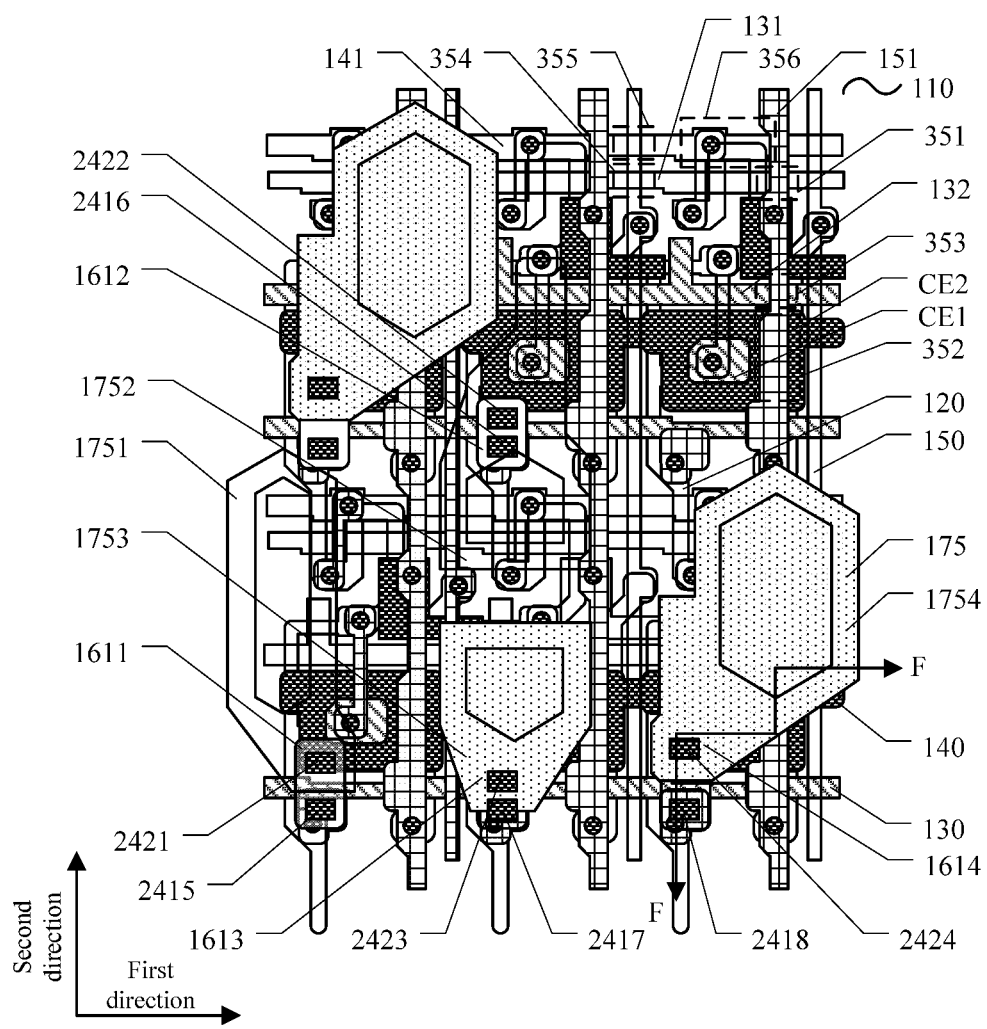
FIG. 28A is a partial schematic diagram of another display substrate according to an embodiment of the present disclosure.
Figure 28B:
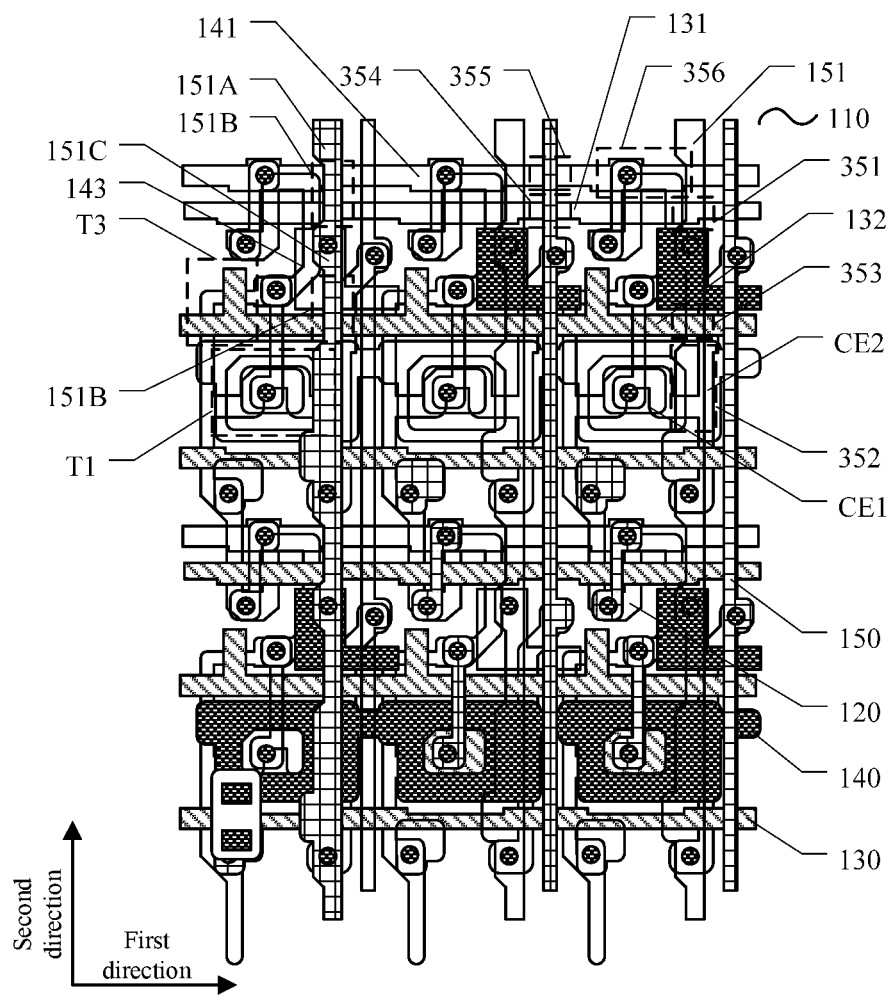
FIG. 28B is a partial schematic diagram of another display substrate according to an embodiment of the present disclosure.
Figure 29:
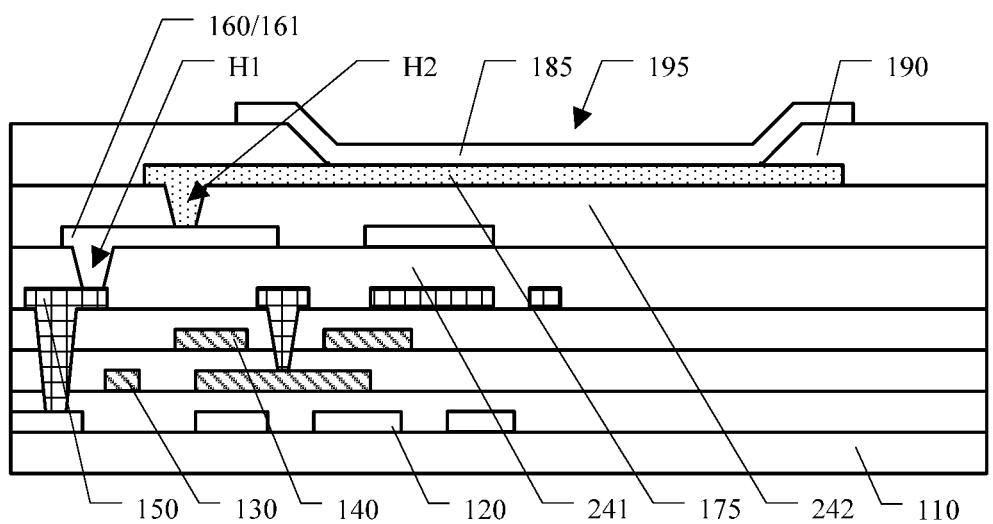
FIG. 29 is a schematic section view of a display substrate according to an embodiment of the present disclosure along the FF direction in FIG. 28A.

An embodiment of the present disclosure provides a display substrate. FIG. 28A is a partial schematic diagram of another display substrate according to an embodiment of the present disclosure. FIG. 28B is a partial schematic diagram of another display substrate according to an embodiment of the present disclosure. FIG. 29 is a schematic cross-sectional view of a display substrate according to an embodiment of the present disclosure along an FF direction in FIG. 28A. To clearly show a layered structure of the films in a pixel driving circuit structure in the display substrate, an anode layer and a second conductive layer are omitted in FIG. 28B.

As illustrated by FIG. 28A, FIG. 28B, and FIG. 29, the display substrate 100 includes a base substrate 110, a first gate electrode layer 130, a second gate electrode layer 140, and a first conductive layer 150. The first gate electrode layer 130 is located on the base substrate 110. The second gate electrode layer 140 is located on a side of the first gate electrode layer 130 away from the base substrate 110. The first conductive layer 150 is located on a side of the second gate electrode layer 140 away from the base substrate 110. The first gate electrode layer 130 includes a reset signal line 131 and a first electrode block CE1 that extend along the first direction. The second gate electrode layer 140 includes a second electrode block CE2. The second electrode block CE2 is configured to form a storage capacitor with the first electrode block CE1. The first conductive layer 150 includes a power line 151 that extends along the second direction. There is a first overlapping region 351 between the reset signal line 131 and the power line 151. There is a second overlapping area 352 between the second electrode block CE2 and the power line 151. The width of the power line 151 located in the first overlapping region 351 is less than the width of the power line 151 located in the second overlapping region 352. That is, the width of the power line 151 in the first overlapping region 351 is shortened, and the first direction intersects with, for example, is perpendicular to the second direction. It should be noted that, the width of the foregoing power line is the size of the power line along the first direction. Correspondingly, the length of the power line is the size of the power line along the second direction.

In the display substrate provided in this embodiment of the present disclosure, when the width of the power line in the first overlapping region in which the reset signal line is overlapped with the power line, the area in which the reset signal line is overlapped with the power line can be reduced, thereby reducing the parasitic capacitance between the reset signal line and the power line. Therefore, by reducing the width of the power line in the first overlapping region in which the reset signal line is overlapped with the power line, the display substrate can reduce the load of the reset signal line, to improve the charging time of the pixel driving circuit, thereby improving the display effect of the display substrate.

In some examples, the first conductive layer may be a first source-drain metal layer. The display substrate may further include a second conductive layer, that is, a second source-drain metal layer. It should be noted that, to clearly show the film structure on the display substrate, a second conductive layer (second source-drain metal layer) is not shown on the display substrate shown in FIG. 28A. Certainly, this embodiment of the present disclosure includes but is not limited thereto. The display substrate may alternatively not include the second conductive layer, and is a display substrate of a single source-drain metal layer.

In some examples, the width of the power line 151 located in the first overlapping region 351 is less than an average width of the power line 151.

In some examples, as illustrated by FIG. 28A and FIG. 28B, the width of the power line 151 located in the first overlapping region 351 is less than 5/7 of the largest width of the power line 151. Therefore, in the display substrate, the load of the reset signal line can be effectively reduced.

In some examples, as illustrated by FIG. 28B, the power line 151 includes a body extension portion 151A and a narrowing portion 151B. The width of the narrowing portion 151B is less than the width of the body extension portion 151A. The orthographic projection of the narrowing portion 151B on the base substrate 110 is overlapped with the orthographic projection of the reset signal line 131 on the base substrate 110.

In some examples, as illustrated by FIG. 28A and FIG. 28B, the first gate electrode layer 130 further includes a gate electrode line 132 extending along the first direction. There is a third overlapping region 353 between the gate electrode line 132 and the power line 151. The width of the power line 151 in the third overlapping region 353 is less than the width of the power line 151 located in the second overlapping region 352. That is, the width of the power line in the third overlapping region is also shortened. Therefore, by reducing the width of the power line in the second overlapping region in which the gate electrode line is overlapped with the power line, the display substrate can reduce the load of the gate electrode line, to further improve the charging time of the pixel driving circuit, thereby improving the display effect of the display substrate.

In some examples, the width of the power line 151 located in the third overlapping region 353 is less than an average width of the power line 151.

In some examples, as illustrated by FIG. 28A and FIG. 28B, the width of the power line 151 located in the third overlapping region 353 is less than 5/7 of the largest width of the power line 151. Therefore, in the display substrate, the load of the reset signal line can be effectively reduced.

In some examples, as illustrated by FIG. 28B, the power line 151 includes a body extension portion 151A and a narrowing portion 151B. The width of the narrowing portion 151B is less than the width of the body extension portion 151A. The orthographic projection of the narrowing portion 151B on the base substrate 110 is overlapped with the orthographic projection of the gate electrode line 132 on the base substrate 110.

In some examples, as illustrated by FIG. 28A and FIG. 28B, the first conductive layer 150 further includes a data line 152 extending along the second direction. There is a fourth overlapping region 354 between the data line 152 and the reset signal line 131. The width of the reset signal line 131 in the fourth overlapping region 354 is less than the average width of the reset signal line 131. In this display substrate, when the width of the reset signal line in the fourth overlapping region is reduced, the area in which the reset signal line is overlapped with the data line can be reduced, thereby reducing the parasitic capacitance between the reset signal line and the data line. Therefore, by reducing the width of the reset signal line in the fourth overlapping region, the display substrate can reduce the load of the data line, to reduce the power consumption of a driver, thereby reducing the power consumption of the display substrate. It should be noted that, the width of the foregoing reset signal line is the size of the reset signal line along the second direction. Correspondingly, the length of the reset signal line is the size of the reset signal line along the first direction.

In some examples, as illustrated by FIG. 28A and FIG. 28B, the width of the reset signal line 131 located in the fourth overlapping region 354 is less than 3/4 of the largest width of the reset signal line 131. Therefore, in the display substrate, the load of the data line can be effectively reduced.

In some examples, as illustrated by FIG. 28A and FIG. 28B, the display substrate 100 further includes a semiconductor layer 120 located on a side of the first gate electrode layer 130 close to the base substrate 110. The second gate electrode layer 140 includes an initialization signal line 141 extending along the first direction. There is a fifth overlapping region 355 between the data line 152 and the initialization signal line 141. There is a sixth overlapping region 356 between the initialization signal line 141 and the semiconductor layer 120. The width of the initialization signal line 141 located in the fifth overlapping region 355 is less than the width of the initialization signal line 141 located in the sixth overlapping region 356. In this display substrate, when the width of the initialization signal line in the fifth overlapping region is reduced, the area in which the initialization signal line is overlapped with the data line can be reduced, thereby reducing the parasitic capacitance between the initialization signal line and the data line. Therefore, by reducing the width of the initialization signal line in the fifth overlapping region, the display substrate can further reduce the load of the data line, to reduce the power consumption of a driver, thereby reducing the power consumption of the display substrate. It should be noted that, the width of the foregoing initialization signal line is the size of the initialization signal line along the second direction. Correspondingly, the length of the initialization signal line is the size of the initialization signal line along the first direction.

In some examples, the width of the initialization signal line 141 located in the fourth overlapping region 354 is less than an average width of the initialization signal line 141.

For example, as illustrated by FIG. 28B, the orthographic projection of the narrowing portion 151B overlapping the reset signal line 131 on the base substrate 110 is further overlapped with the orthographic projection of the initialization signal line 141 on the base substrate 110.

In some examples, as illustrated by FIG. 28B, the power line 151 includes a body extension portion 151A and a narrowing portion 151B. The width of the narrowing portion 151B is less than the width of the body extension portion 151A. The orthographic projection of the narrowing portion 151B on the base substrate 110 does not overlap the orthographic projection of the semiconductor layer 110 on the base substrate 110.

In some examples, as illustrated by FIG. 28B, the second gate electrode layer 140 further includes a conductive block 143. The body extension portion 151A includes a connection portion 151C connected to the conductive block 143. The orthographic projection of the connection portion 151C on the base substrate 110 is partially overlapped with the orthographic projection of the semiconductor layer 110 on the base substrate 110. The connection portion 151C is adjacent to the narrowing portion 151B in the second direction.

For example, as illustrated by FIG. 28B, the connection portion 151C may be located between two narrowing portions 151B.

In some examples, as illustrated by FIG. 28A and FIG. 28B, the width of the initialization signal line 141 located in the fourth overlapping region 354 is less than ¾ of the largest width of the initialization signal line 151. Therefore, in the display substrate, the load of the data line can be effectively reduced.

For example, the semiconductor layer 120 may use a silicon-based semiconductor material, such as polysilicon. Certainly, this embodiment of the present disclosure includes but is not limited thereto. The semiconductor layer may alternatively use a semiconductor material.

FIG. 30A to FIG. 30D are schematic planar diagrams of a plurality of films in a display substrate according to an embodiment of the present disclosure. FIG. 31 is an equivalent schematic diagram of a pixel driving circuit in a display substrate according to an embodiment of the present disclosure.

Figure 30A:
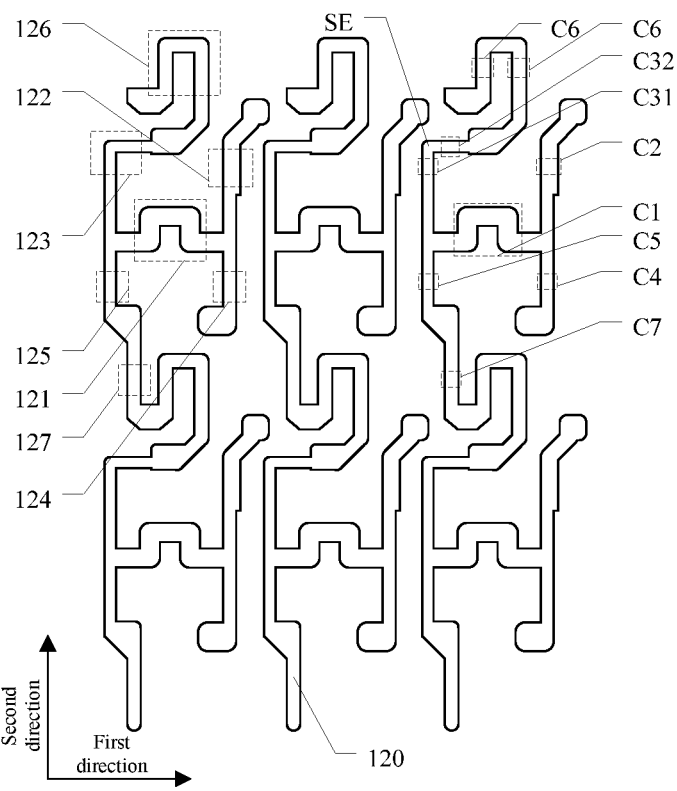
FIGS. 30A-30D are schematic plan views of a plurality of film layers in a display substrate according to an embodiment of the present disclosure.
Figure 31:
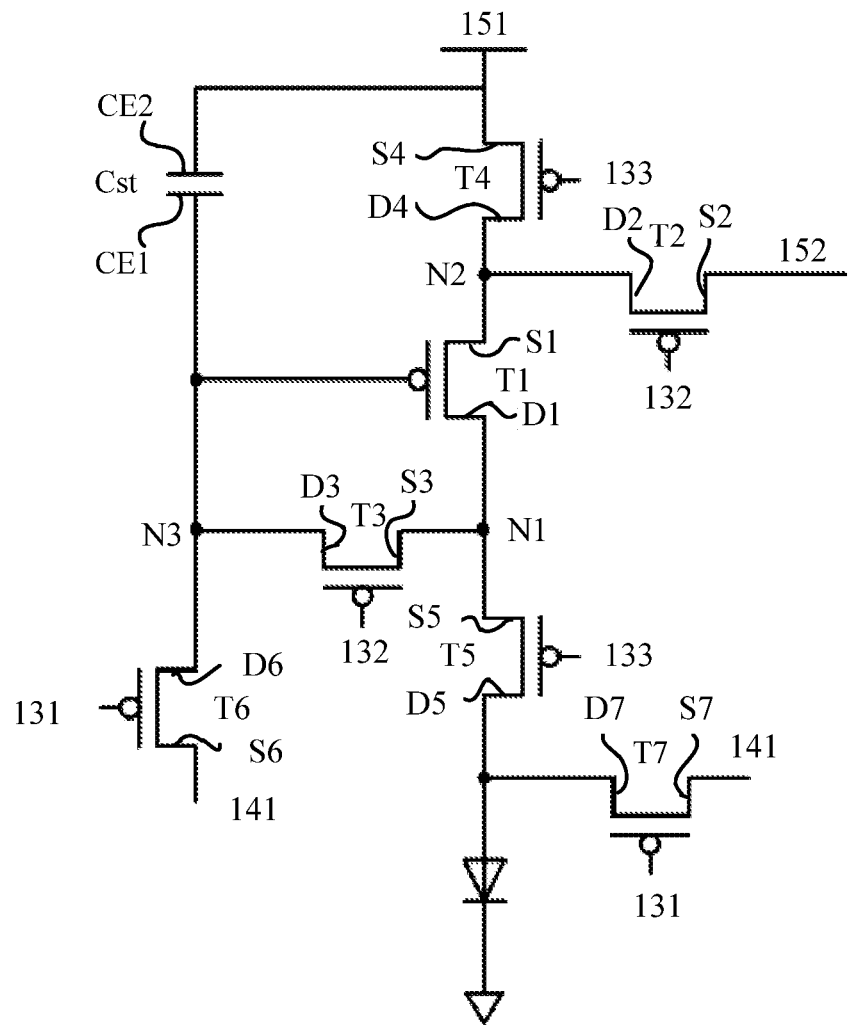
FIG. 31 is an equivalent schematic diagram of a pixel driving circuit in a display substrate according to an embodiment of the present disclosure.

For example, as illustrated by FIG. 30A, a semiconductor layer 120 includes a first unit 121, a second unit 122, a third unit 123, a fourth unit 124, a fifth unit 125, a sixth unit 126, and a seventh unit 127. The first unit 121 includes a first channel region C1 and a first source region S1 and a first drain region D1 located on both sides of the first channel region C1. The second unit 122 includes a second channel region C2 and a second source region S2 and a second drain region D2 located on both sides of the second channel region C2. The third unit 123 includes a third channel region C3 and a third source region S3 and a third drain region D3 located on both sides of the third channel region C3. The fourth unit 124 includes a fourth channel region C4 and a fourth source region S4 and a fourth drain region D4 located on both sides of the fourth channel region C4. The fifth unit 125 includes a fifth channel region C5 and a fifth source region S5 and a fifth drain region S5 located on both sides of the fifth channel region C5. The sixth unit 126 includes a sixth channel region C6 and a sixth source region S6 and a sixth drain region D6 located on both sides of the sixth channel region C6. The seventh unit 127 includes a seventh channel region C7 and a seventh source region S7 and a seventh drain region D7 located on both sides of the seventh channel region C7.

For example, as illustrated by FIG. 30A and FIG. 31, the sixth drain region D6 is connected to the third drain region D3, the third source region S3, the first drain region D1, and the fifth source region S5 are connected to a first node N1, the first source region S1, the second drain region D2, and the fourth drain region D4 are connected to a second node N2, and the fifth drain region D5 is connected to the seventh drain region D7.

Figure 30B:
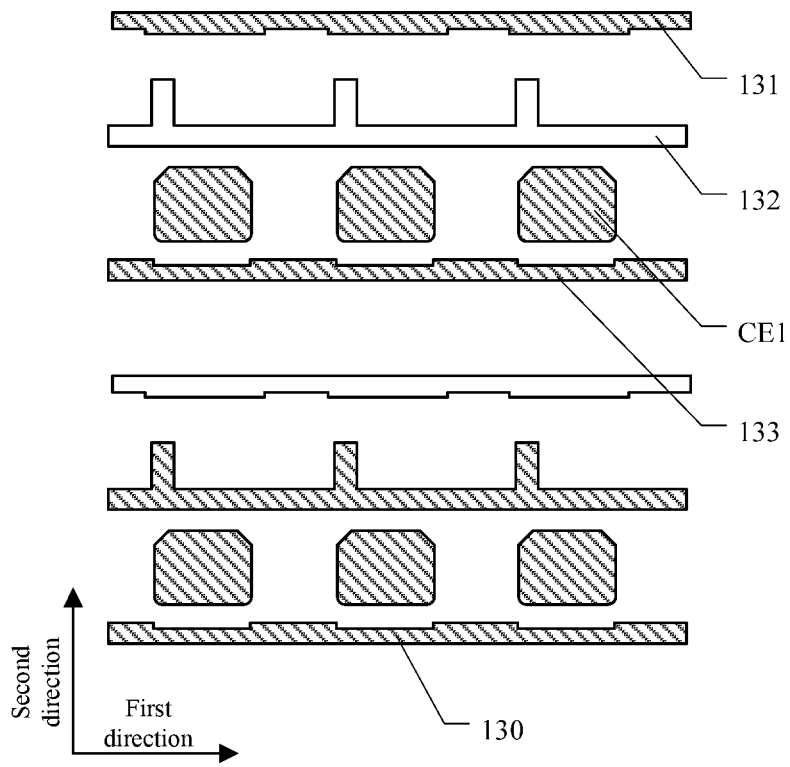

For example, as illustrated by FIG. 30B, a first gate electrode layer 130 includes a reset signal line 131 extending along the first direction, a gate electrode line 132 and a first electrode block CE1 that extend along the first direction, and an emission control line 133 that extends along the first direction.

Figure 30C:
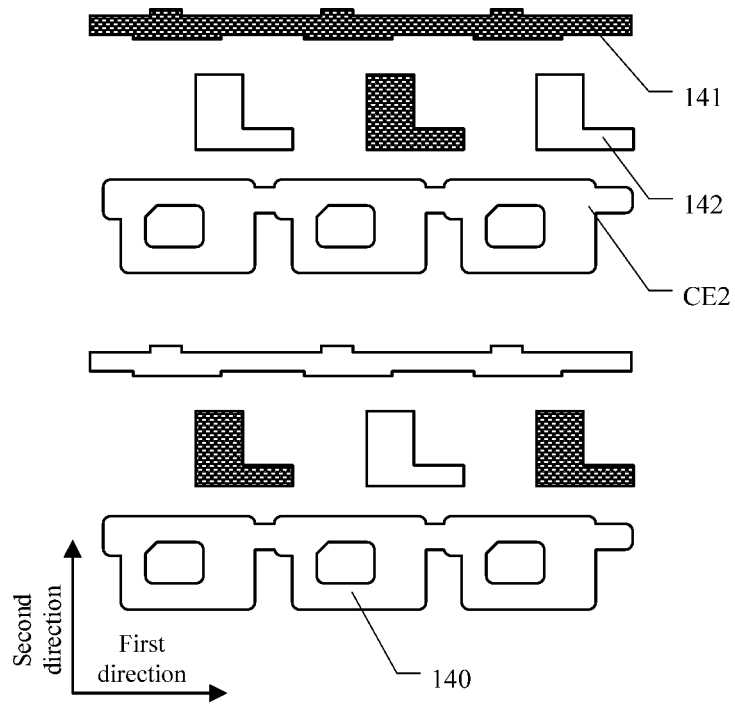

For example, as illustrated by FIG. 30C, a second gate electrode layer 140 includes an initialization signal line 141, a second electrode block CE2 and a conductive block 143 that extend along the first direction. For example, the conductive block 143 may be connected to a power line, to reduce resistance of the power line.

As illustrated by FIG. 31, the sixth source region S6 and the seventh source region S7 are connected to the initialization signal line 141. The first electrode block CE1 and the second electrode block CE2 may form a storage capacitor Cst.

Figure 30D:
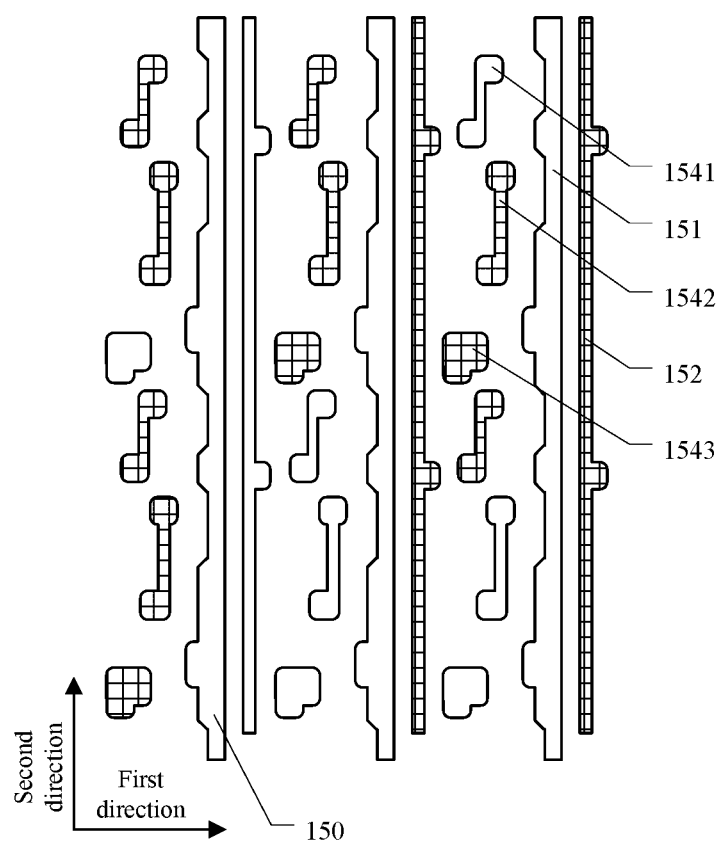

For example, as illustrated by FIG. 30D, the first conductive layer 150 includes a power line 151, a data line 152, a first connection block 1541, a second connection block 1542, and a third connection block 1543 that extend along the second direction. The first connection block 1541 is configured to connect the initialization signal line 141 to the sixth source region S6 and the seventh source region S7. The second connection block 1542 is configured to connect the third drain region D3 to the first electrode block CE1. The third connection block 1543 is connected to the fifth drain region D5, and may be connected to a corresponding anode as a drain.

For example, as illustrated by FIG. 31, the second source region S2 is connected to a data line 152, and the fourth source region S4 is connected to the power line 151. Therefore, the first unit 121, the second unit 122, the third unit 123, the fourth unit 124, the fifth unit 125, the sixth unit 126, and the seventh unit 127 of the semiconductor layer 120 may form a first thin film transistor T1, a second thin film transistor T2, a third thin film transistor T3, a fourth thin film transistor T4, a fifth thin film transistor T5, a sixth thin film transistor T6, and a seventh thin film transistor T7 with the foregoing reset signal line 131 and gate electrode line 132.

The following schematically describes a working manner of the pixel driving circuit shown in FIG. 31. First, when a reset signal is transmitted to the reset signal line 131 to conduct the seventh thin film transistor T7, remaining current that flows through the anode of each sub-pixel is discharged to the sixth thin film transistor T6 through the seventh thin film transistor T7, to inhibit light emission caused by the remaining current that flows through the anode of each sub-pixel. Then, when a reset signal is transmitted to the reset signal line 131 and an initialization signal is transmitted to the initialization signal line 141, the sixth thin film transistor T6 is conducted, and an initialization voltage Vint is applied to a first gate electrode of the first thin film transistor T1 and the first electrode block CE1 of the storage capacitor Cst through the sixth thin film transistor T6, so that the first gate electrode and the storage capacitor Cst are initialized. The initialization of the first gate electrode can conduct the first thin film transistor T1.

Subsequently, when a gate electrode signal is transmitted to the gate electrode line 132 and a data signal is transmitted to the data line 152, both the second thin film transistor T2 and the third thin film transistor T3 are conducted, and a data voltage Vd is applied to the first gate electrode through the second thin film transistor T2 and the third thin film transistor T3. In this case, the voltage applied to the first gate electrode is a compensating voltage Vd+Vth, and the compensating voltage applied to the first gate electrode is also applied to the first electrode block CE1 of the storage capacitor Cst.

Subsequently, the power line 151 applies a drive voltage Vel to the second electrode block CE2 of the storage capacitor Cst, and applies the compensating voltage Vd+Vth to the first electrode block CE1, so that charges corresponding to a difference between voltages that are respectively applied to two electrodes of the storage capacitor Cst are stored in the storage capacitor Cst, and conduction of the first thin film transistor T1 reaches preset time.

Subsequently, when an emission control signal is applied to the emission control line 133, both the fourth thin film transistor T4 and the fifth thin film transistor T5 are conducted, so that the fourth thin film transistor T4 applies the drive voltage Vel to the fifth thin film transistor T5. When the drive voltage Vel runs through the first thin film transistor T1 conducted by the storage capacitor Cst, a difference between the corresponding drive voltage Vel and the voltage that is applied to the first gate electrode through the storage capacitor Cst drives current Id to flow through a first drain region D3 of the first thin film transistor T1, and drives the current Id to be applied to each sub-pixel through the fifth thin film transistor T5, so that the light emitting layer of each sub-pixel emits light.

In some examples, as illustrated by FIG. 29 and FIG. 31, the display substrate 100 further includes a first planarization layer 241, a second conductive layer 160, a second planarization layer 242, and an anode 175. The first planarization layer 241 is located on a side of the first conductive layer 150 away from the base substrate 110. The second conductive layer 160 is located on a side of the first planarization layer 241 away from the first conductive layer 150, and includes a connection electrode 161. The second planarization layer 242 is located on a side of the second conductive layer 160 away from the first planarization layer 241. The anode 175 is located on a side of the second planarization layer 242 away from the second conductive layer 160. The first planarization layer 241 includes a first via hole HE The connection electrode 161 is connected to the fifth drain region S5 through the first via hole HE The second planarization layer 242 includes a second via hole H2. The anode 175 is connected to the connection electrode 161 through the second via hole H2.

Figure 32:
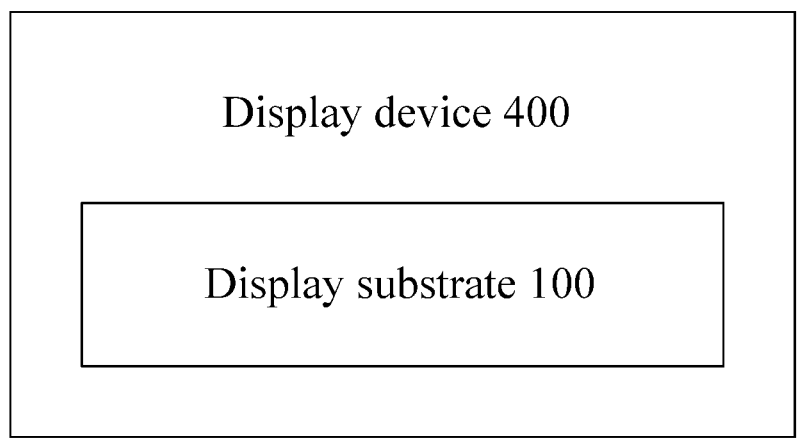
FIG. 32 is a schematic diagram of a display device according to an embodiment of the present disclosure.

An embodiment of the present disclosure provides a display device. FIG. 32 is a schematic diagram of a display device according to an embodiment of the present disclosure. As illustrated by FIG. 32, the display device 400 includes any foregoing display substrate 100. Therefore, the display device includes beneficial effects corresponding to the beneficial effects of the display substrate. For example, the display device can reduce the load of the gate electrode layer, to improve the charging time of the pixel driving circuit, thereby improving the display effect of the display substrate.

For example, the display device may be an electronic product that includes a display function, such as a TV, a computer, a notebook computer, a tablet computer, a mobile phone, a navigator, or an electronic photo frame.

On the other hand, the long-term light emission stability of an OLED display device is also an important specification or index of the OLED display device. In researches, the inventor of this application notices that, there are many factors that affect the long-term light emission stability of the OLED display device. In addition to the life service of the light emitting material, the working status of the thin film transistor in the pixel driving circuit includes impact on the light emission brightness and the long-term light emission stability to some extent.

Regarding this, the embodiments of the present disclosure provide a display substrate and a display device. The display substrate includes a base substrate, a pixel circuit layer, and an anode layer. The pixel circuit layer is located on the base substrate and includes a plurality of pixel driving circuits. The anode layer is located on a side of the pixel circuit layer away from the base substrate and includes a plurality of anodes. The plurality of pixel driving circuits and the plurality of anodes are disposed in a one-to-one correspondence manner. Each pixel driving circuit includes a functional thin film transistor. The plurality of pixel driving circuits include a first pixel driving circuit and a second pixel driving circuit that are adjacent to each other. Orthographic projections of a channel region of the functional thin film transistor in the first pixel driving circuit and a channel region of the functional thin film transistor in the second pixel driving circuit on the base substrate both overlap the orthographic projection of the anode corresponding to the first pixel driving circuit on the base substrate. Therefore, in the display substrate, the channel region of the functional thin film transistor in the first pixel driving circuit and the channel region of the functional thin film transistor in the second pixel driving circuit are shielded simultaneously through the anode, to improve the stability and the service life of the functional thin film transistor, thereby improving the long-term light emission stability and the service life of the display substrate.

Hereinafter, the display substrate and the display device that are provided in the embodiments of the present disclosure are described in detail with reference to the accompanying drawings.

Figure 33:
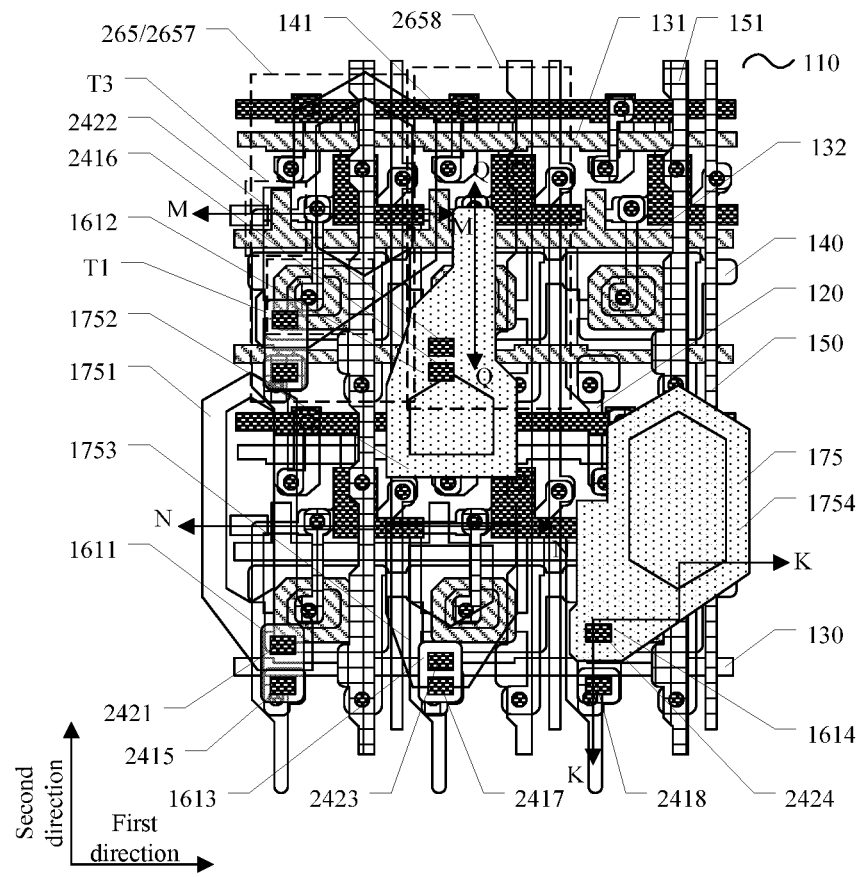
FIG. 33 is a partial schematic diagram of a display substrate according to an embodiment of the present disclosure.
Figure 34:
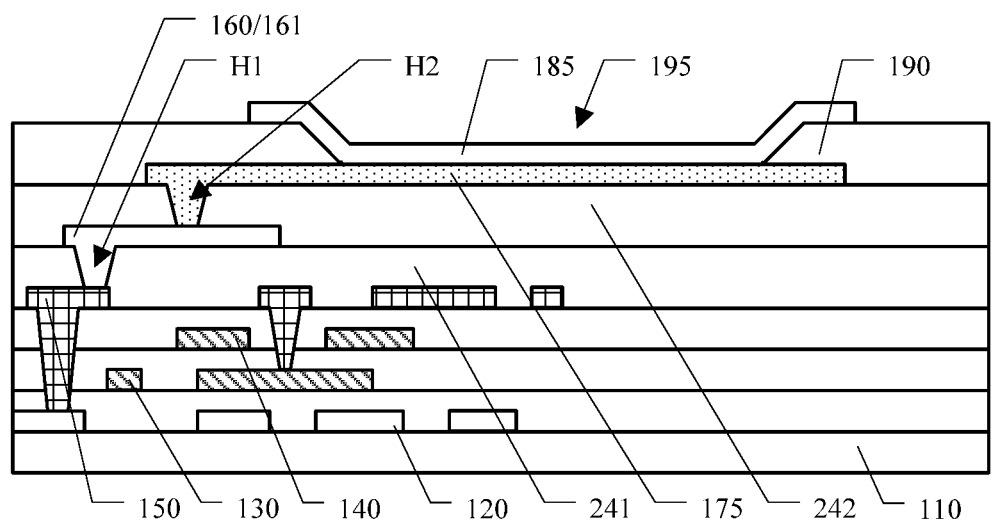
FIG. 34 is a schematic section view of a display substrate according to an embodiment of the present disclosure along the KK direction in FIG. 33.
Figure 35A:
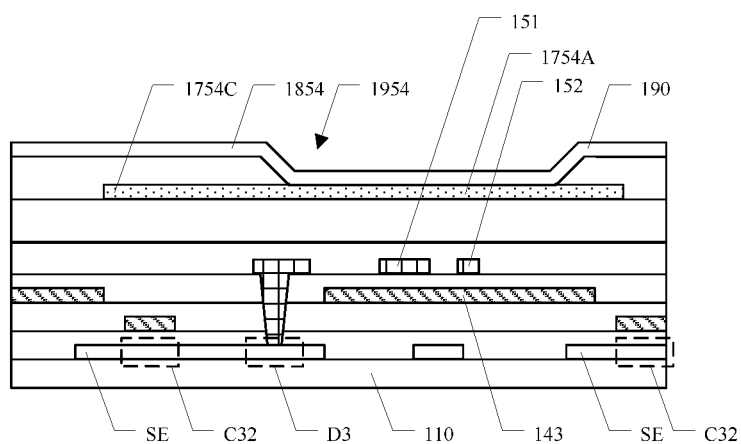
FIG. 35A is a schematic section view of a display substrate according to an embodiment of the present disclosure along the MM direction in FIG. 33.
Figure 35B:
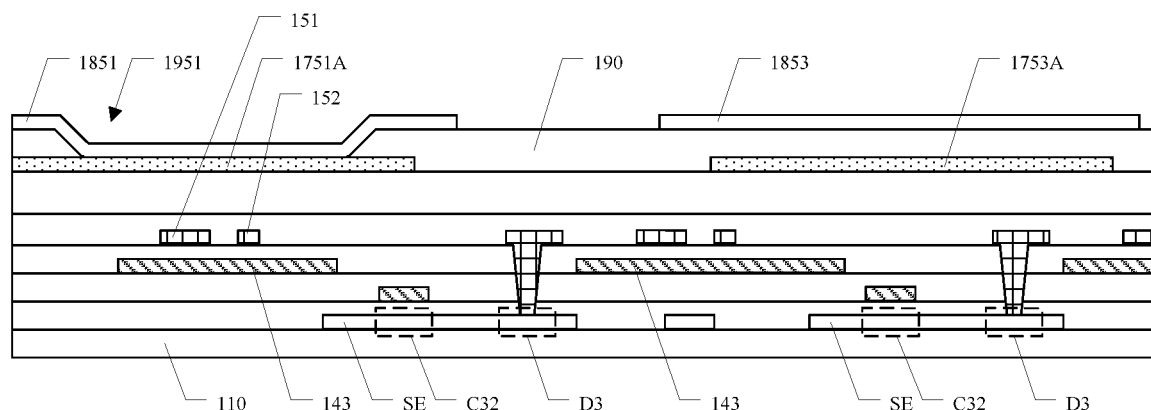
FIG. 35B is a schematic section view of a display substrate according to an embodiment of the present disclosure along the NN direction in FIG. 33.
Figure 35C:
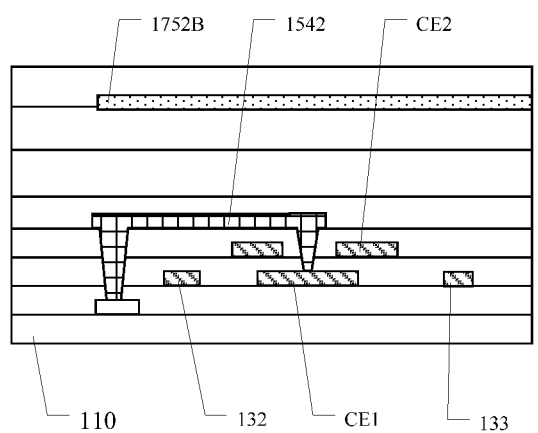
FIG. 35C is a schematic section view of a display substrate according to an embodiment of the present disclosure along the QQ direction in FIG. 33.

An embodiment of the present disclosure provides a display substrate. FIG. 33 is a partial schematic diagram of a display substrate according to an embodiment of the present disclosure. FIG. 34 is a schematic cross-sectional view of a display substrate according to an embodiment of the present disclosure along a KK direction in FIG. 33. FIG. 35A is a schematic cross-sectional view of a display substrate according to an embodiment of the present disclosure along an MM direction in FIG. 33. FIG. 35B is a schematic cross-sectional view of a display substrate according to an embodiment of the present disclosure along an NN direction in FIG. 33. FIG. 35C is a schematic cross-sectional view of a display substrate according to an embodiment of the present disclosure along a QQ direction in FIG. 33.

As illustrated by FIG. 33 and FIG. 34, the display substrate 100 includes a base substrate 110, a pixel circuit layer 260, and an anode layer 170. The pixel circuit layer 260 is located on the base substrate 110 and includes a plurality of pixel driving circuits 265. The anode layer 170 is located on a side of the pixel circuit layer 260 away from the base substrate 110 and includes a plurality of anodes 175. The plurality of pixel driving circuits 265 and the plurality of anodes 175 are disposed in a one-to-one correspondence manner. Each pixel driving circuit 265 includes a functional thin film transistor, such as a compensating thin film transistor T3. The plurality of pixel driving circuits 265 include a first pixel driving circuit 2657 and a second pixel driving circuit 2658 that are adjacent to each other. Orthographic projections of a channel region of the compensating thin film transistor T3 in the first pixel driving circuit 2657 and a channel region of the compensating thin film transistor T3 in the second pixel driving circuit 2658 on the base substrate 110 both overlap the orthographic projection of the anode 175 corresponding to the first pixel driving circuit 2657 on the base substrate 110. It should be noted that, "first" and "second" in the foregoing first pixel driving circuit and second pixel driving circuit are only used for literally distinguishing the two pixel driving circuits. The specific structures of the two pixel driving circuits are the same. In addition, the foregoing functional thin film transistor may alternatively be another thin film transistor in the pixel driving circuit.

In the display substrate provided in this embodiment of the present disclosure, because the orthographic projections of the channel region of the compensating thin film transistor T3 in the first pixel driving circuit 2657 and the channel region of the compensating thin film transistor T3 in the second pixel driving circuit 2658 on the base substrate 110 both overlap the orthographic projection of the anode 175 corresponding to the first pixel driving circuit 2657 on the base substrate 110, the anode 175 corresponding to the first pixel driving circuit 2657 can partially shield or completely shield the channel region of the compensating thin film transistor T3 in the first pixel driving circuit 2657 and the channel region of the compensating thin film transistor T3 in the second pixel driving circuit 2658. Therefore, in the display substrate, the stability and the service life of the compensating thin film transistor T3 in the first pixel driving circuit and the compensating thin film transistor T3 in the second pixel driving circuit 2658 can be improved, thereby improving the long-term light emission stability and the service life of the display substrate. FIG. 30A to FIG. 30D are schematic planar diagrams of a plurality of films in a display substrate according to an embodiment of the present disclosure. FIG. 31 is an equivalent schematic diagram of a pixel driving circuit in a display substrate according to an embodiment of the present disclosure. The pixel driving circuit uses a 7T1C pixel driving structure. At a light emitting stage, a voltage of a node N3 may control an on/off state of the first thin film transistor T1 (that is, the drive thin film transistor), and the stability of the first thin film transistor T1 directly affects the long-term light emission stability of the OLED display device. At a charging stage, a charging voltage of the node N3 is related to the states of the third thin film transistor T3 (that is, the compensating thin film transistor), the first thin film transistor T1, and the second thin film transistor T2. Usually, the thin film transistor is particularly sensitive to illumination. When illuminated, the thin film transistor (particularly the channel region) easily causes the characteristic of the thin film transistor to drift, affecting normal work of the pixel driving circuit. In this embodiment of the present disclosure, the channel region of the compensating thin film transistor is shield through an anode, so that the stability and the service life of the compensating thin film transistor can be improved, thereby improving the long-term light emission stability and the service life of the display substrate.

In some examples, as illustrated by FIG. 33 to FIG. 35C, the channel region of the compensating thin film transistor T3 in the first pixel driving circuit 2657 and the channel region of the compensating thin film transistor T3 in the second pixel driving circuit 2658 both fall into the orthographic projection of the anode 175 (corresponding to the fourth anode 1754) corresponding to the first pixel driving circuit 2657 on the base substrate 110, and the anode 175 corresponding to the first pixel driving circuit 2657 can completely shield the channel region of the compensating thin film transistor T3 in the first pixel driving circuit 2657 and the channel region of the compensating thin film transistor T3 in the second pixel driving circuit 2658, to further improve the stability and the service life of the compensating thin film transistor, thereby improving the long-term light emission stability and service life of the display substrate.

In some examples, as illustrated by FIG. 30A, the compensating thin film transistor T3 may be a thin film transistor with a dual-gate electrode structure, to improve the reliability of the compensating thin film transistor. The channel region of the compensating thin film transistor T3 includes a first channel region C1 and a second channel region C2 that are spaced from each other. The compensating thin film transistor T3 further includes a common electrode SE located between the first channel region C1 and the second channel region C2. As illustrated by FIG. 33 to FIG. 35B, orthographic projections of the common electrode SE of the compensating thin film transistor T3 in the first pixel driving circuit 2657 and the common electrode SE of the compensating thin film transistor T3 in the second pixel driving circuit 2658 on the base substrate 110 both overlap the orthographic projection of the anode 175 corresponding to the first pixel driving circuit 2657 on the base substrate 110. Therefore, the anode 175 corresponding to the first pixel driving circuit 2657 can partially shield or completely shield the common electrode SE of the compensating thin film transistor T3 in the first pixel driving circuit 2657 and the common electrode SE of the compensating thin film transistor T3 in the second pixel driving circuit 2658, to improve the stability and the service life of the compensating thin film transistor, thereby improving the long-term light emission stability and the service life of the display substrate.

Figure 36:
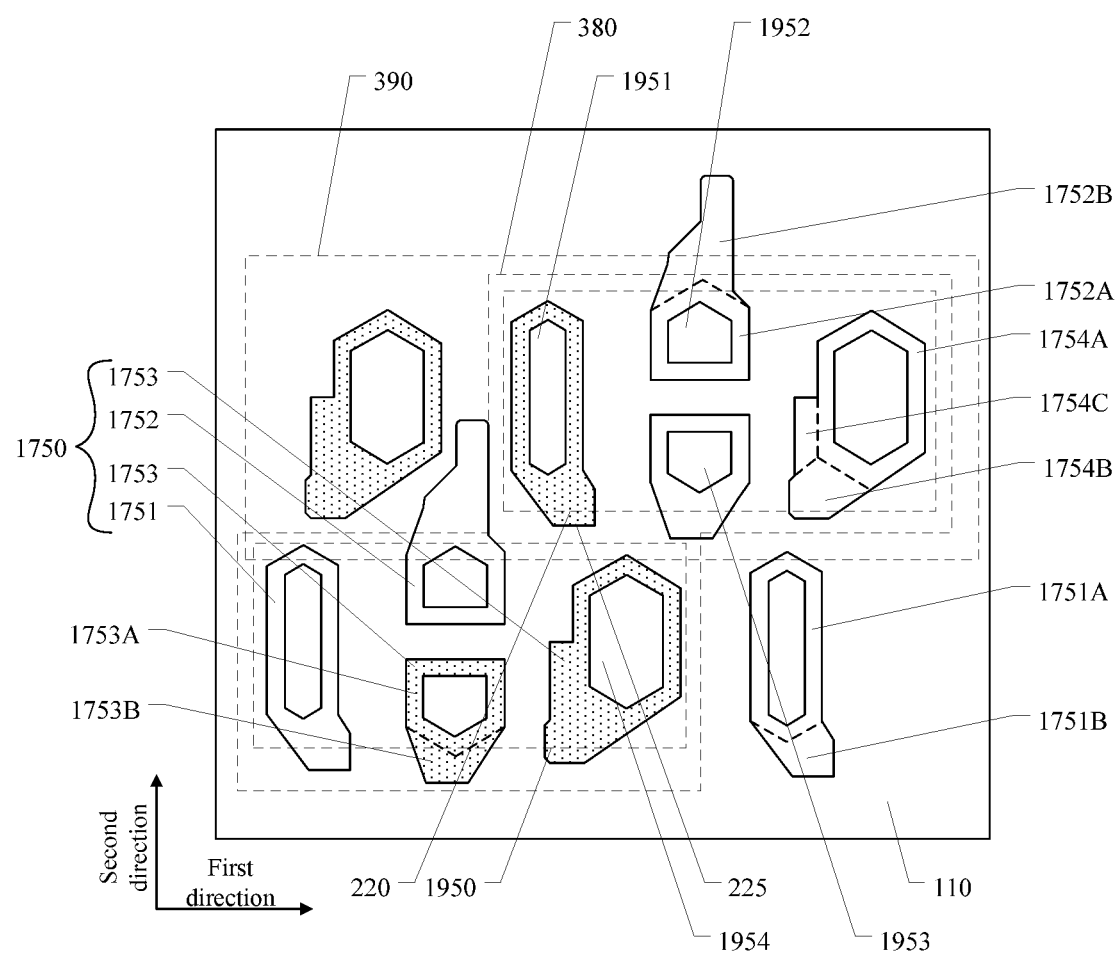
FIG. 36 is a schematic plan view of another display substrate according to an embodiment of the present disclosure.

FIG. 36 is a schematic planar diagram of another display substrate according to an embodiment of the present disclosure. As illustrated by FIG. 36, the plurality of anodes 175 include a plurality of anode groups 1750. Each of the anode groups 1750 includes a first anode 1751, a second anode 1752, a third anode 1753, and a fourth anode 1754. It should be noted that, the foregoing first anode, second anode, third anode, and fourth anode may be anodes of sub-pixels of different shapes and different colors. Certainly, this embodiment of the present disclosure includes but is not limited thereto. At least two of the foregoing first anode, second anode, third anode, and fourth anode may be anodes of sub-pixels of the same shape and the same color.

In some examples, as illustrated by FIG. 36, the plurality of anodes 175 include a plurality of anode groups 1750. The plurality of anode groups 1750 are arranged along the first direction to form a plurality of anode group columns 380, and are arranged along the second direction to form a plurality of anode group rows 390. Each of the anode groups 1750 includes a first anode 1751, a second anode 1752, a third anode 1753, and a fourth anode 1754. Two adjacent anode group rows 390 are offset from each other by ½ pitch. The pitch is equal to a distance between centers of two first anodes 1751 in two anode groups 1750 that are adjacent in the first direction. The second anode 1752 and the third anode 1753 are arranged along the second direction to form an anode pair 1755. The first anode 1751, the anode pair 1755, and the fourth anode 1754 are arranged along the second direction. Therefore, the display substrate can provide a pixel arrangement structure, so that the display effect of a display device using the display substrate can be improved. It should be noted that, the anode group provided in this embodiment of the present disclosure includes but not limited to the foregoing pixel arrangement structure. In addition, the center of the first anode is a center of a body portion of the first anode, that is, the effective light emitting region of the first light emitting element corresponding to the first anode. For example, the first direction is approximately perpendicular to the second direction. It should be noted that, that the first direction is approximately perpendicular to the second direction includes a case that an angle between the first direction and the second direction is 90 degrees, and also includes a case that the angle between the first direction and the second direction ranges from 85 degrees to 95 degrees.

In some examples, as illustrated by FIG. 33, the first pixel driving circuit 2657 and the second pixel driving circuit 2658 are disposed along the first direction. The fourth anode 1754 in an anode group 1750 is disposed corresponding to and electrically connected to the first pixel driving circuit 2657, and the second anode 1752 in another anode group 1750 is disposed corresponding to and electrically connected to the second pixel driving circuit 2658.

In some examples, as illustrated by FIG. 33, FIG. 34, and FIG. 36, the display substrate 100 further includes a pixel defining layer 190. The pixel defining layer 190 is located on a side of the anode layer 170 away from the base substrate 110 and includes a plurality of openings 195. The plurality of openings 195 include a plurality of opening groups 1950. Each opening group 1950 includes a first opening 1951, a second opening 1952, a third opening 1953, and a fourth opening 1954. The first opening 1951 is disposed corresponding to the first anode 1751 and exposes the first anode 1751. The second opening 1952 is disposed corresponding to the second anode 1752 and exposes the second anode 1752. The third opening 1953 is disposed corresponding to the third anode 1753 and exposes the third anode 1753. The fourth opening 1954 is disposed corresponding to the fourth anode 1754 and exposes the fourth anode 1754.

As illustrated by FIG. 33 and FIG. 36, the first anode 1751 includes a first body portion 1751A and a first connection portion 1751B. The orthographic projection of the first opening 1951 on the base substrate 110 falls into the orthographic projection of the first body portion 1751A on the base substrate 110. The first connection portion 1751B is connected to a pixel driving circuit 265 corresponding to the first anode 1751. The second anode 1752 includes a second body portion 1752A and a second connection portion 1752B. The orthographic projection of the second opening 1952 on the base substrate 110 falls into the orthographic projection of the second body portion 1752A on the base substrate 110, and the second connection portion 1752B is connected to the pixel driving circuit 265 corresponding to the second anode 1752. The third anode 1753 includes a third body portion 1753A and a third connection portion 1753B. The orthographic projection of the third opening 1953 on the base substrate 110 falls into an orthographic projection of the third body portion 1753A on the base substrate 110, and the third connection portion 1753B is connected to the pixel driving circuit 265 corresponding to the third anode 1753. The fourth anode 1754 includes a fourth body portion 1754A and a fourth connection portion 1754B. The orthographic projection of the fourth opening 1954 on the base substrate 110 falls into an orthographic projection of the fourth body portion 1754A on the base substrate 110, and the fourth connection portion 1754B is connected to the pixel driving circuit 265 (for example, the foregoing first pixel driving circuit 2657) corresponding to the fourth anode 1754.

In some examples, as illustrated by FIG. 33 and FIG. 36, the shape of the first body portion 1751A is approximately the same as that of the first opening 1951; the shape of the second body portion 1752A is approximately the same as that of the second opening 1952; the shape of the third body portion 1753A is approximately the same as that of the third opening 1953; and the shape of the fourth body portion 1754A is approximately the same as that of the fourth opening 1954. For example, when the shape of the fourth opening 1954 is a hexagon, the shape of the fourth body portion 1754A is also a hexagon. Certainly, the shapes of the fourth opening and the fourth body portion are not limited to the hexagon, and may be, for example, other shapes such as an ellipse.

For example, as illustrated by FIG. 33 to FIG. 36, the fourth anode 1754 further includes a first supplementing portion 1754C. The orthographic projections of the first channel region C31 and the second channel region C32 of the compensating thin film transistor T3 in the first pixel driving circuit 2657 corresponding to the fourth anode 1754 on the base substrate 110 separately overlap the orthographic projection of the first supplementing portion 1754C on the base substrate 110. In this display substrate, the first supplementing portion is added to the fourth anode, so that the fourth anode can cover two channel regions of the compensating thin film transistor in a corresponding one of the pixel driving circuits, to improve the stability and the service life of the compensating thin film transistor, thereby improving the long-term light emission stability and the service life of the display substrate.

In some examples, as illustrated by FIG. 33 to FIG. 36, the first supplementing portion 1754C is protruded from the fourth body portion 1754A toward the third anode 1753, and the first supplementing portion 1754C is located on a side of the fourth connection portion 1754B close to the fourth body portion 1754A. In some examples, as illustrated by FIG. 33 to FIG. 36, the first supplementing portion 1754C is connected to both the fourth body portion 1754A and the fourth connection portion 1754B. Therefore, the display substrate can fully use the area on the display substrate, to densely arrange the first anode, the second anode, the third anode, and the fourth anode, so that the resolution of the display substrate can be ensured.

In some examples, as illustrated by FIG. 35A, the orthographic projection of the first supplementing portion 1754C on the base substrate 110 is partially overlapped with the orthographic projection of the common electrode SE of the compensating thin film transistor T3 on the base substrate 110.

For example, as illustrated by FIG. 35A, the orthographic projection of the first supplementing portion 1754C on the base substrate 110 covers the orthographic projection of the second channel region C32 of the compensating thin film transistor T3 on the base substrate 110.

For example, as illustrated by FIG. 35A, the orthographic projection of the fourth body portion 1754A on the base substrate 110 covers the drain region D3 of the compensating thin film transistor T3. For example, as illustrated by FIG. 35C, the first conductive layer 150 includes a second connection block 1542. The second connection block 1542 is configured to connect a drain region of a compensating thin film transistor to the first electrode block CE1. The first electrode block CE1 may form a storage capacitor with the second electrode block CE2, and is also used as a gate electrode of a drive thin film transistor. Because the connection portion 1752B of the second anode 1752 extends away from the third anode 1753 and is overlapped with the second connection block 1542, and even covers the foregoing second connection block 1542, the connection portion 1752B can stabilize electric potentials on the gate electrode of the drive thin film transistor and the drain electrode of the compensating thin film transistor, thereby improving the long-term light emission stability and the service life of the display substrate.

Figure 37A:
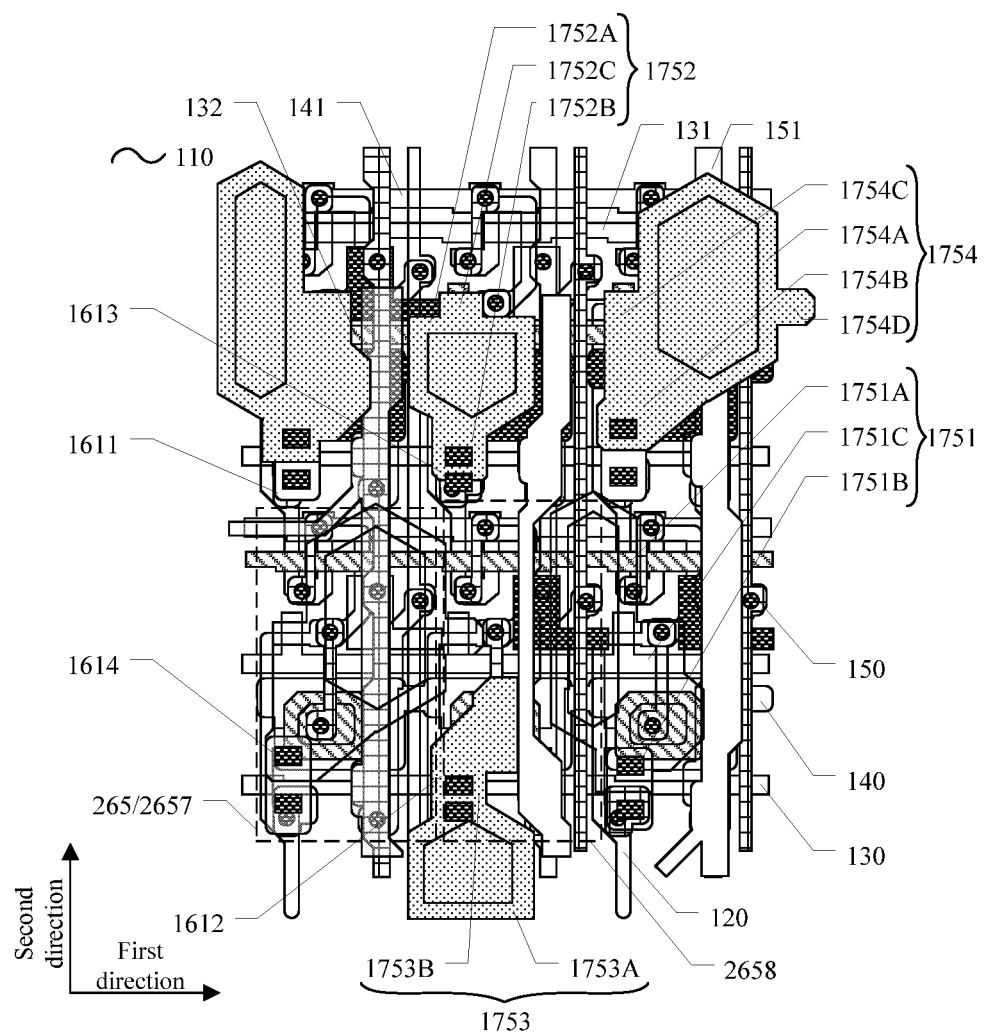
FIG. 37A is a partial schematic diagram of another display substrate according to an embodiment of the present disclosure.
Figure 37B:
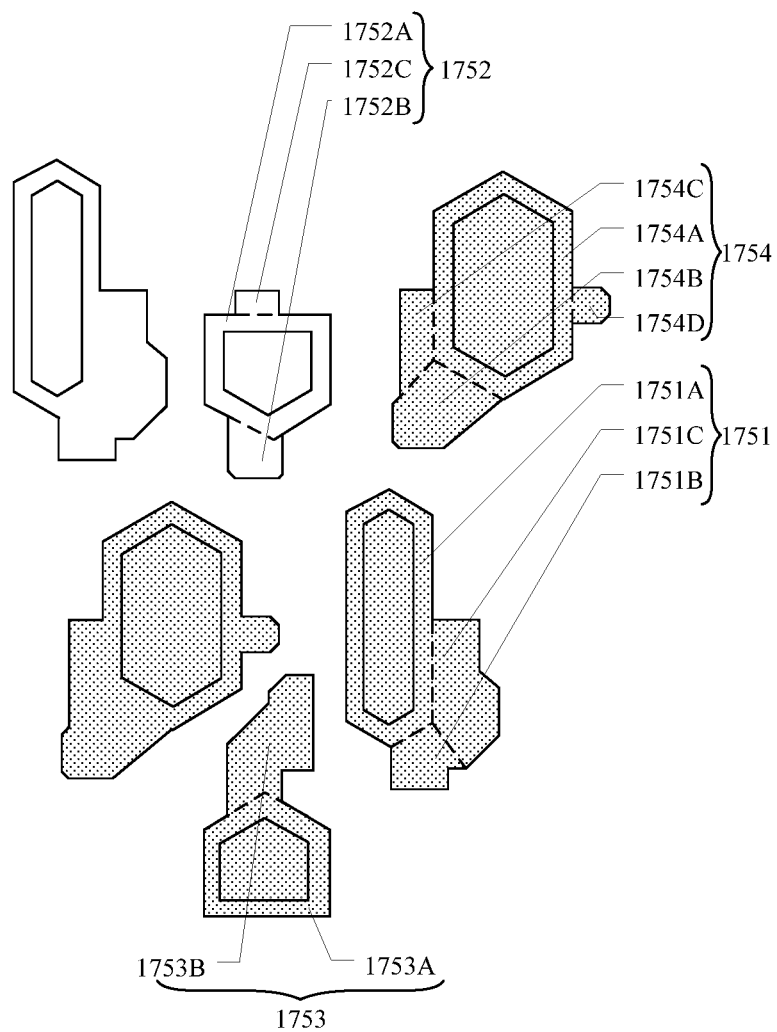
FIG. 37B is a partial schematic diagram of another display substrate according to an embodiment of the present disclosure.

FIG. 37A is a partial schematic diagram of another display substrate according to an embodiment of the present disclosure. FIG. 37B is a partial schematic diagram of another display substrate according to an embodiment of the present disclosure. To clearly show the shapes of the anodes, FIG. 37B shows only the anode layer.

As illustrated by FIG. 37A and FIG. 37B, the fourth anode 1754 further includes a second supplementing portion 1754D. The orthographic projection of the second channel region C2 of the compensating thin film transistor T3 in the second pixel driving circuit 2658 on the base substrate 110 is overlapped with the orthographic projection of the second supplementing portion 1754D on the base substrate 110. The second supplementing portion is added to the fourth anode, so that the fourth anode can partially or even completely cover the second channel region C2 of the compensating thin film transistor T3 in the second pixel driving circuit 2658, to improve the stability and the service life of the compensating thin film transistor, thereby improving the long-term light emission stability and the service life of the display substrate.

In some examples, as illustrated by FIG. 37A and FIG. 37B, the second supplementing portion 1754D is protruded from the fourth body portion 1754A toward the first anode 1751 in the anode group 1750 adjacent in the first direction.

It should be noted that, as illustrated by FIG. 37A and FIG. 37B, the orthographic projection of the first channel region C1 of the compensating thin film transistor T3 in the second pixel driving circuit 2658 can fall into the orthographic projection of the fourth body portion 1754A on the base substrate 110.

In some examples, as illustrated by FIG. 37A and FIG. 37B, the orthographic projection of the common electrode SE of the compensating thin film transistor T3 in the first pixel driving circuit 2657 on the base substrate 110 is overlapped with the orthographic projection of the first supplementing portion 1754C on the base substrate 110. The orthographic projection of the common electrode SE of the compensating thin film transistor T3 in the second pixel driving circuit 2658 on the base substrate 110 is overlapped with the orthographic projection of the fourth body portion 1754A of the fourth anode 1754 corresponding to the first pixel driving circuit 2657 on the base substrate 110.

In some examples, as illustrated by FIG. 37A and FIG. 37B, the orthographic projection of the channel region of the compensating thin film transistor T3 in the pixel driving circuit 265 corresponding to the first anode 1751 falls into the orthographic projection of the first body portion 1751A on the base substrate 110.

Figure 38:
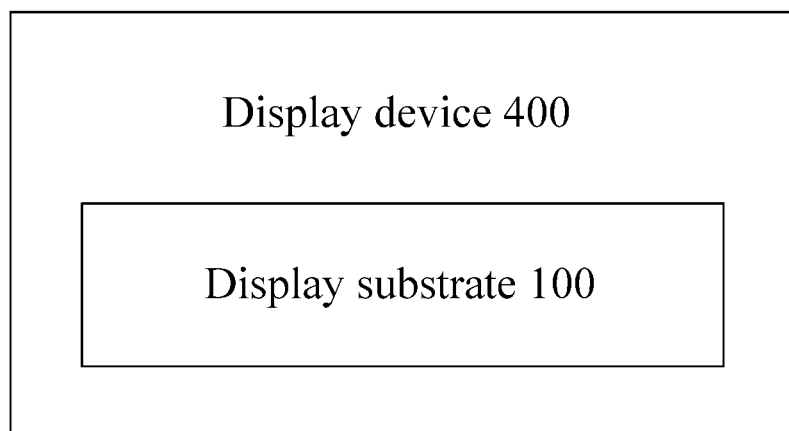
FIG. 38 is a schematic diagram of a display device according to an embodiment of the present disclosure.

In some examples, as illustrated by FIG. 38, the pixel driving circuit 265 further includes a drive thin film transistor T1. A gate electrode G1 of the drive thin film transistor T1 is connected to a drain D3 of the compensating thin film transistor T3. As illustrated by FIG. 37A, the first anode 1751 further includes a third supplementing portion 1751C that produces from the first body portion 1751A toward the third anode 1753. The orthographic projections of the gate electrode G1 in the drive thin film transistor T1 and the drain D3 of the compensating thin film transistor T3 in the pixel driving circuit 265 corresponding to the first anode 1751 on the base substrate 110 fall into the orthographic projection of the third supplementing portion 1751C on the base substrate 110. Therefore, in the display substrate, the electric potentials on the gate electrode G1 of the drive thin film transistor T1 and the drain D3 of the compensating thin film transistor T3 can be stabilized through the third supplementing portion 1751C, thereby improving the long-term light emission stability and the service life of the display substrate.

In some examples, as illustrated by FIG. 37A and FIG. 37B, the orthographic projection of the first channel region C31 of the compensating thin film transistor T3 in the pixel driving circuit 265 corresponding to the third anode 1753 on the base substrate 110 falls into the orthographic projection of the third body portion 1753A on the base substrate 110.

In some examples, as illustrated by FIG. 37A and FIG. 37B, the third anode 1753 further includes a fourth supplementing portion 1753C. The orthographic projection of the second channel region C32 of the compensating thin film transistor T3 in the pixel driving circuit 265 corresponding to the third anode 1753 on the base substrate 110 falls into the orthographic projection of the fourth supplementing portion 1753C on the base substrate 110. Therefore, the body portion and the fourth supplementing portion of the third anode can partially or completely shield the first channel region C31 and the second channel region C32 of the compensating thin film transistor T3 in the pixel driving circuit 265 corresponding to the third anode 1753, to improve the stability and the service life of the compensating thin film transistor, thereby improving the long-term light emission stability and the service life of the display substrate.

In some examples, as illustrated by FIG. 33 and FIG. 34, the pixel circuit layer 260 further includes a semiconductor layer 120, a first gate electrode layer 130, a second gate electrode layer 140, and a first conductive layer 150. The first gate electrode layer 130 is located on a side of the semiconductor layer 120 away from the base substrate 110. The second gate electrode layer 140 is located on a side of the first gate electrode layer 130 away from the base substrate 110. The first conductive layer 150 is located on a side of the second gate electrode layer 140 away from the base substrate 110.

For example, as illustrated by FIG. 30A, the semiconductor layer 120 includes a plurality of pixel driving units 1200, disposed corresponding to the plurality of anodes 175. Each pixel driving unit 1200 includes a first unit 121, a second unit 122, a third unit 123, a fourth unit 124, a fifth unit 125, a sixth unit 126, and a seventh unit 127. The first unit 121 includes a first channel region C1 and a first source region S1 and a first drain region D1 located on both sides of the first channel region C1. The second unit 122 includes a second channel region C2 and a second source region S2 and a second drain region D2 located on both sides of the second channel region C2. The third unit 123 includes a third channel region C3 and a third source region S3 and a third drain region D3 located on both sides of the third channel region C3. The fourth unit 124 includes a fourth channel region C4 and a fourth source region S4 and a fourth drain region D4 located on both sides of the fourth channel region C4. The fifth unit 125 includes a fifth channel region C5 and a fifth source region S5 and a fifth drain region S5 located on both sides of the fifth channel region C5. The sixth unit 126 includes a sixth channel region C6 and a sixth source region S6 and a sixth drain region D6 located on both sides of the sixth channel region C6. The seventh unit 127 includes a seventh channel region C7 and a seventh source region S7 and a seventh drain region D7 located on both sides of the seventh channel region C7.

For example, as illustrated by FIG. 30A and FIG. 31, the sixth drain region D6 is connected to the third drain region D3, the third source region S3, the first drain region D1, and the fifth source region S5 are connected to a first node N1, the first source region S1, the second drain region D2, and the fourth drain region D4 are connected to a second node N2, and the fifth drain region D5 is connected to the seventh drain region D7.

For example, as illustrated by FIG. 30B, the first gate electrode layer 130 includes a reset signal line 131 extending along the first direction, a gate electrode line 132 and a first electrode block CE1 that extend along the first direction, and an emission control line 133 that extends along the first direction. The reset signal line 131 may overlap the seventh channel region C7 and the sixth channel region C6, to form the seventh thin film transistor T7 and the sixth thin film transistor T6 with the seventh unit 127 and the sixth unit 126. The gate electrode line 132 is separately overlapped with the third channel region C3 and the second channel region C2, to form the third thin film transistor T3 and the second thin film transistor T2 with the third unit 123 and the second unit 122. The first electrode block CE1 is overlapped with the first channel region C1, to form the third thin film transistor T1 with the first unit 121. The emission control line 133 is overlapped with the fourth channel region C4 and the fifth channel region C5, to form the fourth thin film transistor T4 and the fifth thin film transistor T5 with the fourth unit 124 and the fifth unit 125. It can be learned that, the foregoing thin film transistor T3 is a compensating thin film transistor.

For example, as illustrated by FIG. 30B, the reset signal line 131, the gate electrode line 132, and the emission control line 133 all extend along the first direction, and the reset signal line 131, the gate electrode line 132, the first electrode block CE1, and the emission control line 133 are arranged along the second direction.

For example, as illustrated by FIG. 30C, the second gate electrode layer 140 includes an initialization signal line 141, a second electrode block CE2 and a conductive block 143 that extend along the first direction. For example, the conductive block 143 may be connected to a power line, to reduce resistance of the power line. In addition, the initialization signal line 141 is connected to the seventh source region S7 and the first source region S1. The orthographic projection of the second electrode block CE2 on the base substrate 110 is at least partially overlapped with the orthographic projection of the first electrode block CE1 on the base substrate 110, to form a storage capacitor Cst. It should be noted that, the conductive block can also implement a light shielding function. In addition, the conductive block on the leftmost side of FIG. 33 shows only a part, and the shape of the conductive block on the leftmost side of FIG. 33 is the same as the shapes of other conductive blocks.

For example, as illustrated by FIG. 30D, the first conductive layer 150 includes a power line 151, a data line 152, a first connection block 1541, a second connection block 1542, and a third connection block 1543 that extend along the second direction. The data line 152 may be connected to the second source region S2. The fourth source region S4 is connected to the power line 151. The first connection block 1541 is configured to connect the initialization signal line 141 to the sixth source region S6 and the seventh source region S7. The second connection block 1542 is configured to connect the third drain region D3 to the first electrode block CE1. The third connection block 1543 is connected to the fifth drain region D5, and may be connected to a corresponding anode as a drain.

The following schematically describes a working manner of the pixel driving circuit shown in FIG. 31. First, when a reset signal is transmitted to the reset signal line 131 to conduct the seventh thin film transistor T7, remaining current that flows through the anode of each sub-pixel is discharged to the sixth thin film transistor T6 through the seventh thin film transistor T7, to inhibit light emission caused by the remaining current that flows through the anode of each sub-pixel. Then, when a reset signal is transmitted to the reset signal line 131 and an initialization signal is transmitted to the initialization signal line 141, the sixth thin film transistor T6 is conducted, and an initialization voltage Vint is applied to a first gate electrode of the first thin film transistor T1 and the first electrode block CE1 of the storage capacitor Cst through the sixth thin film transistor T6, so that the first gate electrode and the storage capacitor Cst are initialized. The initialization of the first gate electrode can conduct the first thin film transistor T1.

Subsequently, when a gate electrode signal is transmitted to the gate electrode line 132 and a data signal is transmitted to the data line 152, both the second thin film transistor T2 and the third thin film transistor T3 are conducted, and a data voltage Vd is applied to the first gate electrode through the second thin film transistor T2 and the third thin film transistor T3. In this case, the voltage applied to the first gate electrode is a compensating voltage Vd+Vth, and the compensating voltage applied to the first gate electrode is also applied to the first electrode block CE1 of the storage capacitor Cst.

Subsequently, the power line 151 applies a drive voltage Vel to the second electrode block CE2 of the storage capacitor Cst, and applies the compensating voltage Vd+Vth to the first electrode block CE1, so that charges corresponding to a difference between voltages that are respectively applied to two electrodes of the storage capacitor Cst are stored in the storage capacitor Cst, and conduction of the first thin film transistor T1 reaches preset time.

Subsequently, when an emission control signal is applied to the emission control line 133, both the fourth thin film transistor T4 and the fifth thin film transistor T5 are conducted, so that the fourth thin film transistor T4 applies the drive voltage Vel to the fifth thin film transistor T5. When the drive voltage Vel runs through the first thin film transistor T1 conducted by the storage capacitor Cst, a difference between the corresponding drive voltage Vel and the voltage that is applied to the first gate electrode through the storage capacitor Cst drives current Id to flow through the first drain region D3 of the first thin film transistor T1, and drives the current Id to be applied to each sub-pixel through the fifth thin film transistor T5, so that the light emitting layer of each sub-pixel emits light.

In some examples, as illustrated by FIG. 33 and FIG. 34, the display substrate 100 further includes a first planarization layer 241, a second conductive layer 160, a second planarization layer 242, and an anode 175. The first planarization layer 241 is located on a side of the first conductive layer 150 away from the base substrate 110. The second conductive layer 160 is located on a side of the first planarization layer 241 away from the first conductive layer 150, and includes a connection electrode 161. The second planarization layer 242 is located on a side of the second conductive layer 160 away from the first planarization layer 241. The anode 175 is located on a side of the second planarization layer 242 away from the second conductive layer 160. The first planarization layer 241 includes a first via hole H1. The connection electrode 161 is connected to the sixth drain region S6 through the first via hole H1. The second planarization layer 242 includes a second via hole H2. The anode 175 is connected to the connection electrode 161 through the second via hole H2.

In some examples, as illustrated by FIG. 33, FIG. 34, and FIG. 36, the display substrate 100 further includes a light emitting layer 180, located on a side of the anode layer 170 away from the base substrate 110 and including a plurality of light emitting portions 185. The plurality of light emitting portions 185 include a plurality of light emitting groups 1850. Each light emitting group 1850 includes a first light emitting portion 1851, a second light emitting portion 1852, a third light emitting portion 1853, and a fourth light emitting portion 1854. The first light emitting portion 1851 is at least partially located in the first opening 1951 and covers an exposed portion of first anode 1751. The second light emitting portion 1852 is at least partially located in the second opening 1952 and covers an exposed portion of the second anode 1752. The third light emitting portion 1853 is at least partially located in the third opening 1953 and covers an exposed portion of the third anode 1753. The fourth light emitting portion 1854 is at least partially located in the fourth opening 1954 and covers an exposed portion of the fourth anode 1754. The first light emitting portion 1851 is configured to emit light of a first color. The second light emitting portion 1852 and the third light emitting portion 1853 are configured to emit light of a second color. The fourth light emitting portion 1854 is configured to emit light of a third color.

For example, the first color is red (R), the second color is green (G), and the third color is blue (B). That is, the display substrate uses a pixel arrangement structure of GGRB.

For example, as illustrated by FIG. 34, the area in which the first conductive portion 1621 located on a side of the first anode 1751 away from the second anode 1752 is overlapped with the power line 151 located in the first conductive layer 150 is less than the area in which the second conductive portion 1622 located on a side of the first anode 1751 close to the second anode 1752 is overlapped with the power line 151 in the first conductive layer 150.

An embodiment of the present disclosure provides a display device. FIG. 38 is a schematic diagram of a display device according to an embodiment of the present disclosure. As illustrated by FIG. 38, the display device 400 includes any foregoing display substrate 100. Therefore, the display device includes beneficial effects corresponding to the beneficial effects of the display substrate. Therefore, in the display device, the stability and the service life of the compensating thin film transistor can be improved, thereby improving the long-term light emission stability and the service life of the display substrate.

For example, the display device may be an electronic product that includes a display function, such as a TV, a computer, a notebook computer, a tablet computer, a mobile phone, a navigator, or an electronic photo frame.

Figure 39:
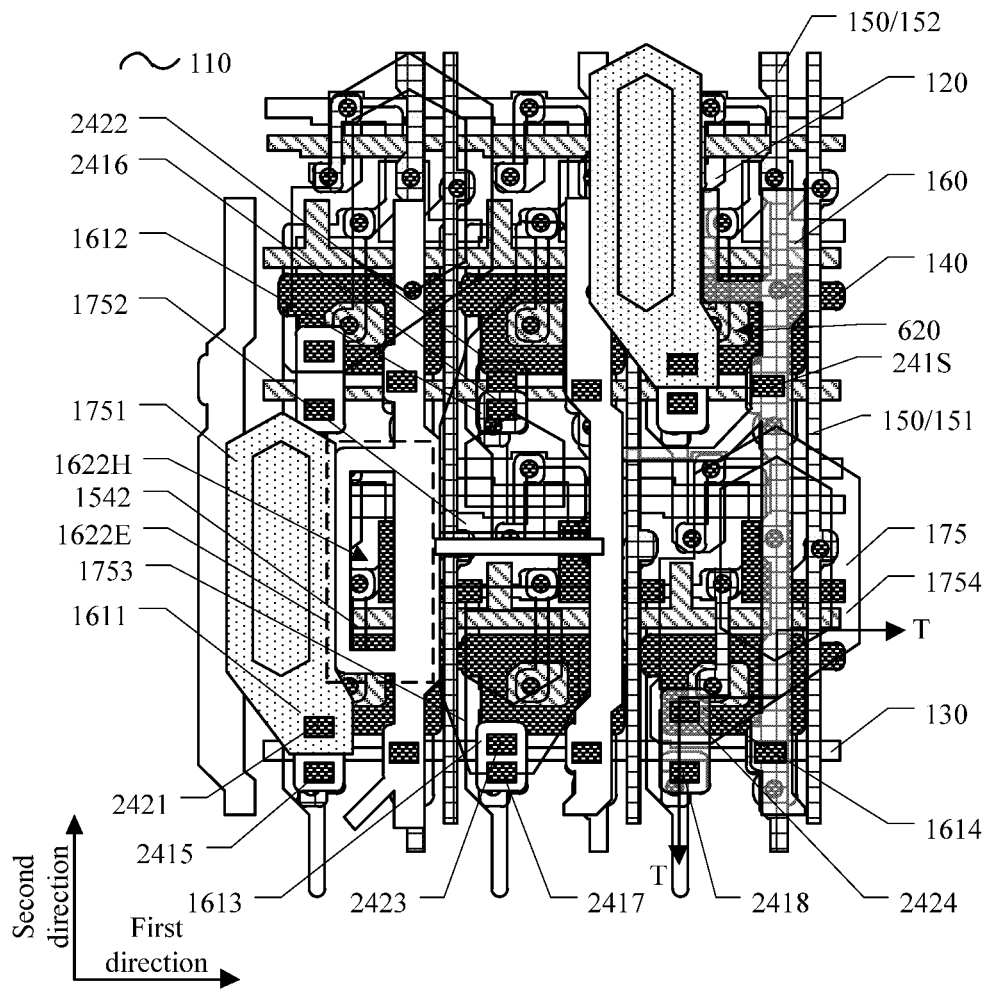
FIG. 39 is a schematic diagram of a display substrate according to an embodiment of the present disclosure.
Figure 40:
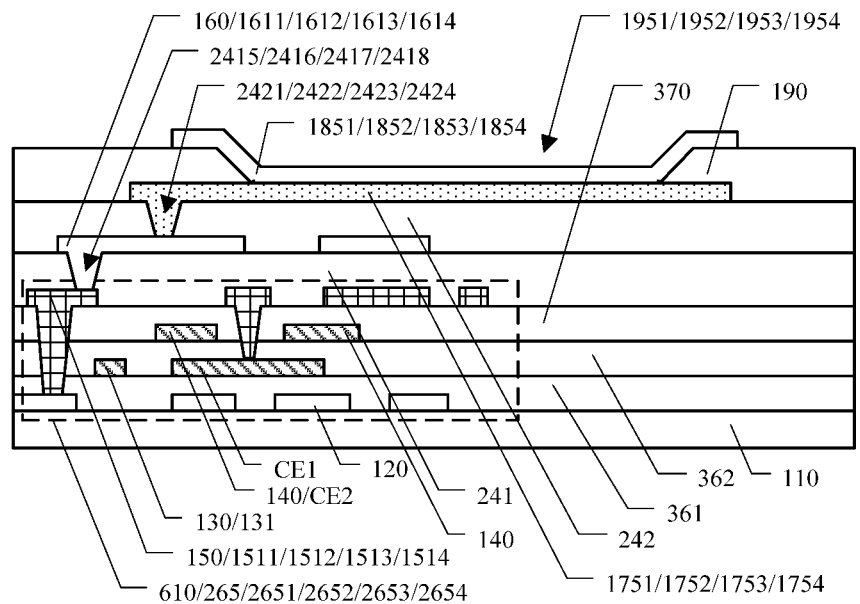
FIG. 40 is a schematic section view of a display substrate along line TT in FIG. 39.
Figure 41:
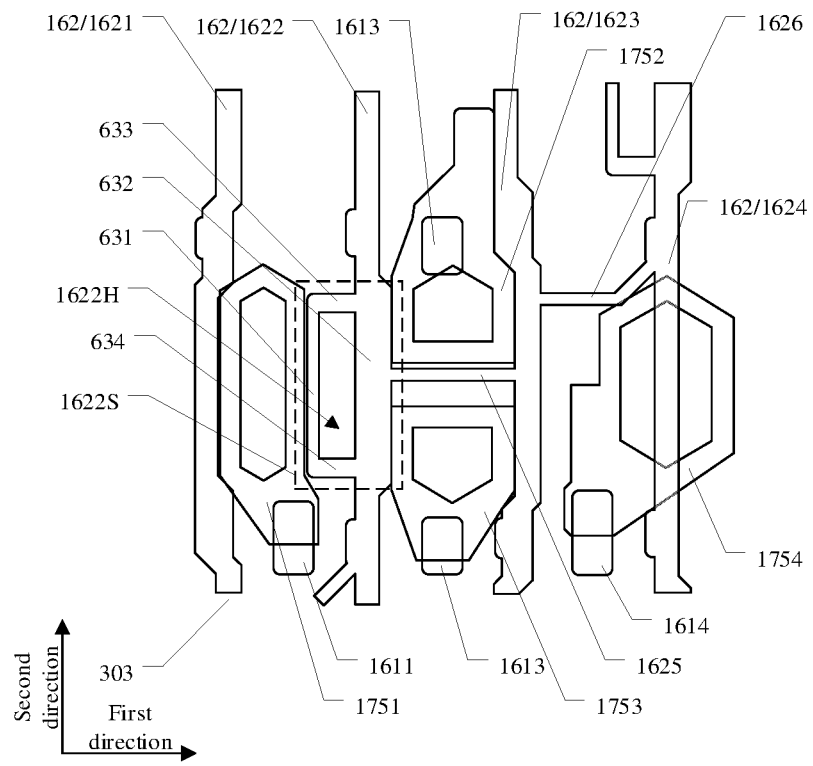
FIG. 41 is a schematic diagram of a second conductive layer and an anode layer in a display substrate according to an embodiment of the present disclosure.

An embodiment of the present disclosure further provides a display substrate. FIG. 39 is a schematic diagram of a display substrate according to an embodiment of the present disclosure; FIG. 40 is a schematic section view of a display substrate along line TT in FIG. 39; FIG. 41 is a schematic diagram of a second conductive layer and an anode layer in a display substrate according to an embodiment of the present disclosure.

As illustrated in FIGS. 39-41, the display substrate includes a base substrate 110, a pixel circuit layer 610, a first conductive layer 150, a first planarization layer 241, a second conductive layer 160, a second planarization layer 242, and a plurality of light emitting element groups 310. The pixel circuit layer 610 includes a plurality of pixel driving circuits 265, the plurality of pixel driving circuits 265 include a semiconductor layer 120. The first conductive layer 150 is located at a side of the semiconductor layer 120 away from the base substrate 110. The first planarization layer 241 is located at the side of the first conductive layer 150 away from the semiconductor layer 120. The second conductive layer 160 is located at the side of the first planarization layer 241 away from the first conductive layer 150. The second planarization layer 242 is located at the side of the second conductive layer 160 away from the base substrate 110. The plurality of light emitting element groups 310 are located at a side of the second planarization layer 242 away from the second conductive layer 160. The second conductive layer 160 includes a plurality of conductive portions 162 arranged along a first direction, the size of each conductive portion 162 in the second direction is greater than that in the first direction, and the second direction intersects with the first direction, the plurality of conductive portion 162 includes a first conductive portion 1622, the first conductive portion 1622 includes a closed annular portion 1622E, the closed annular portion 1622E includes a hollow region 1622H.

As illustrated in FIGS. 39-41, each light emitting element group 310 includes a first light emitting element 311, the first light emitting element 311 includes a first anode 1751, and the orthographic projection of the first anode 1751 on the base substrate 110 overlaps with the orthographic projection of the closed annular portion 1622E on the base substrate 110. The plurality of conductive portions 162 also include a second conductive portion 1621 adjacent to the first conductive portions 1622, and the orthographic projection of the second conductive portion 1621 on the base substrate 110 overlaps with the orthographic projection of the first anode 1751 on the base substrate 110.

In the display substrate provided by the embodiment of the present disclosure, by providing the closed annular portion 1622E, the first anode 1751 can overlap with the closed annular portion 1622E and the second conductive portion 1621 at the same time, so that the first anode 1751 can be kept flat and color cast caused by inclination can be avoided. In addition, because the closed annular portion 1622E has a hollow design, the light transmittance of the display substrate can be improved, and it is beneficial for the under-screen fingerprint recognition device to receive signals.

In some examples, as illustrated in FIGS. 39-41, the closed annular portion 1622E is separated from at least one conductive portion 162 adjacent thereto in the first direction in the second conductive layer 160, and the size of the closed annular portion 1622E in the first direction is at least greater than the size of a part of the first conductive portion 1622 in the first direction. The plurality of pixel driving circuits 265 include a first pixel driving circuit 2651, the first pixel driving circuit 2651 has a semiconductor pattern on the semiconductor layer 120, the orthographic projection of the first conductive portion 1622 on the base substrate 110 overlaps with the orthographic projection of the semiconductor pattern of the first pixel driving circuit 2651 on the base substrate 110. The first pixel driving circuit 2651 includes a driving transistor T1, the first conductive layer 150 includes a first conductive pattern 1542, the first conductive pattern 1542 has the same potential as the gate electrode of the driving transistor T1. The first conductive pattern 1542 and the gate electrode of the driving transistor T1 together constitute a gate electrode potential metal, and the orthographic projection of the hollow region 1622H inside the closed annular portion 1622E on the base substrate 110 overlaps with the orthographic projection of the gate electrode potential metal on the base substrate.

In the display substrate provided by the embodiment of the present disclosure, on the one hand, the closed annular portion 1622E can ensure higher flatness of the first anode 1751, thereby ensuring that the luminous intensity of the first anode 1751 in different directions is consistent, and then effectively alleviating the phenomenon of color cast; on the other hand, the orthographic projection of the hollow region 1622H inside the closed annular portion 1622E on the base substrate 110 overlaps with the orthographic projection of the gate electrode potential metal on the base substrate, so that the reset speed and charging speed of the gate electrode of the driving transistor can be improved.

In some examples, as illustrated in FIGS. 39-41, the inner side of the closed annular portion 1622E includes a hollow region 1622H, and the first conductive portion 1622 has a plurality of hollow regions 1622h arranged along the second direction. Two adjacent hollow regions 1622H have approximately the same shape and size. The first conductive portion 1622 can correspond to a plurality of first anodes 1751, so it has a plurality of hollow regions 1622H.

In some examples, as illustrated in FIGS. 39-41, the first light emitting element 311 includes an effective light emitting region, and the orthographic projection of a straight line passing through the center of the effective light emitting region of the first light emitting element 311 and extending along the second direction on the base substrate 110 is located between the orthographic projections of the first conductive portion 1622 and the second conductive portion 1621 on the base substrate 110.

In some examples, as illustrated in FIGS. 39-41, the two edges of the closed annular portion 1622E in the first direction respectively overlap with the orthographic projections of the anodes of the plurality of light emitting elements in the light emitting element group on the base substrate, and the orthographic projections of the hollow regions 1622H of the closed annular portion 1622E are separated from the orthographic projections of the effective light emitting regions of the plurality of light emitting elements on the base substrate 110 (i.e., arranged at intervals). Therefore, the display substrate can make full use of the space on the display substrate on the one hand, and avoid adverse effects on the display of light emitting elements on the other hand.

In some examples, as illustrated in FIGS. 39-41, the first conductive layer 150 further includes a conductive metal 152 configured to provide power to the pixel driving circuit 265, the first planarization layer 241 includes a conductive metal via hole 241S, and the conductive portion 162 is electrically connected with the conductive metal 152 through the power line via hole 241S; the first pixel driving circuit 2651 further includes a first light emitting control transistor T4 and a storage capacitor Cst, the storage capacitor includes a first electrode block CE1 and a second electrode block CE2, and the second electrode block CE2 is located at a side of the first electrode block CE1 away from the base substrate 110, and the conductive metal 152 is electrically connected with the source electrode of the first light emitting control transistor T4 and the second electrode block CE2, respectively. Therefore, the display substrate can reduce the resistance of conductive metal, reduce the voltage drop and improve the uniformity of the whole display panel through the plurality of conductive portions of the second conductive layer.

In some examples, as illustrated in FIGS. 39-41, the orthographic projection of the closed annular portion 1622E on the base substrate 110 overlaps with the orthographic projection of the first electrode block CE1 on the base substrate 110; the second electrode block CE2 includes an opening 620, and the orthographic projection of the opening 620 on the base substrate 110 overlaps with the orthographic projection of the first electrode block CE1 on the base substrate 110, and the orthographic projection of the closed annular portion 1622E on the base substrate 110 also overlaps with the orthographic projection of the opening 620 on the base substrate 110. Therefore, by shielding the capacitor electrode, the capacitor can be prevented from being excessively irradiated by light, and the capacitor potential is stabilized and the charging and discharging speed is fast.

In some examples, as illustrated in FIGS. 39-41, the first pixel driving circuit 2651 further includes a data writing transistor T2, a compensating transistor T3, a reset transistor T6, an anode initialization transistor T7, and a second light emitting control transistor T5. The display substrate further includes: a reset signal line 131, connected to the gate electrode of the reset transistor T6 and the gate electrode of the anode initialization transistor T7, respectively; a gate line 132, connected to the gate electrode of the compensating transistor T3 and the gate electrode of the data writing transistor T2, respectively; an emission control line 133, connected to the gate electrode of the first light emitting control transistor T4 and the gate electrode of the second light emitting control transistor T5, respectively; and an initialization signal line 141, connected to the source electrode of reset transistor T6 and the source electrode of anode initialization transistor T7, respectively, and the orthographic projection of closed annular portion 1622E on the base substrate 110 respectively overlaps with the orthographic projections of the reset signal line 131, the gate line 132 and the initialization signal line 133 on base substrate 110. Because the closed annular portion is hollow, the overlapping area with the reset signal line 131, the gate line 132 and the initialization signal line 133 is small, and potential interference to these signal lines can be avoided. It should be noted that the above layered schematic diagram of the pixel driving circuit and the connection relationship of each transistor can be seen in the related descriptions of FIGS. 30A-30D and FIG. 31.

In some examples, as illustrated in FIGS. 39-41, one end of the first conductive pattern 1542 is electrically connected to the gate electrode of the driving transistor T1 through the opening 620, and the other end of the first conductive pattern 1542 is electrically connected to the drain electrode or the source electrode of the compensating transistor T3. Accordingly, the first conductive pattern 1542 has the same potential as the gate electrode of the driving transistor T1.

In some examples, as illustrated in FIGS. 39-41, the closed annular portion 1622E includes a first portion 631 and a second portion 632 arranged along a first direction, and a third portion 633 and a fourth portion 634 arranged along a second direction. The first portion 631, the third portion 633, the second portion 632 and the fourth portion 634 are connected end to end to form the closed annular portion 1622E, and the orthographic projections of the first portion 631 and the second portion 632 on the base substrate 110 overlap with the orthographic projection of the second electrode block CE2 on the base substrate 110. Therefore, the capacitance of the storage capacitor Cst can be increased.

For example, the orthographic projection of the third portion 633 on the base substrate 110 overlaps with the orthographic projection of the second electrode block CE2 on the base substrate 110, so that the capacitance of the storage capacitor Cst can be further increased.

In some examples, as illustrated in FIGS. 39-41, the orthographic projection of the first portion 631 on the base substrate 110 overlaps with the orthographic projection of the first conductive pattern 1542 on the base substrate 110, and the first conductive pattern 1542 and the first conductive pattern 1542 are both elongated in shape, and the extending direction of the long edge of the first conductive pattern 1542 is the same as the extending direction of the long edge of the first portion 631. By making the extending direction of the first portion and the first conductive pattern the same, the area of the overlapping region of the first portion and the first conductive pattern is as small as possible, thereby reducing the load of the gate electrode of the driving transistor and improving the reset speed and charging speed of the gate electrode of the driving transistor.

In some examples, as illustrated in FIGS. 39-41, the first conductive layer 150 further includes a second conductive pattern 1541, the second conductive pattern 1541 is respectively connected with the initialization signal line 141 and the source electrode of the reset transistor T6. The orthographic projection of the third portion 633 on the base substrate 110 overlaps with the orthographic projection of the initialization signal line 141 on the base substrate 110, the orthographic projection of the third portion 633 on the base substrate 110 overlaps with the orthographic projection of the second conductive pattern 1541 on the base substrate 110, the orthographic projection of the fourth portion 634 on the base substrate 110 overlaps with the orthographic projection of the first conductive pattern 1542 on the base substrate 110.

In some examples, as illustrated in FIGS. 39-41, the orthographic projection of the hollow region 1622H on the base substrate 110 overlaps with the orthographic projection of the initialization signal line 141 on the base substrate 110, and the orthographic projection of the hollow region 1622H on the base substrate 110 overlaps with the orthographic projection of the second conductive pattern 1541 on the base substrate 110, the orthographic projection of the hollow region 1622H on the base substrate 110 overlaps with the orthographic projection of the second electrode block CE2 on the base substrate 110.

In some examples, as illustrated in FIGS. 39-41, the display substrate further includes: a second planarization layer 242 located at the side of the second conductive layer 160 away from the base substrate 110; and a plurality of light emitting element groups 310 located at a side of the second planarization layer 242 away from the second conductive layer 160. The plurality of light emitting element groups 310 are arranged along a first direction to form a plurality of light emitting element columns 320 and along a second direction to form a plurality of light emitting element rows 330. Each light emitting element group 310 includes a first light emitting element 311, a second light emitting element 312, a third light emitting element 313 and a fourth light emitting element 314. The second light emitting element 312 and the third light emitting element 313 are arranged along the second direction to form a light emitting element pair 315, and the first light emitting element 311, the light emitting element pair 315 and the fourth light emitting element 314 are arranged along the first direction. The first light emitting element 311 includes a first anode 1751, the second light emitting element 312 includes a second anode 1752, the third light emitting element 313 includes a third anode 1753, and the fourth light emitting element 314 includes a fourth anode 1754. The second conductive layer 160 includes a first connection electrode 1611, a second connection electrode 1612, a third connection electrode 1613 and a fourth connection electrode 1614, the second planarization layer 242 includes a first via hole 2421, a second via hole 2422, a third via hole 2423 and a fourth via hole 2424. The first anode 1751 is connected with the first connection electrode 1611 through the first via hole 2421, the second anode 1752 is connected to the second connection electrode 1612 through the second via hole 2422, the third anode 1753 is connected to the third connection electrode 1613 through the third via hole 2423, and the fourth anode 1754 is connected to the fourth connection electrode 1614 through the fourth via hole 2424.

In some examples, the first anode 1751 includes a main body portion, and the orthographic projection of the effective light emitting region of the first light emitting element 311 on the base substrate 110 is located within the orthographic projection of the main body portion of the first anode 1751 on the base substrate 110, and the main body portion of the first anode 1751 and the first anode 1751 have at least partially the same boundary. The second anode 1752 includes a main body portion, and the orthographic projection of the effective light emitting region of the second light emitting element 312 on the base substrate 110 is located within the orthographic projection of the main body portion of the second anode 1752 on the base substrate 110, and the main body portion of the second anode 1752 and the second anode 1752 have at least partially the same boundary. The third anode 1753 includes a main body portion, and the orthographic projection of the effective light emitting region of the third light emitting element 313 on the base substrate 110 is located within the orthographic projection of the main body portion of the third anode 1753 on the base substrate 110, and the main body portion of the third anode 1753 and the third anode 1753 have at least partially the same boundary. The fourth anode 1754 includes a main body portion, and the orthographic projection of the effective light emitting region of the fourth light emitting element 314 on the base substrate 110 is located within the orthographic projection of the main body portion of the fourth anode 1754 on the base substrate 110, and the main body portion of the fourth anode 1754 and the fourth anode 1754 have at least partially the same boundary.

In some examples, the plurality of conductive portions 162 include a second conductive portion 1621, the first conductive portion 1622 and the second conductive portion 1621 are respectively located at two sides of the effective light emitting region of the first light emitting element 311 in the first direction, and the distance between the orthographic projection of the closed annular portion 1622E on the base substrate 110 and the orthographic projection of the center of the effective light emitting region of the first light emitting element 311 on the base substrate 110 is approximately the same as the distance between the orthographic projection of the second conductive portion 1621 on the base substrate 110 and the orthographic projection of the center of the effective light emitting region of the first light emitting element 311 on the base substrate 110. Therefore, the closed annular portion 1622E can ensure high flatness of the first anode 1751, thereby ensuring that the luminous intensity of the first anode 1751 is consistent in different directions, and further effectively alleviating color cast.

In some examples, as illustrated in FIGS. 39-41, the orthographic projection of the first anode 1751 on the base substrate 110 overlaps with the orthographic projection of the emission control line 133 of the first pixel driving circuit 2651 on the base substrate 110. By overlapping the first anode with the emission control line, the connection electrode of the first anode located in the second conductive layer can be moved down, so that the center of the third conductive pattern in the first conductive layer overlaps with the emission control line, ensuring the flatness of the third conductive pattern and improving the effectiveness of via hole connection.

In some examples, as illustrated in FIGS. 39-41, a fourth light emitting element 314 is arranged at a position adjacent to the center of the hollow region 1622H in the second direction, and the orthographic projection of the fourth light emitting element 314 (for example, the fourth anode 1754 of the fourth light emitting element 314) on the base substrate 110 overlaps with all of the orthographic projections of the gate line 132, the reset signal line 131 and the initialization signal line 141 on the base substrate 110.

In some examples, as illustrated in FIGS. 39-41, the first conductive layer 151 further includes a third conductive pattern 1543, and the second conductive layer 160 further includes an anode connection portion 161, that is, the above-mentioned connection electrode, and the third conductive pattern 1543 is connected with the drain electrode of the second light emitting control transistor T5 and the anode connection portion 161.

In some examples, as illustrated in FIGS. 39-41, the orthographic projection of the gate line 132 on the base substrate 110 overlaps with the orthographic projection of the first conductive pattern 1542 on the base substrate 110.

In some examples, as illustrated in FIGS. 39-41, the orthographic projections of the first electrode block CE1 and the second electrode block CE2 on the base substrate 110 are located between the orthographic projection of the gate line 132 on the base substrate 110 and the orthographic projection of the emission control line 133 on the base substrate 110, that is, The orthographic projection of the storage capacitor Cst on the base substrate 110 is located between the orthographic projection of the gate line 132 on the substrate 110 and the orthographic projection of the emission control line 133 on the base substrate 110, so that the space can be reasonably utilized.

In some examples, as illustrated in FIGS. 39-41, the orthographic projection of the reset signal line 131 on the base substrate 110 is located between the orthographic projection of the gate line 132 on the base substrate 110 and the orthographic projection of the initialization signal line 141 on the base substrate 110, furthermore, in one pixel driving circuit 265, the emission control line 133, the first electrode block CE1, the gate line 132, the reset signal line 131 and the initialization signal line 141 are arranged along the second direction, so that the space on the display substrate can be reasonably utilized.

In some examples, as illustrated in FIGS. 39-41, the plurality of pixel driving circuits 265 include a second gate electrode layer 140, the second electrode block CE2 is located in the second gate electrode layer 140, and at least two second electrode blocks CE2 are connected in the first direction. That is, at least two second electrode blocks CE2 located in the second gate electrode layer 140 can be electrically connected with each other, so that the uniformity of storage capacitance of different sub-pixels in the whole display panel can also be improved.

In some examples, as illustrated in FIGS. 39-41, the orthographic projections of the effective light emitting regions of the first light emitting element 312 and the second light emitting element 313 on the base substrate 110 do not overlap with the orthographic projection of the conductive portion 162 on the base substrate 110. Therefore, it can avoid the conductive portion from adversely affecting the flatness of the first light emitting element 311 and the second light emitting element 312. For example, the second light emitting element 312 is configured to emit green light.

In some examples, as illustrated in FIGS. 39-41, the orthographic projection of the center of the effective light emitting region of the fourth light emitting element 314 on the base substrate 110 overlaps with the orthographic projection of the conductive portion 162 on the base substrate 110. A part where the orthographic projections of the conductive portion 162 and the center of the effective light emitting region of the fourth light emitting element 314 is a solid part. Therefore, although the effective light emitting region of the fourth light emitting element 314 overlaps with the conductive portion 162, the orthographic projection of the center of the effective light emitting region of the fourth light emitting element 314 on the base substrate 110 overlaps with the orthographic projection of the conductive portion 162 on the base substrate 110, which can avoid the conductive portion from adversely affecting the flatness of the fourth light emitting element 314. For example, the fourth light emitting element 314 is configured to emit blue light. It should be noted that the above-mentioned "solid part" means that the part does not include the hollow.

In some examples, as illustrated in FIGS. 39-41, the second light emitting element 312 includes a second anode 1752, and the third light emitting element 313 includes a third anode 1753; areas of two overlapping regions of the main body portion of the second anode 1752 and two conductive portions 162 adjacent to the second anode 1752 in the first direction are approximately the same, and areas of two overlapping regions of the main body portion of the third anode 1753 and two conductive portions 162 adjacent to the third anode 1753 in the first direction are approximately the same. Therefore, the flatness of the second anode and the third anode can be further improved.

In some examples, as illustrated in FIGS. 39-41, the orthographic projection of the hollow region 1622H on the base substrate 110 is located between the effective light emitting region of the first light emitting element 311 and the effective light emitting region of the second light emitting element 312. Therefore, the hollow region can avoid the effective light emitting region and avoid the anode in the effective light emitting region from being sunken and causing color cast. It should be noted that the first light emitting element and the second light emitting element are the first light emitting element and the second light emitting element which are closest to each other in the first direction.

In some examples, as illustrated in FIGS. 39-41, in the first direction, the size of an intermediate portion of an anode (e.g., the first anode) of the light emitting element configured to emit red light in the second direction is greater than the size of an edge portion of the anode in the second direction, for example, the shape of the anode can be approximately a long hexagon; in the first direction, the size of an intermediate portion of an anode (e.g., the fourth anode) of the light emitting element configured to emit blue light in the second direction is greater than the size of an edge portion of the anode in the second direction. Therefore, the display substrate can make full use of the space between different anodes, and under the same process accuracy, the areas of the anodes of the light emitting element configured to emit red light and the light emitting element configured to emit blue light are maximized.

In some examples, as illustrated in FIG. 39-41, in one light emitting element group, the orthographic projections of the anodes 175 of at least two light emitting elements on the base substrate 110 overlap with the orthographic projection of the opening of the second electrode block CE2 on the base substrate 110. Therefore, by shielding the opening of the second electrode block, the gate electrode of the driving transistor can be shielded and prevented from being excessively irradiated by light. The orthographic projection of the effective light emitting region of at least one light emitting element 311, 312, 313 or 314 on the base substrate 110 does not overlap with the orthographic projection of the first electrode block CE1 or the second electrode block CE2 on the base substrate 110, so that it can avoid the capacitor from raising the effective light emitting region and avoid color cast or color deviation.

In some examples, in any light emitting element selected from the group consisting of the first light emitting element 311, the second light emitting element 312, the third light emitting element 313 and the fourth light emitting element 314, the first planarization layer 241 has an anode hole, and the anode of the light emitting element is connected with the pixel driving circuit corresponding to the light emitting element through the anode hole.

In some examples, as illustrated in FIGS. 39-41, the orthographic projection of the anode hole (e.g., the first via hole 2421) of the anode (e.g., the first anode 1751) of the light emitting element configured to emit red light on the base substrate 110 does not overlap with the orthographic projection of the main body portion of the anode on the base substrate in the second direction. The orthographic projection of the anode hole of the anode on the base substrate 110 does not overlap with the orthographic projection of the effective light emitting region of the light emitting element configured to emit red light on the base substrate 110 in the second direction, so that the anode hole of the anode of the light emitting element configured to emit red light can be prevented from adversely affecting the flatness of the first light emitting element.

In some examples, as illustrated in FIGS. 39-41, the orthographic projection of the anode hole (e.g., the fourth via hole 2424) of the anode (e.g., the fourth anode 1754) of the light emitting element configured to emit blue light on the base substrate 110 does not overlap with the orthographic projection of the main body portion of the anode on the base substrate in the second direction. The orthographic projection of the anode hole of the anode on the base substrate 110 does not overlap with the orthographic projection of the effective light emitting region of the light emitting element configured to emit blue light on the base substrate 110 in the second direction, so that the anode hole of the anode of the light emitting element configured to emit blue light can be prevented from adversely affecting the flatness of the fourth light emitting element.

In some examples, as illustrated in FIGS. 39-41, a data line 152 is arranged between two adjacent conductive portions 162, and the distance between the orthographic projections of any one of the two adjacent conductive portions 162 and the data line 152 on the base substrate 110 is less than the distance between the orthographic projections of the two adjacent conductive portions 162 on the base substrate 110.

Figure 42:
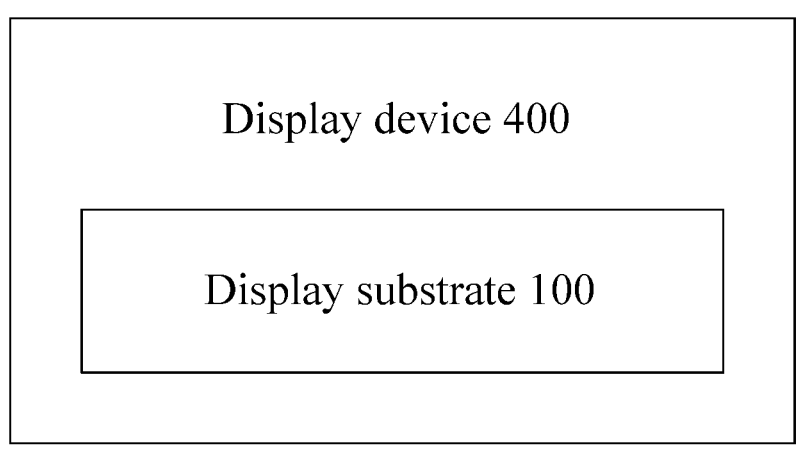
FIG. 42 is a schematic diagram of a display device according to an embodiment of the present disclosure.

An embodiment of the present disclosure further provides a display device. FIG. 42 is a schematic diagram of a display device according to an embodiment of the present disclosure. As illustrated in FIG. 42, the display device 400 includes any one of the display substrates 100 as described above. Therefore, the display device has the beneficial effects corresponding to the beneficial effects of the display substrate. For example, the display device can improve the stability and life of the compensation thin film transistor, thereby improving the long-term luminous stability and life of the display substrate.

For example, the display device can be electronic products with display functions such as televisions, computers, notebook computers, flat computers, mobile phones, navigators, and electronic photo frames.

An embodiment of the present disclosure further provides a display substrate. FIG. 3 is a schematic plan view of a display substrate according to an embodiment of the present disclosure. FIGS. 4A and 4B are schematic sectional views of a display substrate along an AA direction in FIG. 3 according to an embodiment of the present disclosure; FIG. 5A is a schematic sectional view of a display substrate along a BB direction in FIG. 3 according to an embodiment of the present disclosure; FIG. 5B is a schematic sectional view of a display substrate along a GG direction in FIG. 3 according to an embodiment of the present disclosure; FIG. 6 is a schematic plan view of a light emitting element in a display substrate according to an embodiment of the present disclosure; FIG. 7 is a schematic diagram of a planar relationship between a second conductive layer and an anode layer in a display substrate according to an embodiment of the present disclosure.

As illustrated by FIGS. 3, 4A, 4B, 5A, 5B and 6, the display substrate 100 includes a base substrate 110, a first planarization layer 241, a second planarization layer 242, an anode layer 170 and a plurality of pixel driving circuits 2651, 2652, 2653 and 2654; the plurality of pixel driving circuits include a first conductive layer 150 and a second conductive layer 160; the first conductive layer 150, the first planarization layer 241, the second conductive layer 160, the second planarization layer 242 and the anode layer 170 are sequentially arranged along a direction away from the base substrate 110; the anode layer 170 includes a plurality of anodes 175, the plurality of anodes 175 include a first anode 1751, and the second conductive layer 160 includes a first conductive portion 1621 and a second conductive portion 1622 which are adjacent in a first direction. The first conductive portion 1621 and the second conductive portion 1622 are configured to provide a power supply voltage to a corresponding pixel driving circuit, and the first conductive portion 1621 is located at a side of the first anode 1751 in the first direction, and the second conductive portion 1622 is located at the other side of the first anode 1751 in the first direction, the second conductive portion 1622 extends along the second direction, and the second direction intersects with the first direction.

As illustrated by FIG. 7, the second conductive layer 160 further includes a first connection electrode 1611 which is directly connected with the first anode 1751 through a via hole 2421 located in the second planarization layer 242, and the second conductive portion 1622 includes a main body 1622A, a heel block 1622B and a connection block 1622C which connects the main body 1622A with the heel block 1622B. The heel block 1622B is located at the side of the main body 1622A close to the first anode 1751. The orthographic projection of the first conductive portion 1621 on the base substrate 110 is overlapped with that of the first anode 1751 on the base substrate 110, and the orthographic projection of the second conductive portion 1622 on the base substrate 110 is overlapped with that of the first anode 1751 on the base substrate 110.

In the above-mentioned display substrate, because the orthographic projection of the first conductive portion on the base substrate is overlapped with that of the first anode, the orthographic projection of the second conductive portion on the base substrate is overlapped with that of the first anode, and the stacking relationship between the two sides of the first anode is relatively symmetrical, so that the first anode can ensure higher flatness, thus ensuring the uniformity of the luminous intensity of the first anode in different directions, and further effectively improving the color shift phenomenon.

In some examples, as illustrated by FIGS. 3 and 7, the orthographic projection of the first conductive portion 1621 on the base substrate 110 and the orthographic projection of the first anode 1751 on the base substrate 110 have a first overlapping portion, the orthographic projection of the second conductive portion 1622 on the base substrate 110 and the orthographic projection of the first anode 1751 on the base substrate 110 have a second overlapping portion, and the area of the first overlapping portion is approximately equal to that of the second overlapping portion, so that it can also be improved.

In some examples, as illustrated by FIGS. 3 and 7, a size of the heel block 1622B in the second direction is larger than that of the heel block 1622B in the first direction, the size of the main body 1622A in the second direction is larger than that of the main body 1622A in the first direction, and the connection block 1622C connects an end portion of the heel block 1622B in the second direction with the main body 1622A. Therefore, the connection block 1622 is located at an edge of the heel block 1622B, so that the influence of the connection block 1622 on the flatness of the anode can be reduced.

In some examples, as illustrated by FIG. 3, FIG. 4A, FIG. 4B, FIG. 5A, FIG. 5B, FIG. 6 and FIG. 7, the main body 1622A extends along the second direction, the heel block 1622B extends along the second direction, and the second direction intersects with the first direction. The display substrate 100 further includes a first gate layer 130 and a second gate layer 140, the first gate layer 130 is located on the base substrate 110, the second gate layer 140 is located between the first gate layer 130 and the first conductive layer 150. The first gate layer 130 includes a first electrode block CE1, the second gate layer 140 includes a second electrode block CE2, an orthographic projection of the first electrode block CE1 on the base substrate 110 and an orthographic projection of the second electrode block CE2 on the base substrate 110 are at least partially overlapped to form a storage capacitor Cst. Orthographic projections of the main body 1622A, the connection block 1622C and the spacer block 1622B on the base substrate 110 are respectively overlapped with the orthographic projection of the second electrode block CE2 on the base substrate 110, and the orthographic projection of the connection block 1622C is overlapped with the orthographic projection of the first electrode block CE1 on the base substrate 110. Therefore, the display substrate can further ensure the symmetry of both sides of the first anode, thereby further improving the flatness of the first anode.

In some examples, as illustrated by FIG. 3, FIG. 4A, FIG. 4B, FIG. 5A, FIG. 5B, FIG. 6 and FIG. 7, the display substrate 100 further includes a data line 152, and the orthographic projection of the first anode 1751 on the base substrate 110 is overlapped with an orthographic projection of the data line 152 on the base substrate 110. The orthographic projection of the data line 152 on the base substrate 110 is located between the orthographic projection of the first conductive portion 1621 on the base substrate 110 and the orthographic projection of the second conductive portion 1622 on the base substrate 110. The orthographic projection of an effective light emitting region of a light emitting element corresponding to the first anode 1751 on the base substrate 110 is overlapped with the orthographic projection of the data line 152 on the base substrate 110. Therefore, the display substrate can reduce the influence of the data line on the flatness of the anode, thereby further improving the flatness of the first anode.

In some examples, as illustrated by FIG. 3, FIG. 4A, FIG. 4B, FIG. 5A, FIG. 5B, FIG. 6 and FIG. 7, the heel block 1622B includes a first end portion and a second end portion in the second direction, the first end portion is connected with the main body 1622A through the connection block 1622C, and a first virtual line passes through the second end portion and extends in the first direction; the main body 1622A, the heel block 1622B and the connection block 1622a, and the first virtual line enclose a hollow region, and an orthographic projection of the hollow region on the base substrate 110 is overlapped with the orthographic projection of the second electrode block CE2 on the base substrate. Therefore, the display substrate can reduce the increased overlapping area between the second conductive portion and the second electrode block, thereby reducing the load.

In some examples, as illustrated by FIG. 3, FIG. 4A, FIG. 4B, FIG. 5A, FIG. 5B, FIG. 6 and FIG. 7, the orthographic projection of the connection block 1622C on the base substrate 110 is overlapped with that of the first electrode block CE1 on the base substrate 110, the second electrode block CE2 has an opening, and the orthographic projection of the connection block 1622C on the base substrate 110 is overlapped with that of the opening on the base substrate 110. Therefore, the display substrate can reduce the overlapping area of the connection block and the second electrode block, thereby reducing the load.

In some examples, as illustrated by FIG. 3, FIG. 4A, FIG. 4B, FIG. 5A, FIG. 5B, FIG. 6 and FIG. 7, the display substrate 100 further includes an initialization signal line 141 extending along the first direction, the initialization signal line 141 is configured to provide a reset voltage for the first anode 1751, and the orthographic projection of the hollow region on the base substrate 110 is overlapped with the orthographic projection of the initialization signal line 141 on the base substrate 110, thereby reducing the load of the initialization signal line.

In some examples, as illustrated by FIG. 3, FIG. 4A, FIG. 4B, FIG. 5A, FIG. 5B, FIG. 6 and FIG. 7, the first conductive layer 150 further includes an initialization signal connection portion 1541 (that is, the first connection block 1541 in other embodiments described above), one end of the initialization signal connection portion 1541 is connected with the initialization signal line 141, and the other end of the initialization signal connection portion 1541 is configured to be connected to a source electrode of a reset transistor. Therefore, the display substrate can further improve the anode flatness of the first anode by using the initialization signal connection portion located in the first conductive layer.

In some examples, as illustrated by FIG. 3, FIG. 4A, FIG. 4B, FIG. 5A, FIG. 5B, FIG. 6 and FIG. 7, the anode layer 170 further includes a second anode 1752, a third anode 1753 and a fourth anode 1754, the second conductive layer 160 further includes a third conductive portion 1623 and a fourth conductive portion 1624, and an effective light emitting region corresponding to the fourth anode 1754 has a center line extending in the second direction. An orthographic projection of the fourth conductive portion 1624 on the base substrate is overlapped with an orthographic projection of the center line on the base substrate 110. Therefore, the fourth conductive portion can improve the anode flatness of the fourth anode.

In some examples, as illustrated by FIG. 3, FIG. 4A, FIG. 4B, FIG. 5A, FIG. 5B, FIG. 6 and FIG. 7, the third conductive portion 1623 extends along the second direction, and includes an enclosed ring-shaped portion, the third conductive portion 1623 is configured to supply power voltage to a driving transistor of the corresponding pixel driving circuit. Therefore, the third conductive portion can also improve the flatness of the anode by the enclosed ring-shaped portion, and can also improve the transmittance by hollowing out the annular region.

In some examples, as illustrated by FIG. 3, FIG. 4A, FIG. 4B, FIG. 5A, FIG. 5B, FIG. 6 and FIG. 7, the first conductive layer 150 further includes a node connection portion 1542 (that is, the second connection block 1542 in other embodiments described above) the node connection portion 1542 is configured to connect a drain electrode of a compensation transistor with a gate electrode of a driving transistor, The enclosed ring-shaped portion includes a hollowed-out region, a first portion and a second portion located on both sides of the hollowed-out region in the first direction, and a third portion and a fourth portion located on both sides of the hollowed-out region in the second direction. Orthographic projections of the first portion and the third portion on the base substrate 110 is overlapped with the orthographic projection of the node connection portion 1542 on the base substrate 110. Therefore, the display substrate can reduce the coverage of the second conductive layer on the node connection portion 1542.

In some examples, as illustrated by FIG. 3, FIG. 4A, FIG. 4B, FIG. 5A, FIG. 5B, FIG. 6 and FIG. 7, the display substrate 100 further includes an initialization signal line 141 extending along the first direction, the initialization signal line 141 is configured to provide a reset voltage for a corresponding anode, and an orthographic projection of the hollowed-out region inside the enclosed ring-shaped portion on the base substrate 110 is overlapped with that of the initialization signal line 141 on the base substrate 110. Therefore, the display substrate can reduce the load of the initialization signal line.

In some examples, as illustrated by FIG. 3, FIG. 4A, FIG. 4B, FIG. 5A, FIG. 5B, FIG. 6 and FIG. 7, the third conductive portion 1623 includes a plurality of hollowed-out regions arranged along the second direction, and the shapes and sizes of two adjacent hollowed-out regions are approximately the same.

In some examples, as illustrated by FIG. 3, FIG. 4A, FIG. 4B, FIG. 5A, FIG. 5B, FIG. 6 and FIG. 7, the display substrate 100 further includes a first gate layer 130 and a second gate layer 140, the first gate layer 130 is located on the base substrate 110, the second gate layer 140 is located between the first gate layer 130 and the first conductive layer 150, and the first gate layer 130 includes a first electrode block CE1. The orthographic projection of the first electrode block CE1 on the base substrate 110 and the orthographic projection of the second electrode block CE2 on the base substrate 110 are at least partially overlapped to form a storage capacitor Cst, the orthographic projection of the enclosed ring-shaped portion on the base substrate 110 is overlapped with the orthographic projection of the first electrode block CE1 on the base substrate 110, the second electrode block CE2 includes an opening, and the orthographic projection of the enclosed ring-shaped portion on the base substrate 110 is overlapped with the orthographic projection of the opening of the second electrode block CE2 on the base substrate 110. Therefore, the display substrate can reduce the load of the third conductive portion.

In some examples, as illustrated by FIG. 3, FIG. 4A, FIG. 4B, FIG. 5A, FIG. 5B, FIG. 6 and FIG. 7, the second planarization layer 242 includes a connection via hole 2424, and the second conductive layer 160 further includes a fourth connection electrode 1614. The fourth anode 1754 is connected to the fourth connection electrode 1614 through the connection via hole 2424, and the orthographic projection of the connection via hole 2424 on the base substrate 110 is separated from an orthographic projection of the fourth conductive portion 1614 on the base substrate 110; an orthographic projection of the connection via hole 2424 on the base substrate is located at a side of a center line extending in the second direction of the orthographic projection of the effective light emitting region of the light emitting element corresponding to the fourth anode 1754 on the base substrate 110, and the light emitting element corresponding to the fourth anode 1754 is configured to emit blue light. Therefore, the display substrate can prevent the connection via from affecting the flatness of the fourth anode, thereby improving the flatness of the fourth anode.

In some examples, as illustrated by FIG. 3, FIG. 4A, FIG. 4B, FIG. 5A, FIG. 5B, FIG. 6 and FIG. 7, the second anode 1752 and the third anode 1753 are arranged in the second direction to form an anode pair 1755, the first anode 1751, the anode pair 1755 and the fourth anode 1754 are arranged in the first direction, and the size of the third conductive portion 1623 in the second direction is larger than that of the second conductive portion 1622. The size of the fourth conductive portion 1624 in the second direction is larger than that of the fourth conductive portion 1624 in the first direction, and the orthographic projection of the third conductive portion 1623 on the base substrate 110 is located between the orthographic projection of the anode pair 1755 on the base substrate 110 and the orthographic projection of the fourth anode 1754 on the base substrate 110.

In some examples, as illustrated by FIG. 3, FIG. 4A, FIG. 4B, FIG. 5A, FIG. 5B, FIG. 6 and FIG. 7, the orthographic projection of the first conductive portion 1621 on the base substrate 110 is located at a side of the orthographic projection of the first anode 1751 on the base substrate 110 away from the orthographic projection of the anode pair 1755 on the base substrate 110, and the orthographic projection of the second conductive portion 1622 on the base substrate 110 is located at a side of the orthographic projection of the first anode 1751 on the base substrate 110 and the orthographic projection of the anode pair 1755 on the base substrate 110.

In some examples, as illustrated by FIG. 3, FIG. 4A, FIG. 4B, FIG. 5A, FIG. 5B, FIG. 6 and FIG. 7, the first conductive layer 150 includes a power supply structure 151, and the orthographic projection of the first anode 1751 on the base substrate 110 is overlapped with that of the power supply structure 151 on the base substrate 110, and the orthographic projection of the power supply structure 151 on the base substrate 110 is overlapped with that of the first conductive portion 1621 on the base substrate 110. Therefore, the display substrate can improve the transmittance. In addition, the power supply structure mentioned above is the power supply line 151 in other embodiments mentioned above.

In some examples, as illustrated by FIG. 3, FIG. 4A, FIG. 4B, FIG. 5A, FIG. 5B, FIG. 6 and FIG. 7, the size of the spacer 1622B in the second direction is larger than that of the spacer 1622B in the first direction, and the first anode 1751 includes a first anode body portion 1751A and a first anode connection portion 1751B, which is connected with the first connection electrode 1611. The orthographic projection of the first anode body portion 1751A on a reference line extending in the second direction is overlapped with the orthographic projection of the heel block 1622B on the reference line, and the orthographic projection of the first anode connection portion 1751B on the reference line is located at the side of the orthographic projection of the heel block 1622B away from the orthographic projection of the first anode body portion 1751A on the reference line. Therefore, the display substrate further improves the flatness of the anode.

An embodiment of the present disclosure also provides a display device. FIG. 8 is a schematic diagram of a display device according to an embodiment of the present disclosure. As illustrated by FIG. 8, the display device 400 includes the display substrate 100 of any one of the above. Therefore, the display device has beneficial effects corresponding to those of the display substrate. For example, the display device can ensure the flatness of the first anode located in the effective light-emitting area of the first light-emitting element, thereby avoiding the color cast phenomenon.

It is to be noted that:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; the scopes of the present disclosure should be defined in the appended claims.

The invention claimed is:

1. A display substrate, comprising:
    a base substrate, a first planarization layer, a second planarization layer, an anode layer and a plurality of pixel driving circuits,
    wherein the plurality of pixel driving circuits comprise a first conductive layer and a second conductive layer; the first conductive layer, the first planarization layer, the second conductive layer, the second planarization layer and the anode layer are sequentially arranged along a direction away from the base substrate;
    the anode layer comprises a plurality of anodes, the plurality of anodes comprises a first anode, the second conductive layer comprises a first conductive portion and a second conductive portion which are adjacent in a first direction, the first conductive portion and the second conductive portion are configured to provide power supply voltage to a corresponding pixel driving circuit, the first conductive portion is located at a side of the first anode in the first direction, and the second conductive portion is located at the other side of the first anode in the first direction, the second conductive portion extends along a second direction, the second direction intersects with the first direction,
    the second conductive layer further comprises a first connection electrode, the first connection electrode is directly connected with the first anode through a via hole located in the second planarization layer, the second conductive portion comprises a main body, a heel block, and a connection block, the connection block connects the main body and the heel block, the heel block is located at a side of the main body close to the first anode, and an orthographic projection of the first conductive portion on the base substrate is overlapped with an orthographic projection of the first anode on the base substrate, and an orthographic projection of the second conductive portion on base substrate is overlapped with an orthographic projection of the first anode on the base substrate.

2. The display substrate according to claim 1, wherein the orthographic projection of the first conductive portion on the base substrate and the orthographic projection of the first anode on the base substrate have a first overlapping portion, and the orthographic projection of the second conductive portion on the base substrate and the orthographic projection of the first anode on the base substrate have a second overlapping portion, and an area of the first overlapping portion is approximately equal to an area of the second overlapping portion.

3. The display substrate according to claim 1, wherein a size of the heel block in the second direction is larger than a size of the heel block in the first direction, a size of the main body in the second direction is larger than a size of the main body in the first direction,
    the connection block connects an end of the heel block in the second direction with the main body.

4. The display substrate according to claim 1, wherein the main body extends along the second direction, the heel block extends along the second direction,
    the display substrate further comprises a first gate layer and a second gate layer, the first gate layer is located on the base substrate, the second gate layer is located between the first gate layer and the first conductive layer, the first gate layer comprises a first electrode block, the second gate layer comprises a second electrode block, and an orthographic projection of the first electrode block on the base substrate is at least partially overlapped with an orthographic projection of the second electrode block on the base substrate to form a storage capacitor,
    orthographic projections of the main body, the connection block and the heel block on the base substrate is respectively overlapped with the orthographic projection of the second electrode block on the base substrate, and the orthographic projection of the connection block is overlapped with the orthographic projection of the first electrode block on the base substrate.

5. The display substrate according to claim 4, wherein the display substrate further comprises a data line, and an orthographic projection of the first anode on the base substrate is overlapped with an orthographic projection of the data line on the base substrate,
the orthographic projection of the data line on the base substrate is located between the orthographic projection of the first conductive portion on the base substrate and the orthographic projection of the second conductive portion on the base substrate, and an orthographic projection of an effective light emitting region of a light emitting element corresponding to the first anode on the base substrate is overlapped with the orthographic projection of the data line on the base substrate.

6. The display substrate according to claim 5, wherein the heel block comprises a first end portion and a second end portion in the second direction, and the first end portion is connected with the main body through the connection block,
a first virtual line passes through the second end portion and extends along the first direction, the main body, the heel block, the connection block and the first virtual line enclose a hollow region, and an orthographic projection of the hollow region on the base substrate is overlapped with the orthographic projection of the second electrode block on the base substrate.

7. The display substrate according to claim 6, wherein the orthographic projection of the connection block on the base substrate is overlapped with the orthographic projection of the first electrode block on the base substrate,
the second electrode block comprises an opening, and the orthographic projection of the connection block on the base substrate is overlapped with the orthographic projection of the opening on the base substrate.

8. The display substrate according to claim 6, wherein the display substrate further comprises an initialization signal line extending along the first direction, the initialization signal line is configured to provide a reset voltage for the first anode,
the orthographic projection of the hollow region on the base substrate is overlapped with an orthographic projection of the initialization signal line on the base substrate.

9. The display substrate according to claim 8, wherein the first conductive layer further comprises an initialization signal connection portion, one end of the initialization signal connection portion is connected with the initialization signal line, and the other end of the initialization signal connection portion is configured to be connected with a source electrode of a reset transistor,
an orthographic projection of the initialization signal connection portion on the base substrate is overlapped with the orthographic projection of the first anode on the base substrate.

10. The display substrate according to claim 1, wherein the anode layer further comprises a second anode, a third anode and a fourth anode,
the second conductive layer further comprises a third conductive portion and a fourth conductive portion, an effective light emitting region corresponding to the fourth anode comprises a central line extending along the second direction, and an orthographic projection of the fourth conductive portion on the base substrate is overlapped with an orthographic projection of the central line on the base substrate,
the third conductive portion extends along the second direction, the third conductive portion comprises an enclosed ring-shaped portion, and the third conductive portion is configured to provide a power supply voltage to a driving transistor of a corresponding pixel driving circuit.

11. The display substrate according to claim 10, wherein the first conductive layer further comprises a node connection portion, the node connection portion is configured to connect a drain electrode of a compensation transistor with a gate electrode of a driving transistor,
the enclosed ring-shaped portion comprises a hollowed-out region, a first portion and a second portion located at two sides of the hollowed-out region in the first direction, and a third portion and a fourth portion located at two sides of the hollowed-out region in the second direction, and an orthographic projection of the first portion and the third portion on the base substrate is overlapped with an orthographic projection of the node connection portion on the base substrate.

12. The display substrate according to claim 10, wherein the display substrate further comprises an initialization signal line extending along the first direction, the initialization signal line is configured to provide a reset voltage for a corresponding anode, and the orthographic projection of the hollowed-out region inside the enclosed ring-shaped portion on the base substrate is overlapped with the orthographic projection of the initialization signal line on the base substrate.

13. The display substrate according to claim 12, wherein the third conductive portion comprises a plurality of the hollowed-out regions arranged along the second direction, and two adjacent ones of the plurality of hollowed-out regions have approximately the same shape and size.

14. The display substrate according to claim 12, wherein the display substrate further comprises a first gate layer and a second gate layer, wherein the first gate layer is located on the base substrate and the second gate layer is located between the first gate layer and the first conductive layer,
the first gate layer comprises a first electrode block, the second gate layer comprises a second electrode block, and the orthographic projection of the first electrode block on the base substrate and the orthographic projection of the second electrode block on the base substrate is at least partially overlapped to form a storage capacitor,
an orthographic projection of the enclosed ring-shaped portion on the base substrate is overlapped with the orthographic projection of the first electrode block on the base substrate, the second electrode block comprises an opening, and the orthographic projection of the enclosed ring-shaped portion on the base substrate is overlapped with an orthographic projection of the opening of the second electrode block on the base substrate.

15. The display substrate according to claim 10, wherein the second planarization layer comprises a connection via hole, and the second conductive layer further comprises a fourth connection electrode, and the fourth anode is connected with the fourth connection electrode through the connection via hole,
an orthographic projection of the connection via hole on the base substrate is separated from the orthographic projection of the fourth conductive portion on the base substrate; an orthographic projection of the connection via hole on the base substrate is located at a side of a central line extending along the second direction of an orthographic projection of an effective light emitting region of a light emitting element corresponding to the fourth anode on the base substrate, and the light emitting element corresponding to the fourth anode is configured to emit blue light.

16. The display substrate according to claim 10, wherein the second anode and the third anode are arranged along the second direction to form an anode pair, and the first anode, the anode pair and the fourth anode are arranged along the first direction,
 a size of the third conductive portion in the second direction is larger than a size of the second conductive portion in the first direction, a size of the fourth conductive portion in the second direction is larger than a size of the fourth conductive portion in the first direction,
 an orthographic projection of the third conductive portion on the base substrate is located between an orthographic projection of the anode pair on the base substrate and an orthographic projection of the fourth anode on the base substrate.

17. The display substrate according to claim 16, wherein the orthographic projection of the first conductive portion on the base substrate is located on a side of the orthographic projection of the first anode on the base substrate away from the orthographic projection of the anode pair on the base substrate, and the orthographic projection of the second conductive portion on the base substrate is located between the orthographic projection of the first anode pair on the base substrate and the orthographic projection of the anode pair on the base substrate.

18. The display substrate according to claim 1, wherein the first conductive layer comprises a power supply structure, and the orthographic projection of the first anode on the base substrate is overlapped with the orthographic projection of the power supply structure on the base substrate,
 an orthographic projection of the power supply structure on the base substrate is overlapped with the orthographic projection of the first conductive portion on the base substrate, and the first conductive portion is electrically connected with the power supply structure.

19. The display substrate according to claim 1, wherein a size of the heel block in the second direction is larger than a size of the heel block in the first direction,
 the first anode comprises a first anode main body portion and a first anode connection portion, the first anode connection portion is connected with the first connection electrode, an orthographic projection of the first anode main body portion on a reference line extending along the second direction is overlapped with an orthographic projection of the heel block on the reference line, and an orthographic projection of the first anode connection portion on the reference line is located at a side of the orthographic projection of the heel block on the reference line away from the orthographic projection of the first anode main body portion on the reference line.

20. A display device, comprising the display substrate according to claim 1.

* * * * *

UNITED STATES PATENT AND TRADEMARK OFFICE
CERTIFICATE OF CORRECTION

| | | |
|---|---|---|
| PATENT NO. | : 11,785,806 B2 | |
| APPLICATION NO. | : 17/699948 | |
| DATED | : October 10, 2023 | |
| INVENTOR(S) | : Siyu Wang | |

It is certified that error appears in the above-identified patent and that said Letters Patent is hereby corrected as shown below:

On the Title Page

Item (30) Foreign Application Priority Data should read:
Mar. 25, 2020 (CN) ............... PCT/CN2020/081154

Signed and Sealed this
Twenty-sixth Day of March, 2024

Katherine Kelly Vidal
*Director of the United States Patent and Trademark Office*